United States Patent
Cho et al.

(10) Patent No.: US 9,809,149 B2
(45) Date of Patent: Nov. 7, 2017

(54) LAMP AND VEHICLE LAMP APPARATUS USING THE SAME

(71) Applicant: LG INNOTEK CO., LTD., Seoul (KR)

(72) Inventors: Yun Min Cho, Seoul (KR); Gun Kyo Lee, Seoul (KR)

(73) Assignee: LG INNOTEK CO., LTD, Seoul (KR)

(*) Notice: Subject to any disclaimer, the term of this patent is extended or adjusted under 35 U.S.C. 154(b) by 54 days.

(21) Appl. No.: 13/738,872

(22) Filed: Jan. 10, 2013

(65) Prior Publication Data

US 2014/0016340 A1 Jan. 16, 2014

(30) Foreign Application Priority Data

Jul. 13, 2012 (KR) ........................ 10-2012-0076858

(51) Int. Cl.
*B60Q 1/02* (2006.01)
*F21S 8/10* (2006.01)
(Continued)

(52) U.S. Cl.
CPC ............ *B60Q 1/02* (2013.01); *F21S 48/1104* (2013.01); *F21S 48/115* (2013.01); *F21S 48/211* (2013.01);
(Continued)

(58) Field of Classification Search
CPC .......... F21Y 2105/001; F21Y 2105/003; F21S 48/1747; B60Q 1/02
See application file for complete search history.

(56) References Cited

U.S. PATENT DOCUMENTS

| 5,837,994 A | 11/1998 | Stam et al. |
| 6,406,173 B1 | 6/2002 | Serizawa et al. |

(Continued)

FOREIGN PATENT DOCUMENTS

| CN | 1752514 | 3/2006 |
| CN | 101451666 | 6/2009 |

(Continued)

OTHER PUBLICATIONS

U.S. Office Action dated Jul. 2, 2015 issued in U.S. Appl. No. 13/939,842 dated Jul. 2, 2015.

(Continued)

*Primary Examiner* — Sean Gramling
*Assistant Examiner* — Gerald J Sufleta, II
(74) *Attorney, Agent, or Firm* — KED & Associates, LLP

(57) ABSTRACT

An intelligent type lamp and a vehicle lamp apparatus are disclosed. The lamp includes a first substrate, a second substrate disposed on the first substrate, and a plurality of light sources disposed on the second substrate, wherein the light sources are grouped into at least one light source array, in each of which the light sources are disposed in a line, and the at least one light source array includes neighboring first and second light source arrays electrically isolated and individually driven. The light sources of the first light source array may be electrically isolated and individually driven, and the light sources of the second light source array may be electrically isolated and individually driven. Alternatively, the light sources of the first light source array may be electrically isolated and individually driven, and the light sources of the second light source array may be electrically connected and simultaneously driven.

16 Claims, 46 Drawing Sheets

(51) Int. Cl.

| | | |
|---|---|---|
| F21K 9/00 | (2016.01) | |
| F21V 3/04 | (2006.01) | |
| F21V 9/00 | (2015.01) | |
| F21Y 105/12 | (2016.01) | |
| F21Y 105/10 | (2016.01) | |
| F21Y 115/10 | (2016.01) | |
| F21Y 107/50 | (2016.01) | |
| F21Y 107/10 | (2016.01) | |
| F21Y 107/20 | (2016.01) | |
| F21Y 113/13 | (2016.01) | |

(52) U.S. Cl.
CPC ............... *F21S 48/215* (2013.01); *F21K 9/00* (2013.01); *F21V 3/049* (2013.01); *F21V 3/0472* (2013.01); *F21V 9/00* (2013.01); *F21Y 2105/10* (2016.08); *F21Y 2105/12* (2016.08); *F21Y 2107/10* (2016.08); *F21Y 2107/20* (2016.08); *F21Y 2107/50* (2016.08); *F21Y 2113/13* (2016.08); *F21Y 2115/10* (2016.08); *H01L 2224/48091* (2013.01)

(56) References Cited

U.S. PATENT DOCUMENTS

| | | | |
|---|---|---|---|
| 6,412,971 B1 | 7/2002 | Wojnarowski et al. | |
| 6,431,728 B1 | 8/2002 | Fredericks et al. | |
| 6,520,669 B1* | 2/2003 | Chen et al. | ................... 362/545 |
| 7,896,512 B2 | 3/2011 | Tatara et al. | |
| 8,899,782 B2 | 12/2014 | Sikkens et al. | |
| 2004/0136197 A1 | 7/2004 | Ishida | |
| 2007/0120137 A1* | 5/2007 | Wilson | ................. B60Q 1/0041 257/98 |
| 2008/0062712 A1 | 3/2008 | Woodward | |
| 2009/0184330 A1 | 7/2009 | Okimura | |
| 2012/0188489 A1* | 7/2012 | Baba et al. | ....................... 349/95 |
| 2012/0201040 A1* | 8/2012 | Naganawa | ........... F21S 48/1104 362/487 |
| 2012/0256560 A1* | 10/2012 | Yun | ..................... H05B 33/0857 315/297 |
| 2012/0320591 A1* | 12/2012 | Liao et al. | ................ 362/249.02 |
| 2013/0051014 A1* | 2/2013 | Sikkens | ............... F21S 48/1154 362/235 |
| 2013/0107517 A1* | 5/2013 | Shih | .......................... F21V 3/00 362/235 |
| 2013/0128603 A1* | 5/2013 | Chen | .................... F21S 48/1747 362/545 |
| 2013/0134446 A1* | 5/2013 | Wang | ........................ F21K 9/00 257/88 |
| 2013/0258662 A1* | 10/2013 | Treanton | ................. F21S 2/005 362/235 |
| 2013/0343051 A1* | 12/2013 | Holman | ............. G02B 19/0066 362/231 |
| 2014/0098556 A1* | 4/2014 | von Malm | ................ F21K 9/00 362/543 |

FOREIGN PATENT DOCUMENTS

| | | |
|---|---|---|
| CN | 201736886 | 2/2011 |
| CN | 102519003 | 6/2012 |
| JP | 2004-158294 | 6/2004 |
| JP | 2004-214144 | 7/2004 |
| JP | 2007-115577 | 5/2007 |
| JP | 2008-513967 | 5/2008 |
| JP | 2009-99715 | 5/2009 |
| JP | 2009-176809 | 8/2009 |
| JP | 2009-184642 | 8/2009 |
| JP | 2011-90903 | 5/2011 |
| WO | WO 2011/114270 | 9/2011 |

OTHER PUBLICATIONS

U.S. Notice of Allowance dated Dec. 9, 2015 issued in U.S. Appl. No. 13/939,842.

* cited by examiner

[FIG. 1A]
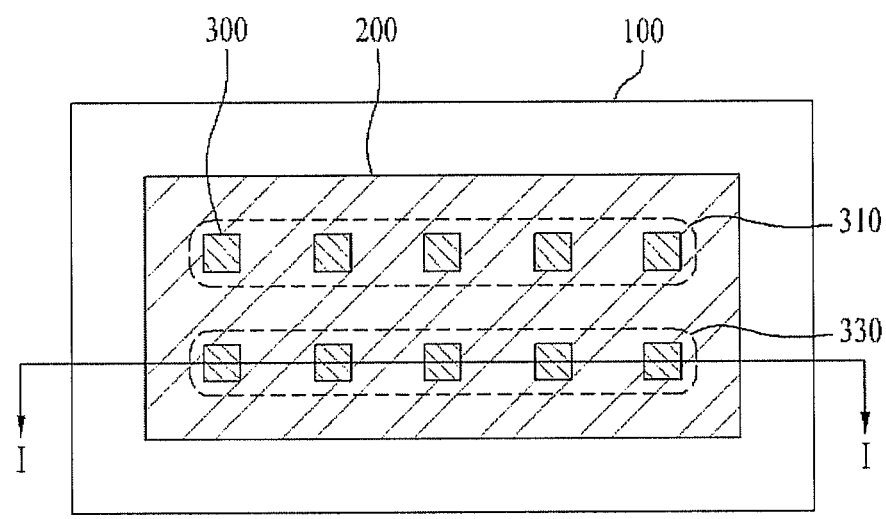
[FIG. 1B]
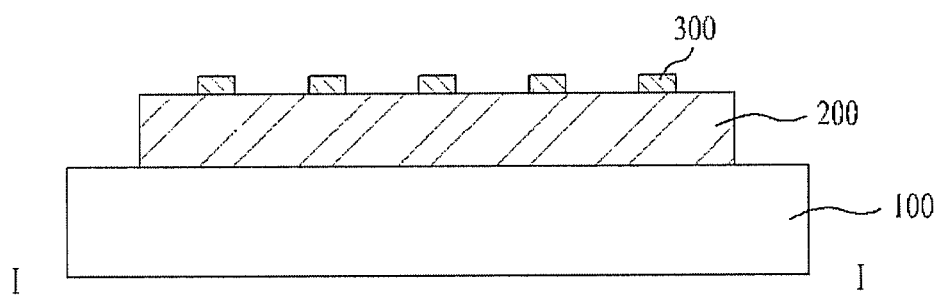

[FIG. 2A]
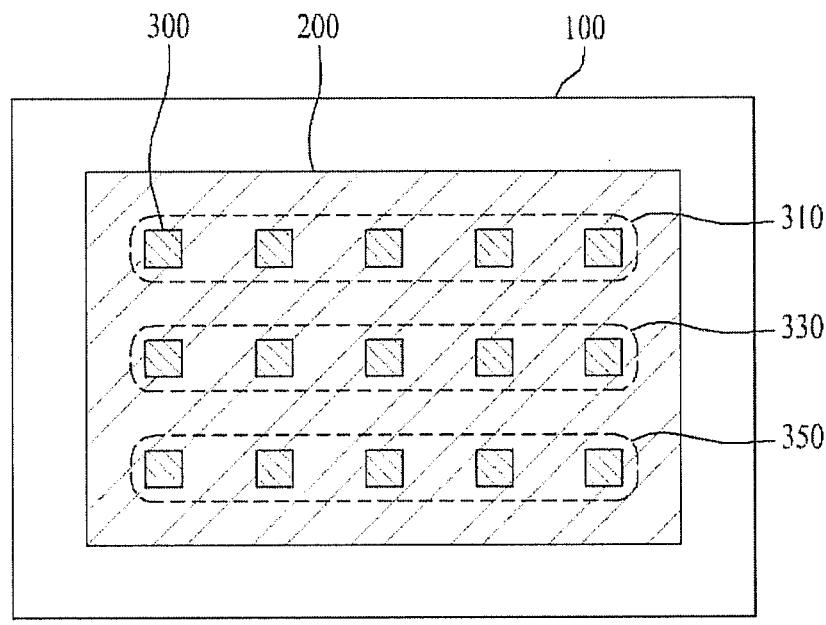
[FIG. 2B]
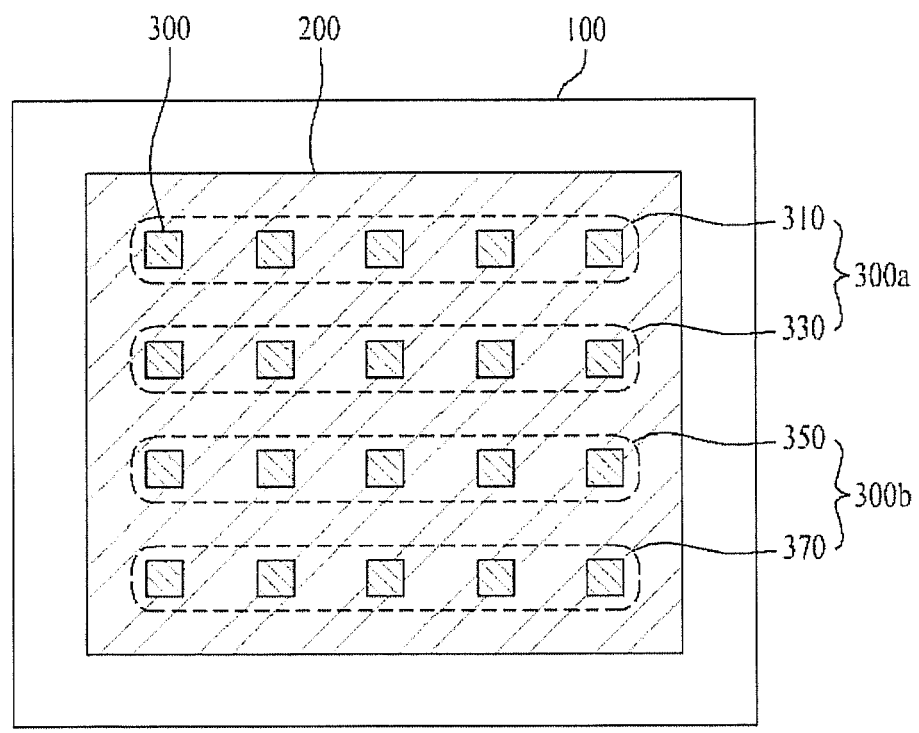

[FIG. 3]
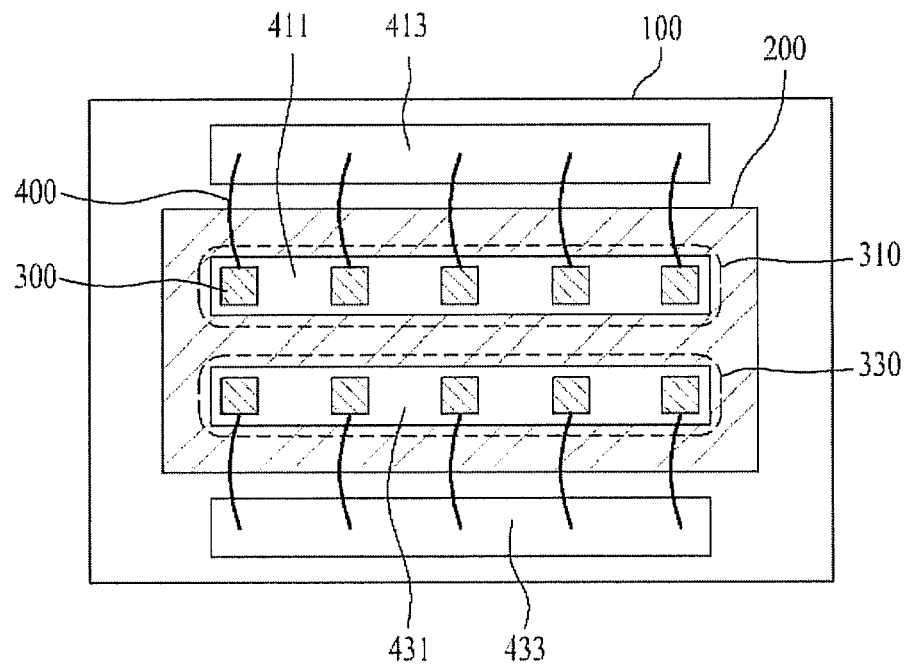
[FIG. 4A]
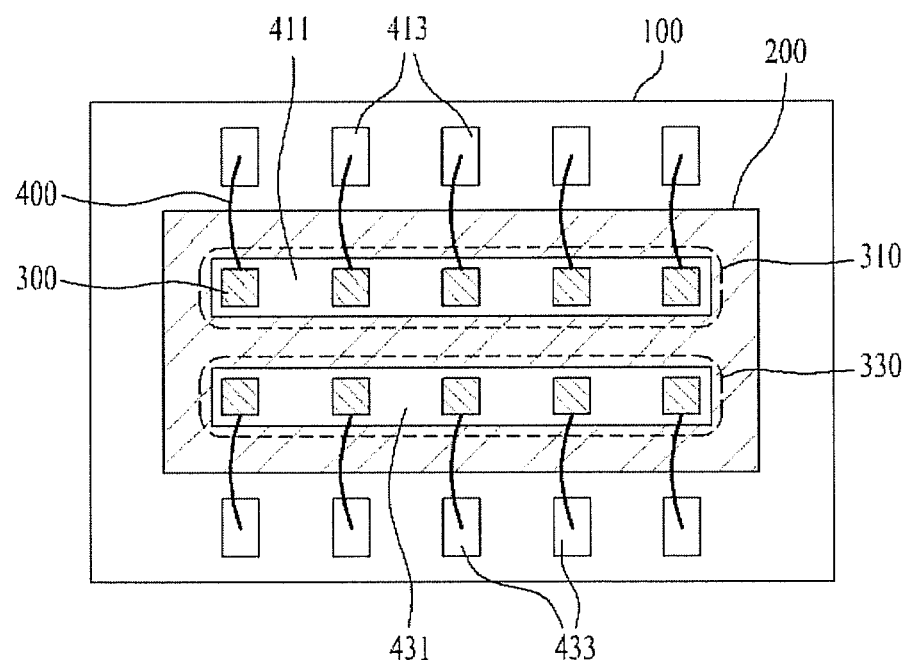

[FIG. 4B]
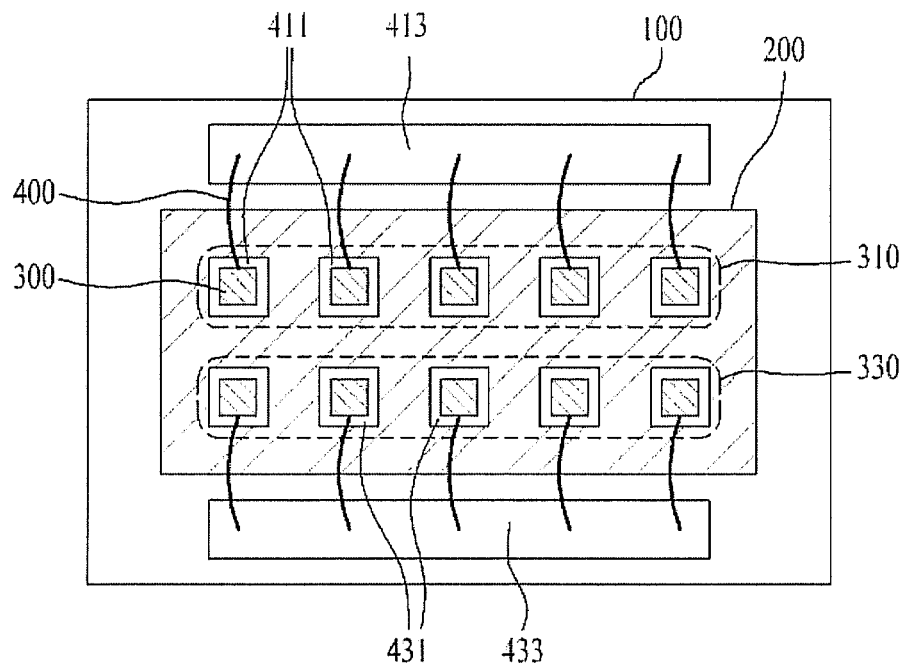
[FIG. 5A]
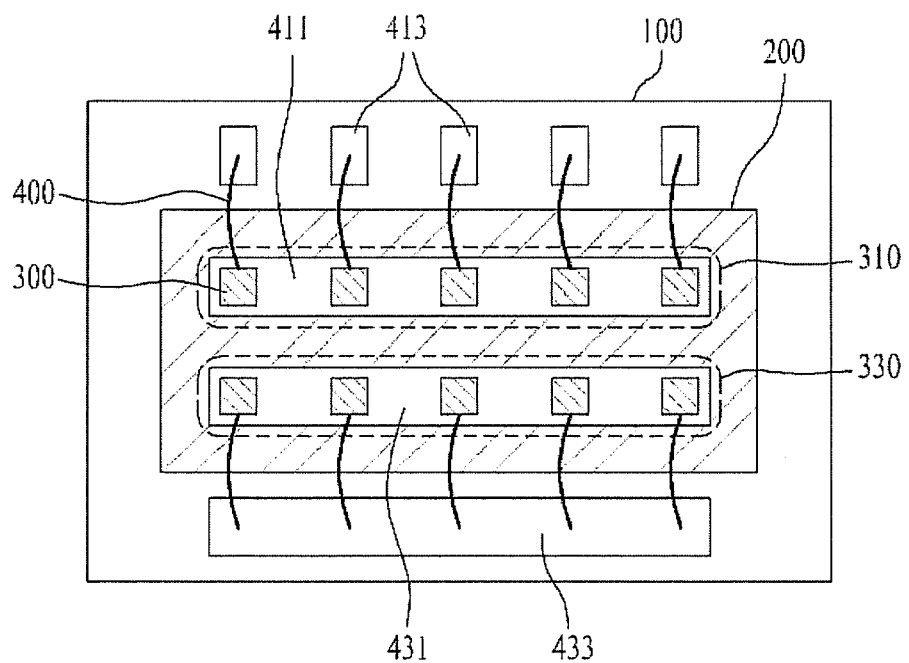

[FIG. 5B]
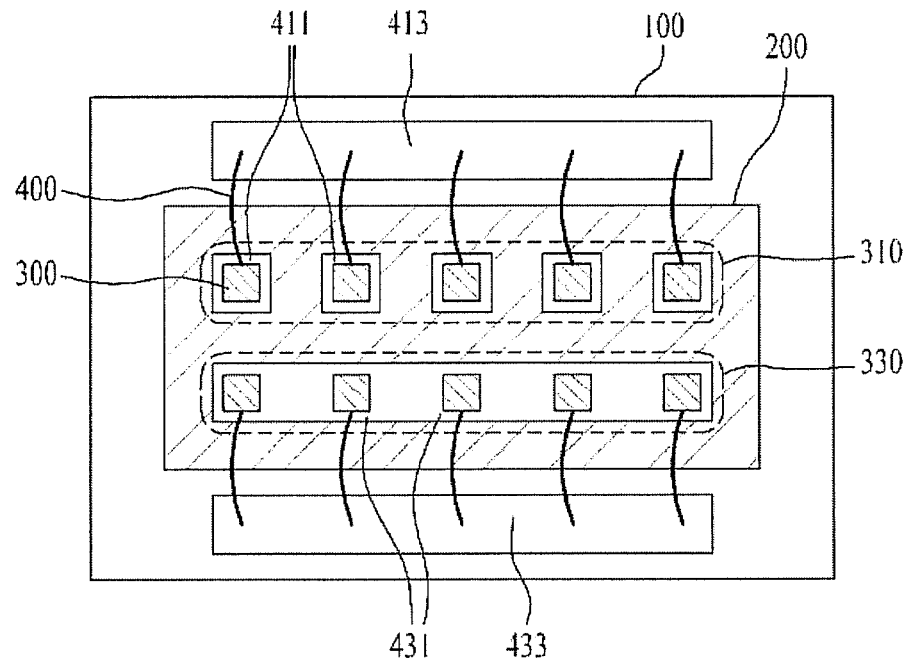
[FIG. 6A]
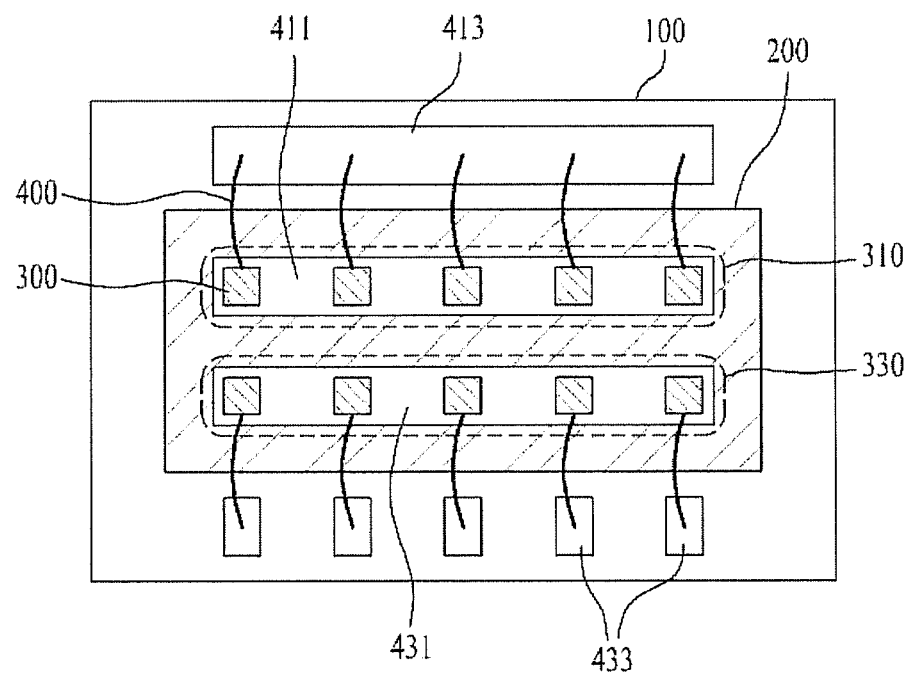

[FIG. 6B]
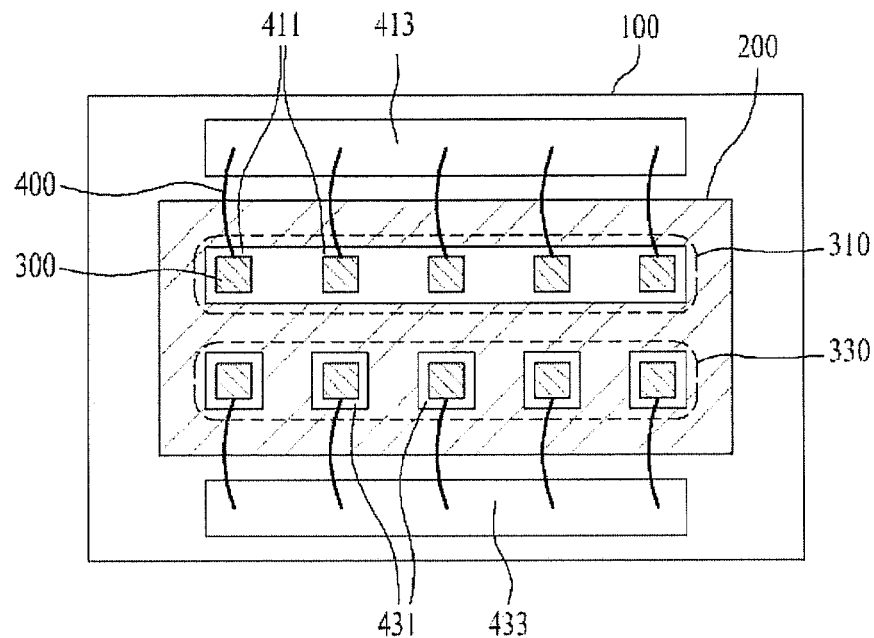
[FIG. 7A]
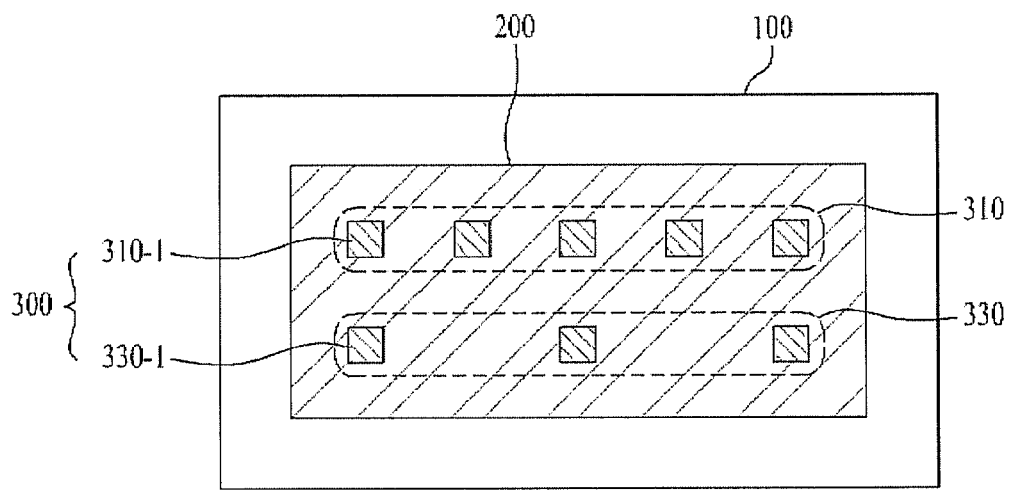

[FIG. 7B]
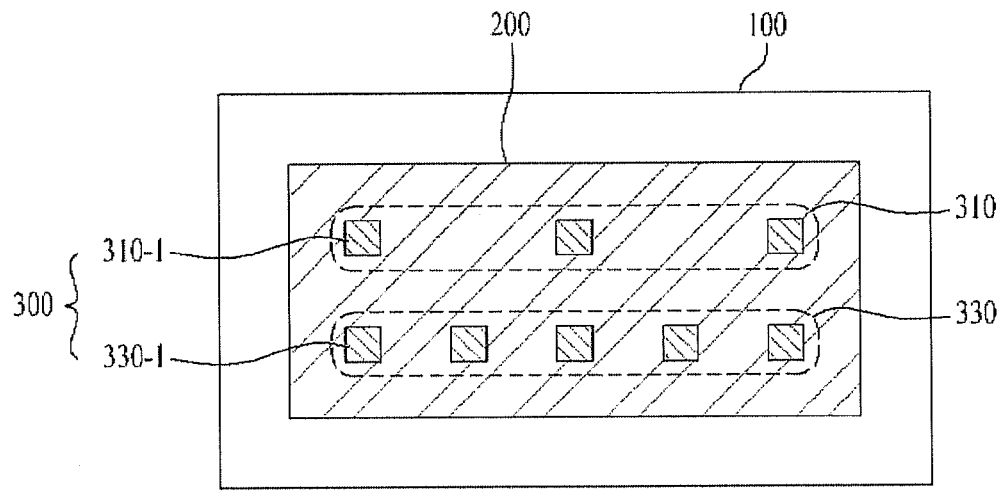
[FIG. 7C]
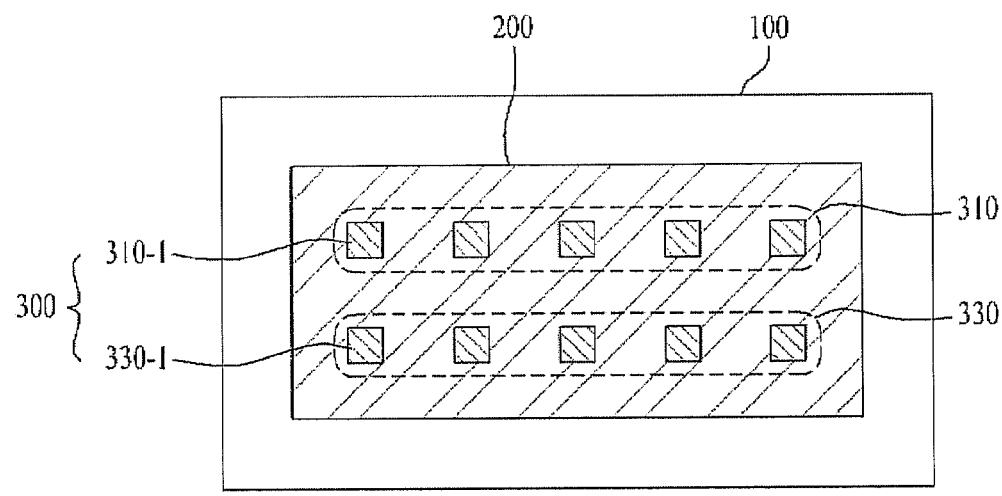

[FIG. 8A]
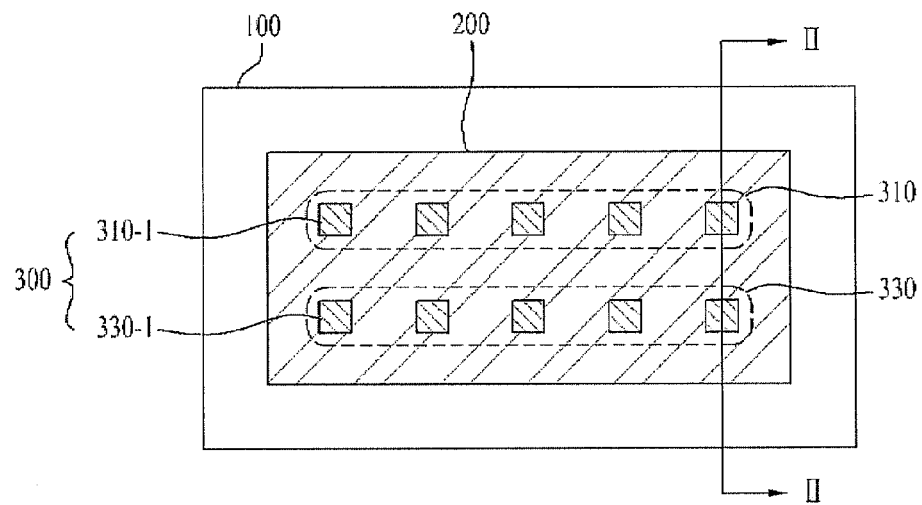
[FIG. 8B]
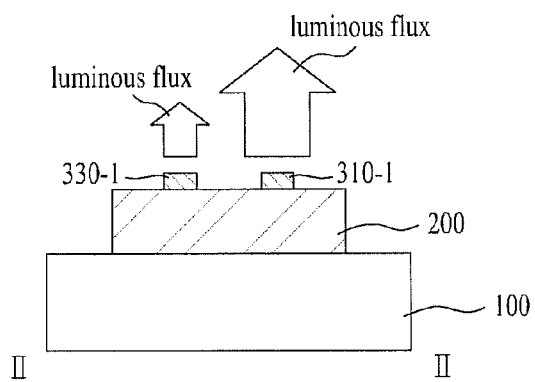

[FIG. 8C]
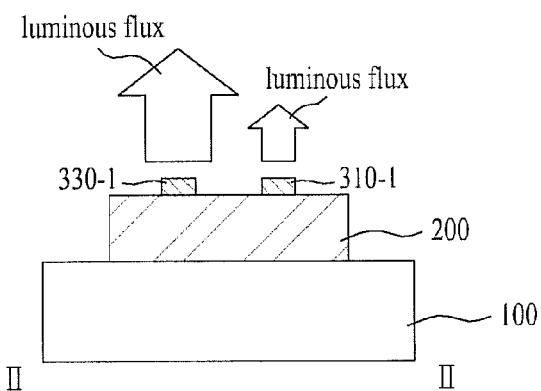
[FIG. 9A]
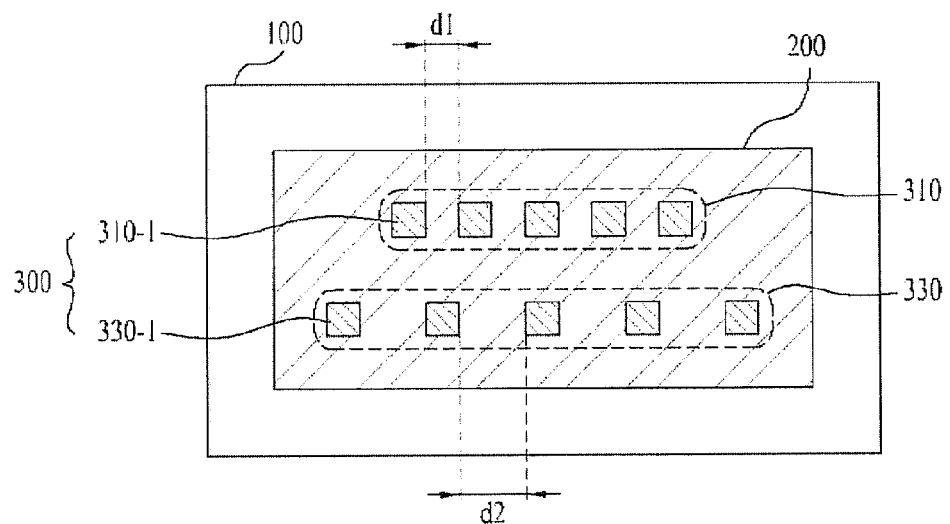

[FIG. 9B]
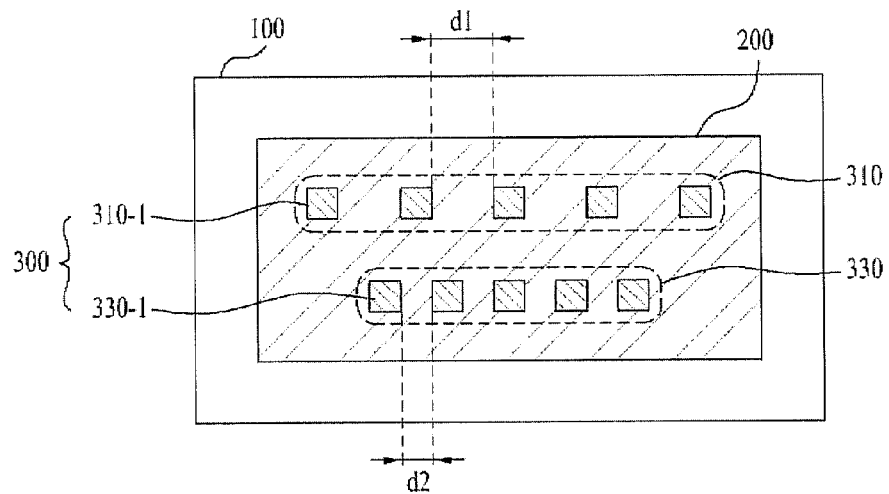
[FIG. 9C]
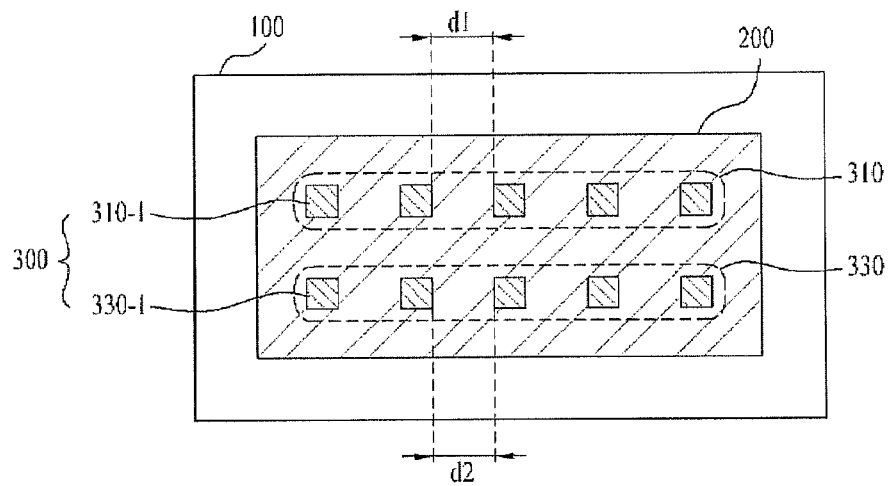

[FIG. 10A]
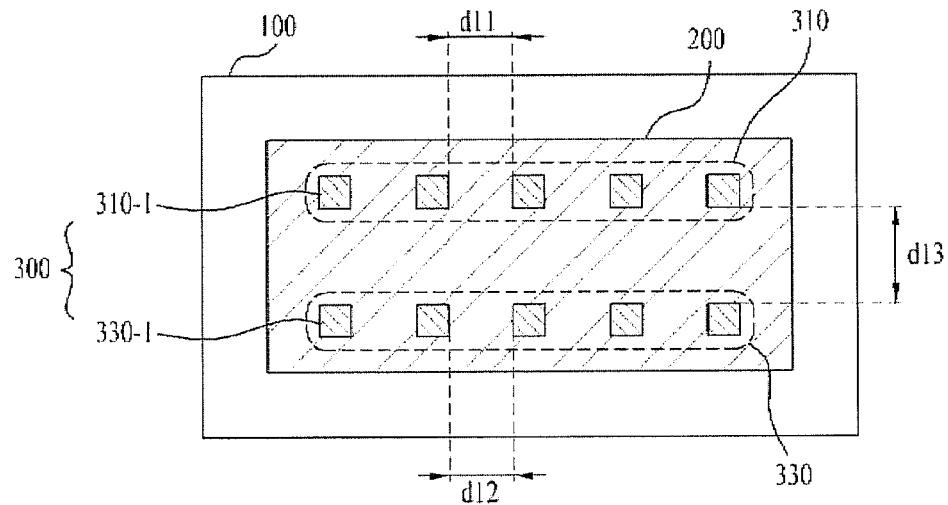
[FIG. 10B]
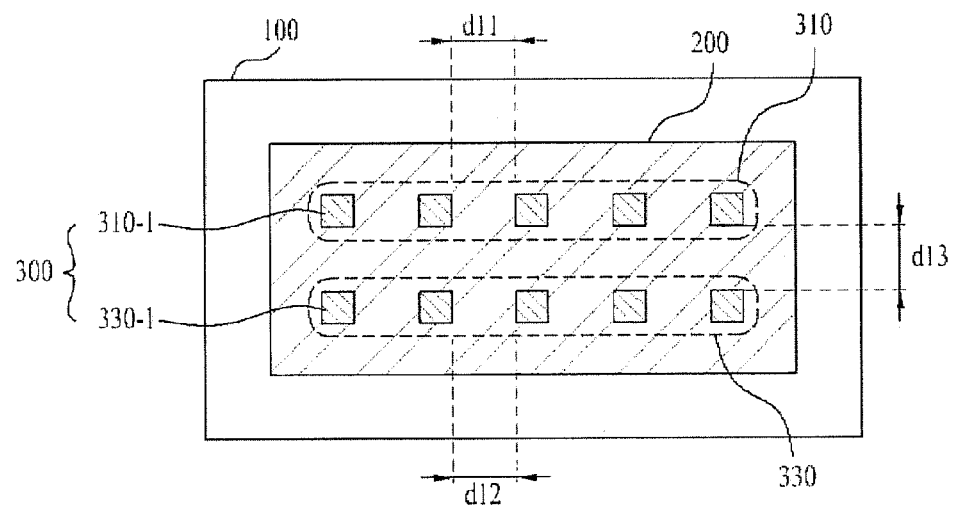

[FIG. 11A]
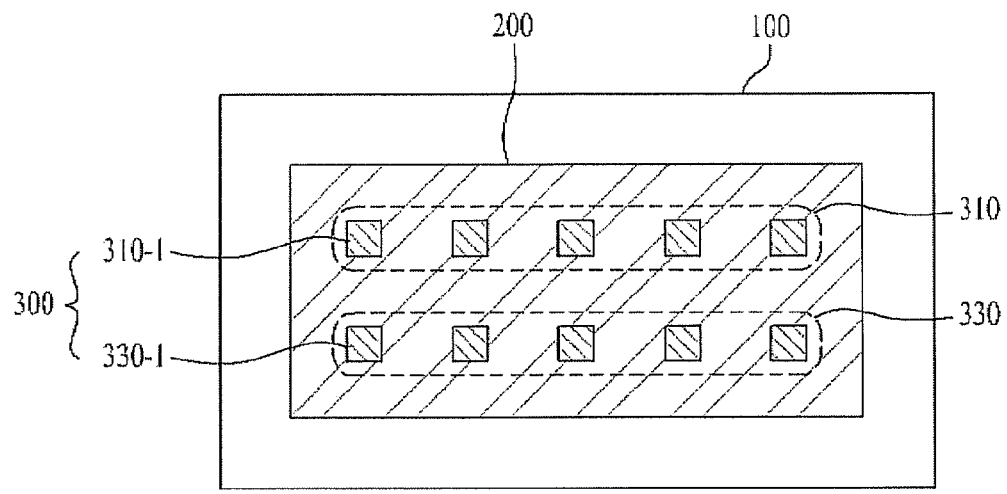
[FIG. 11B]
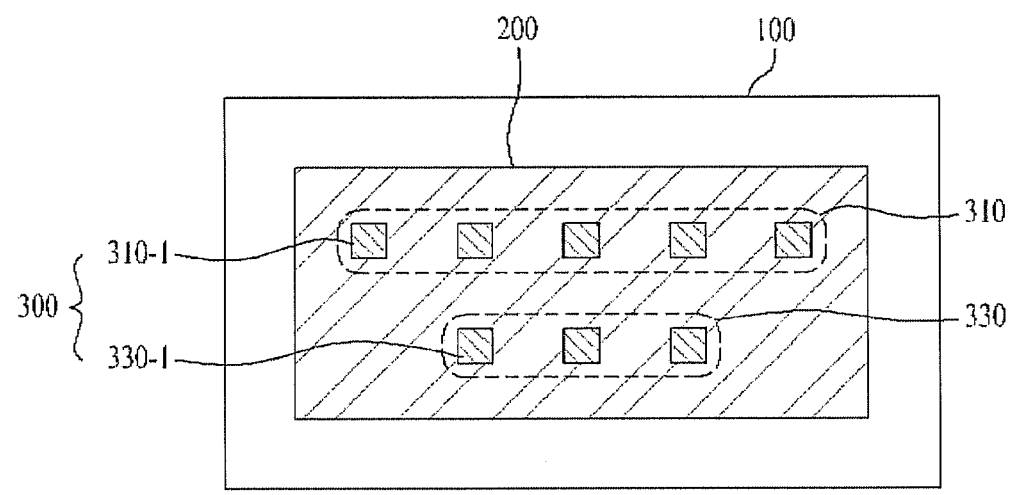

[FIG. 12A]
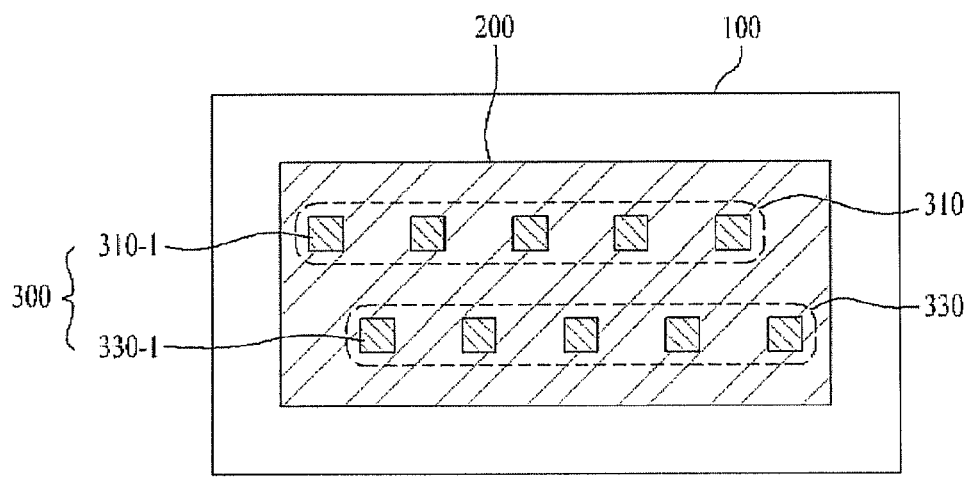
[FIG. 12B]
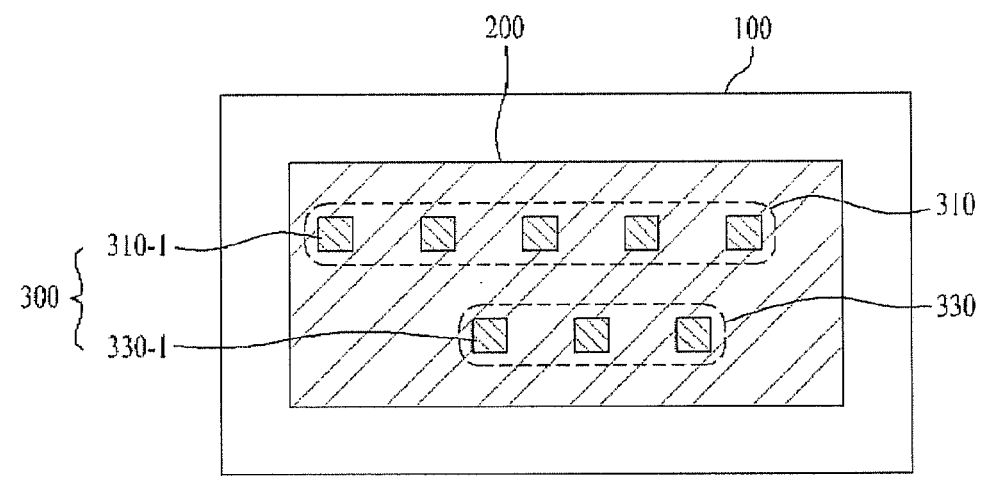

[FIG. 13A]
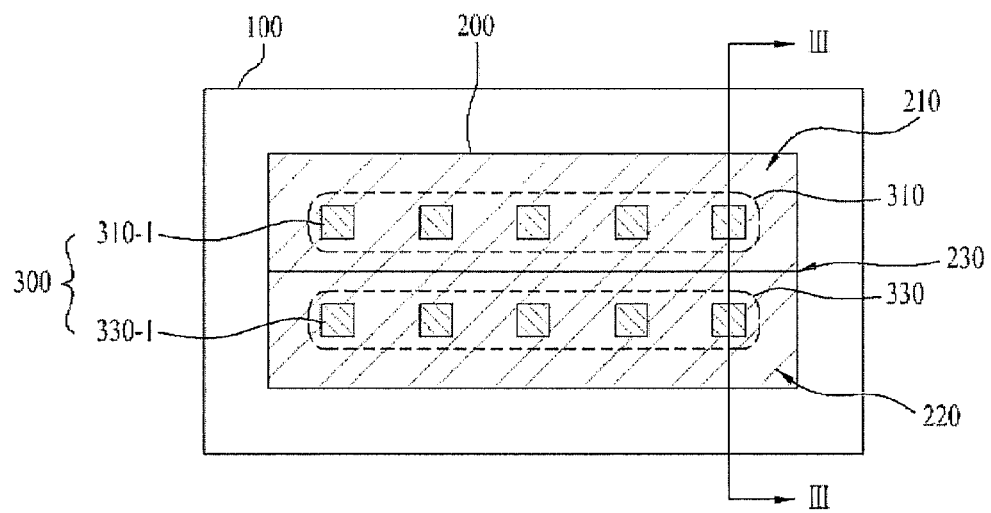
[FIG. 13B]
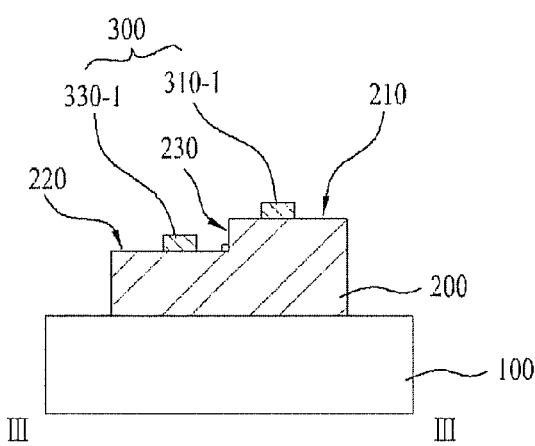

[FIG. 14A]
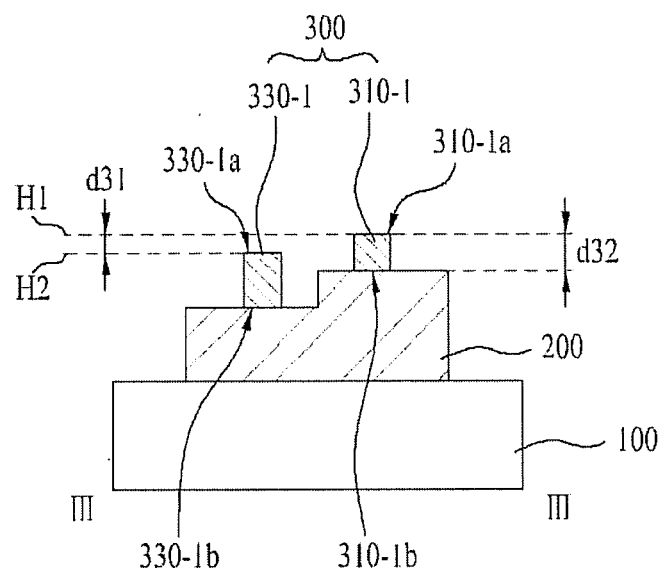
[FIG. 14B]
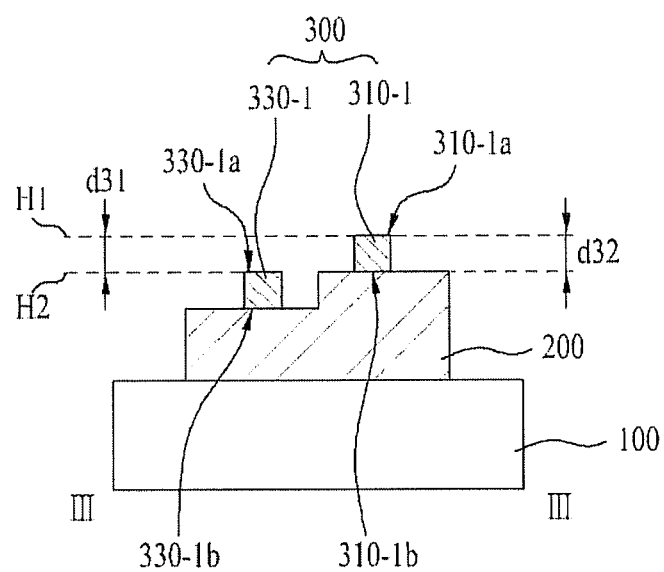

[FIG. 14C]
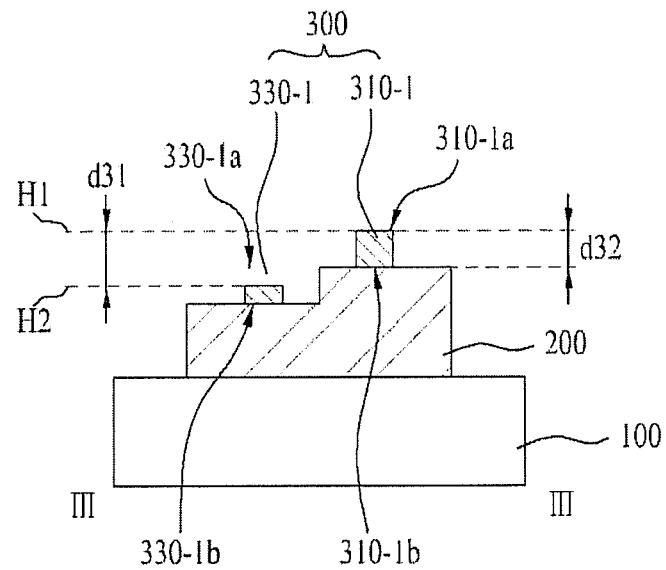
[FIG. 15A]
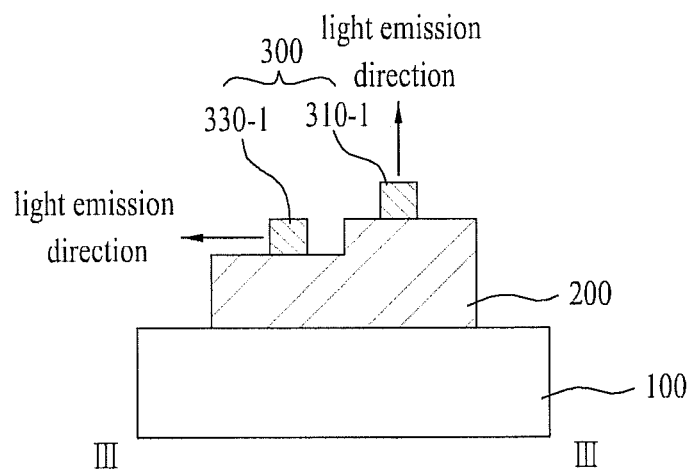

[FIG. 15B]
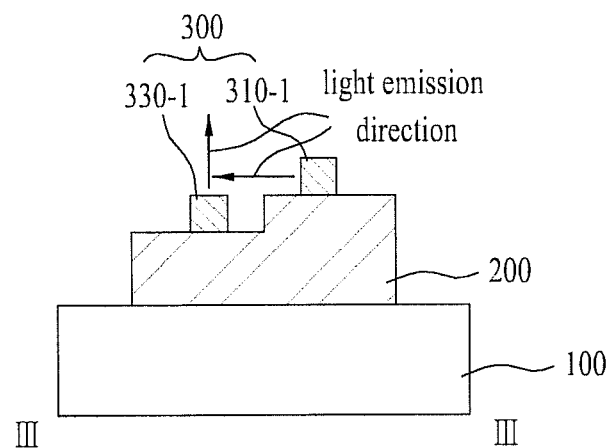
[FIG. 15C]
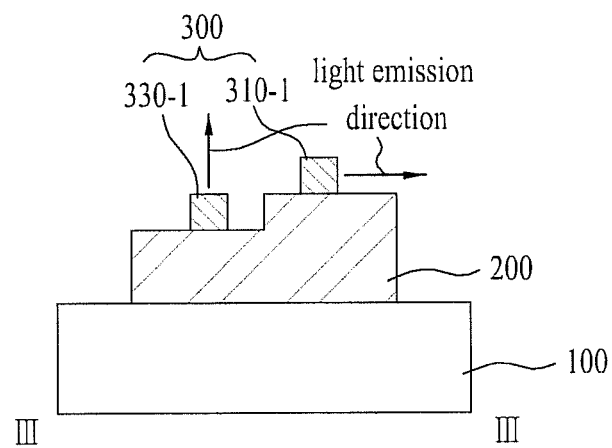

[FIG. 15D]
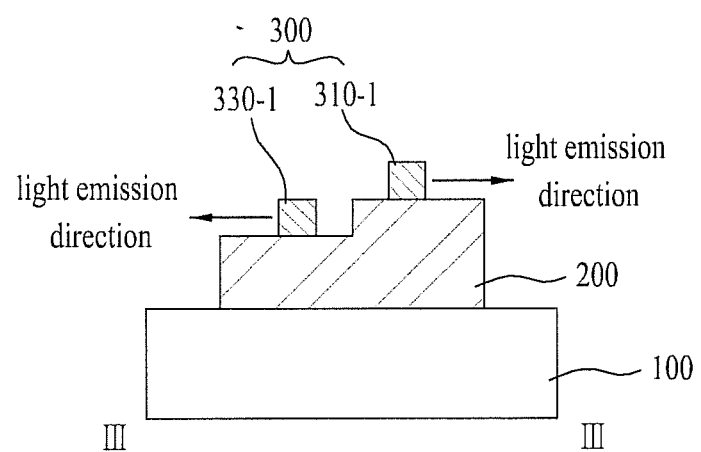

[FIG. 16A]
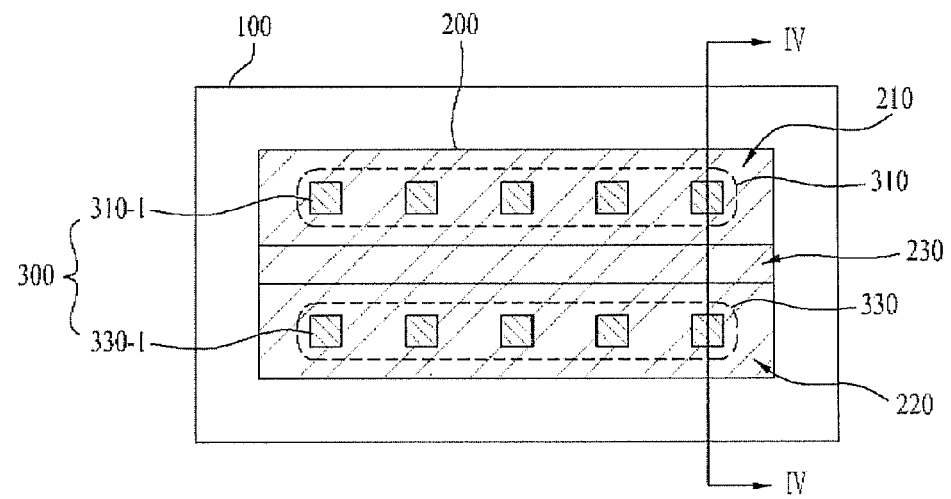
[FIG. 16B]
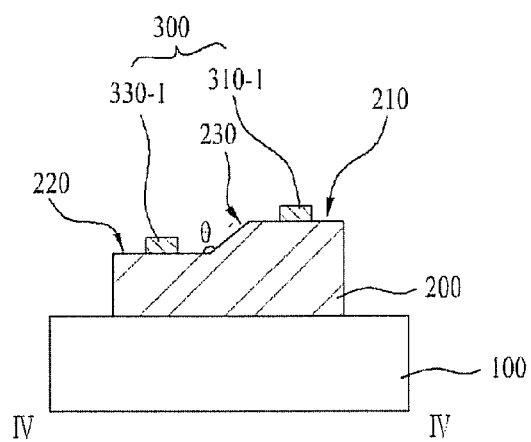

[FIG. 17A]
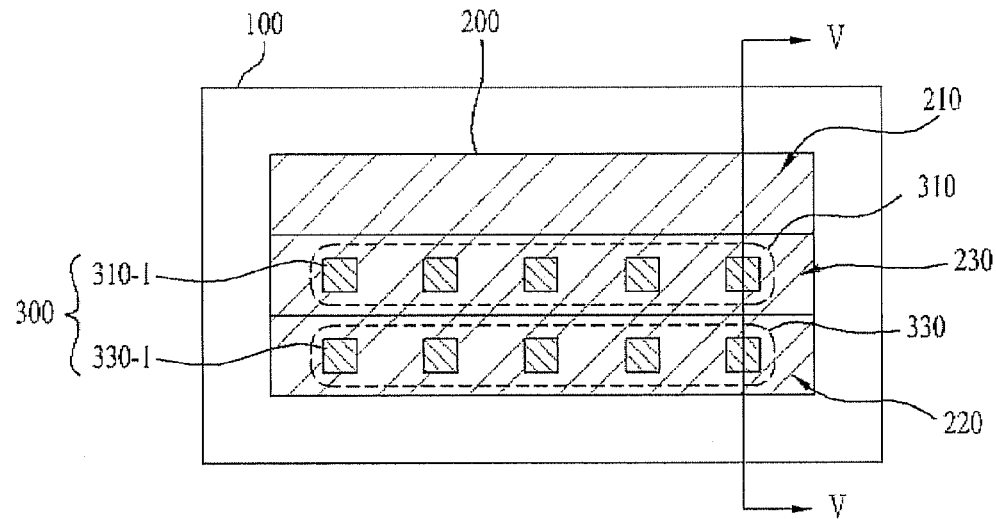
[FIG. 17B]
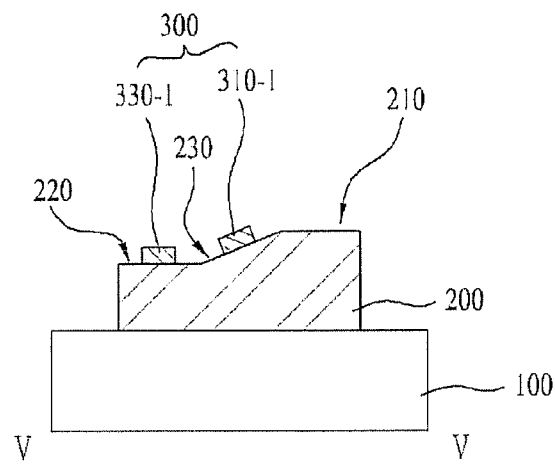

[FIG. 18A]
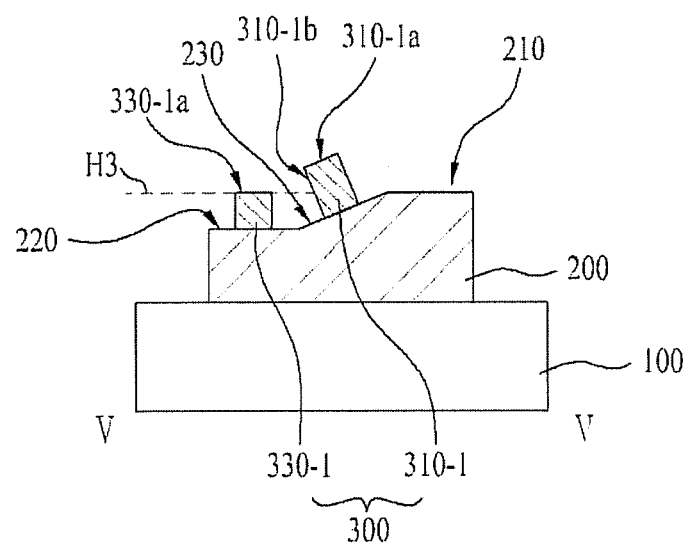
[FIG. 18B]
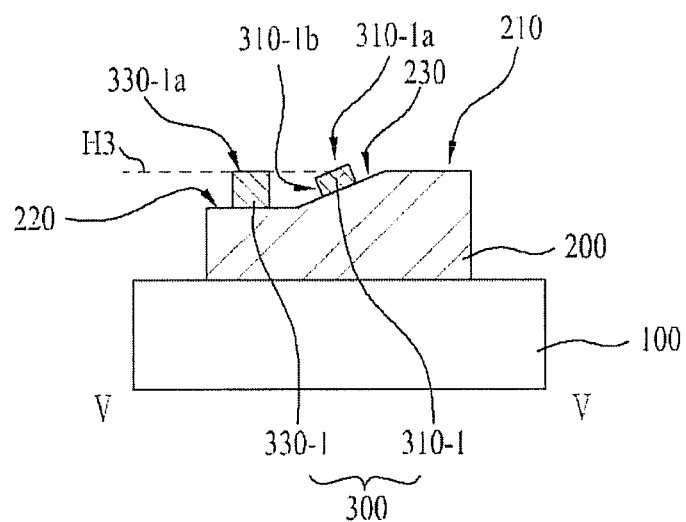

[FIG. 19A]
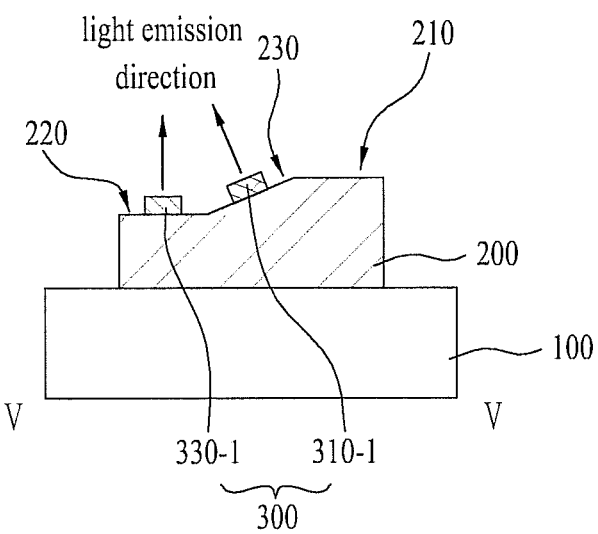
[FIG. 19B]
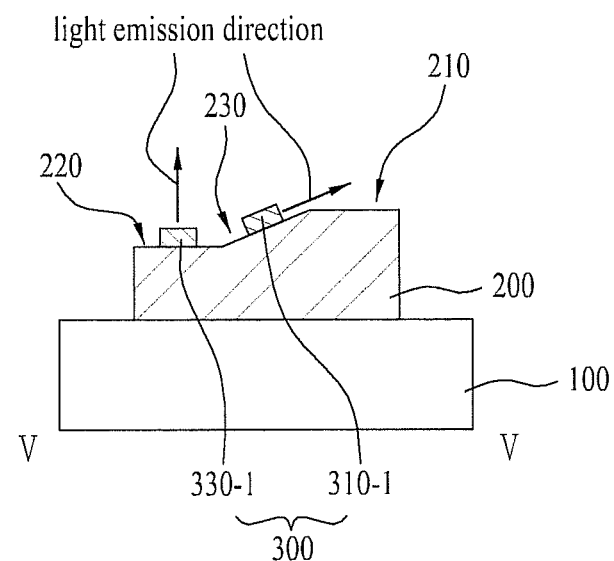

[FIG. 19C]
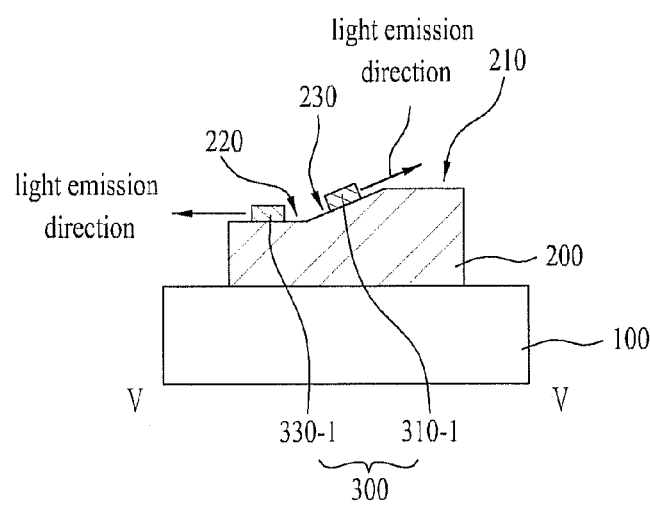
[FIG. 20A]
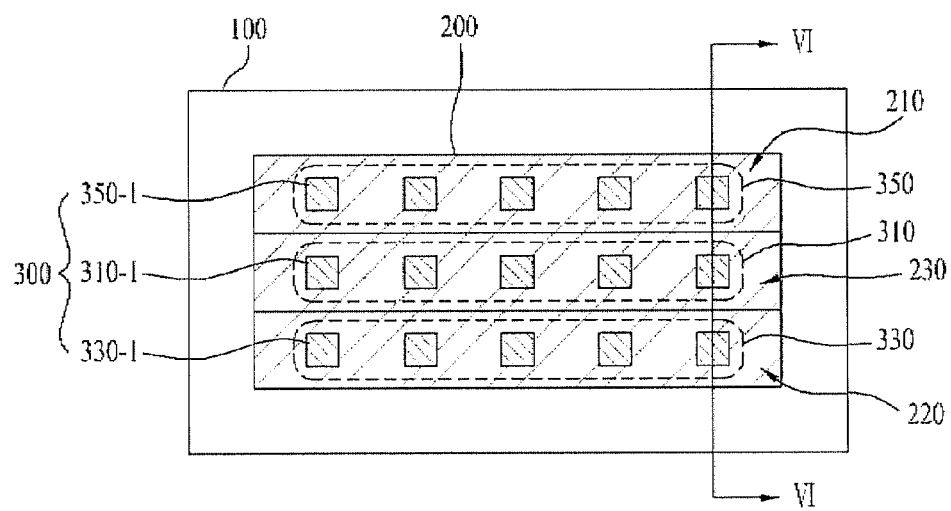

[FIG. 20B]
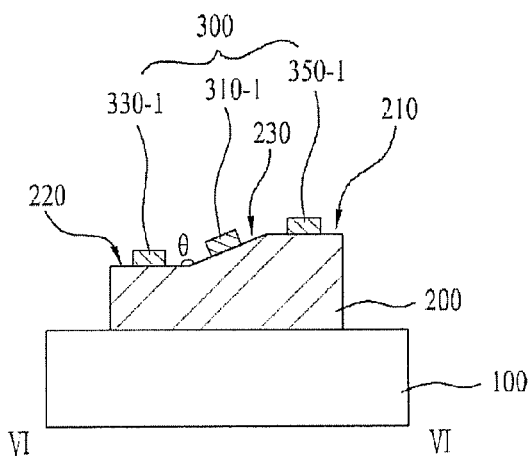
[FIG. 21A]
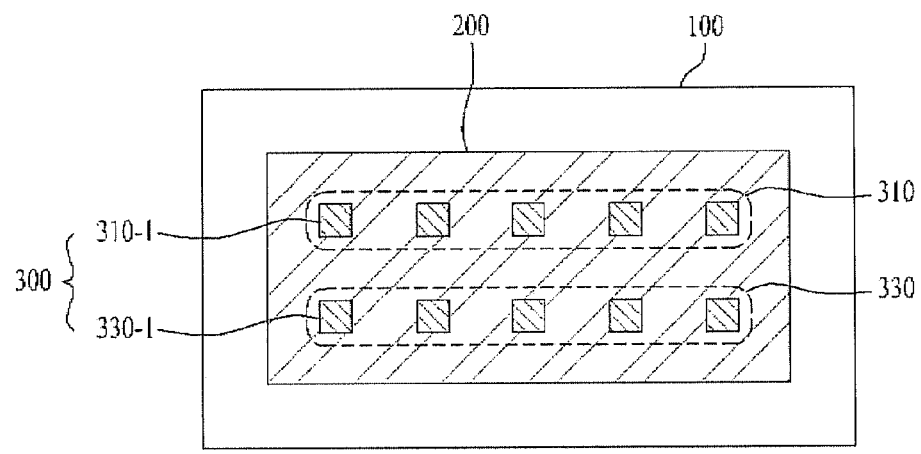

[FIG. 21B]
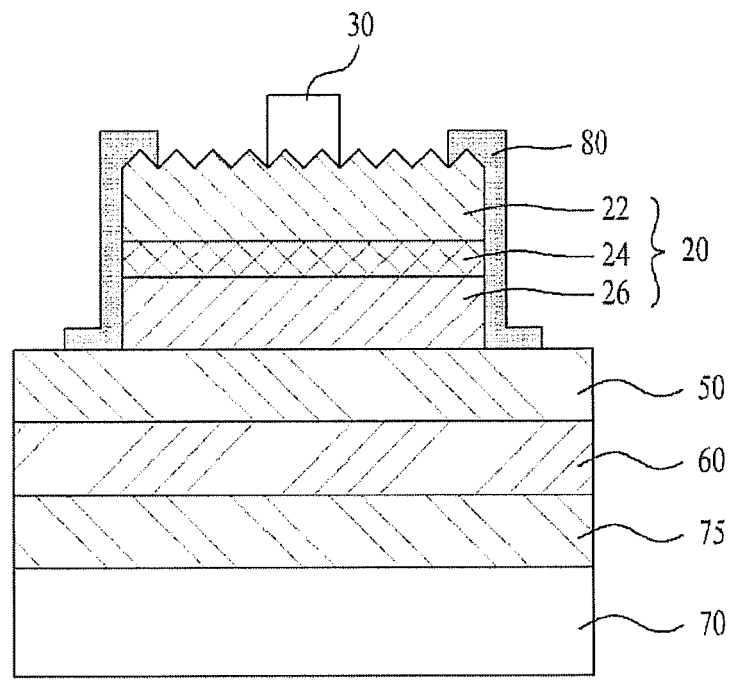
[FIG. 21C]
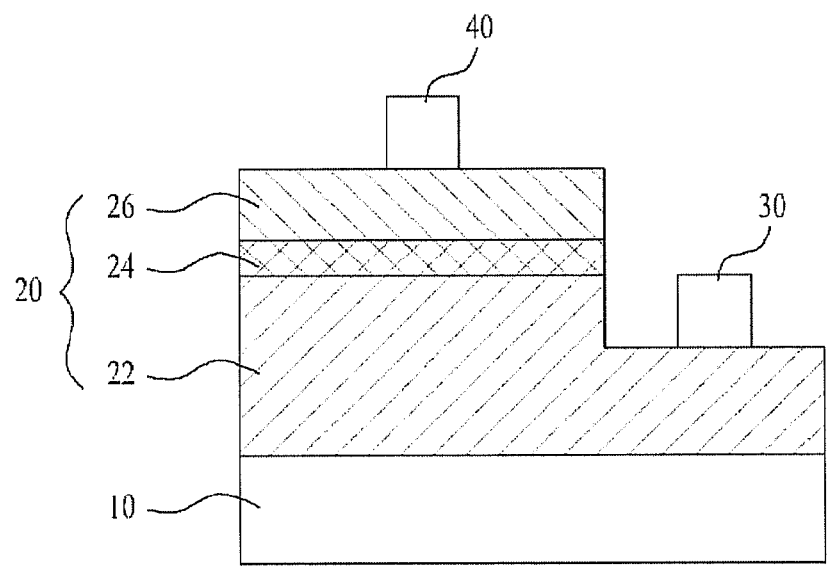

[FIG. 22A]
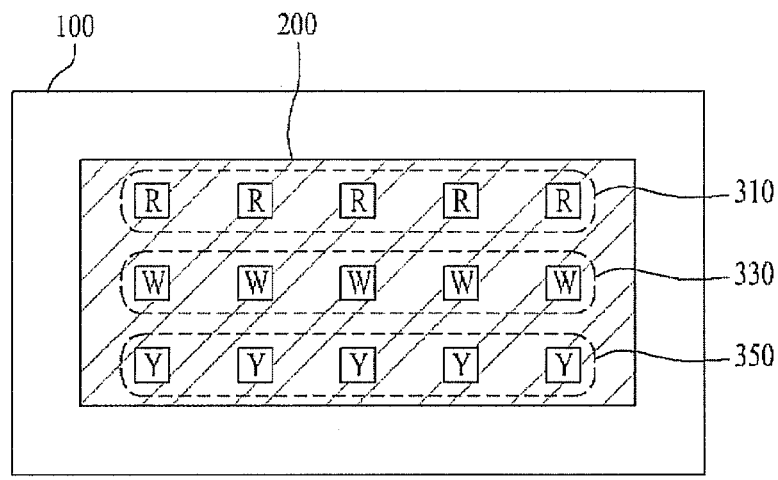
[FIG. 22B]
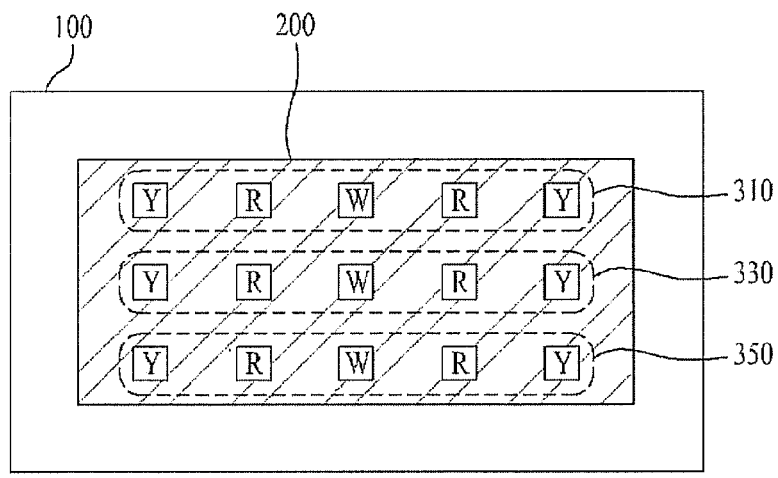

[FIG. 23A]
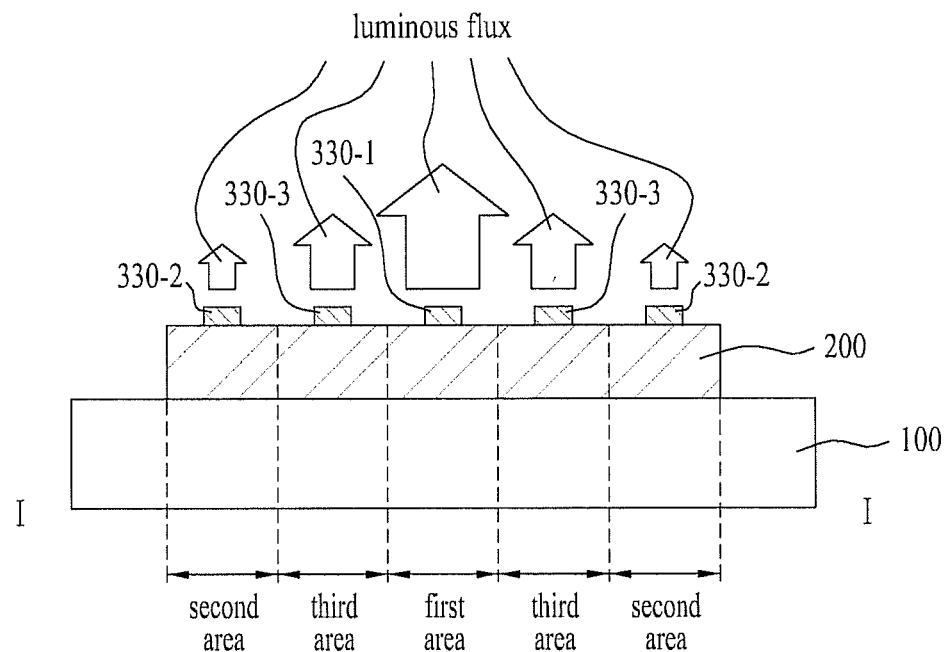
[FIG. 23B]
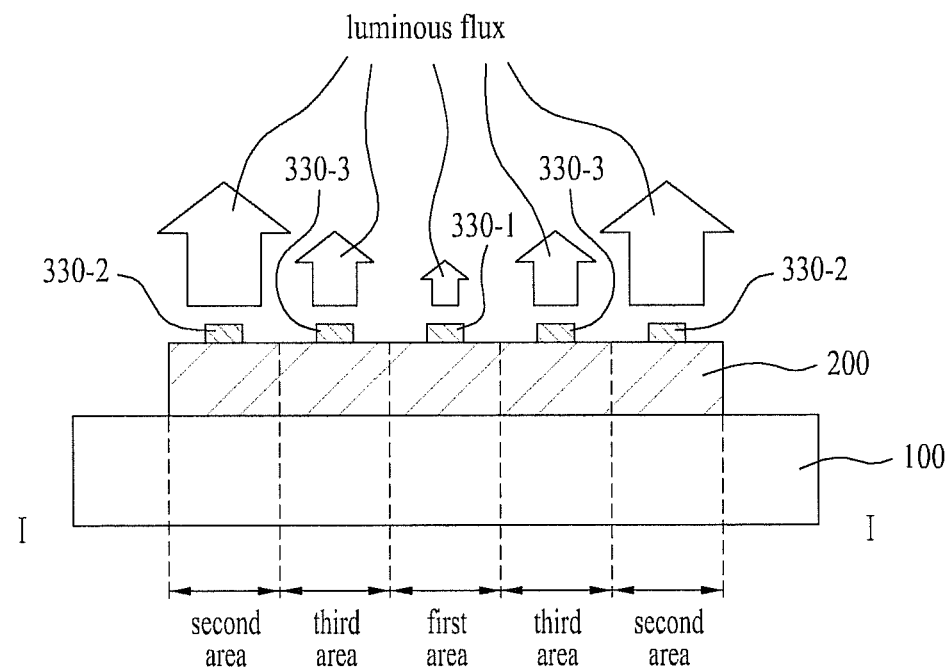

[FIG. 23C]
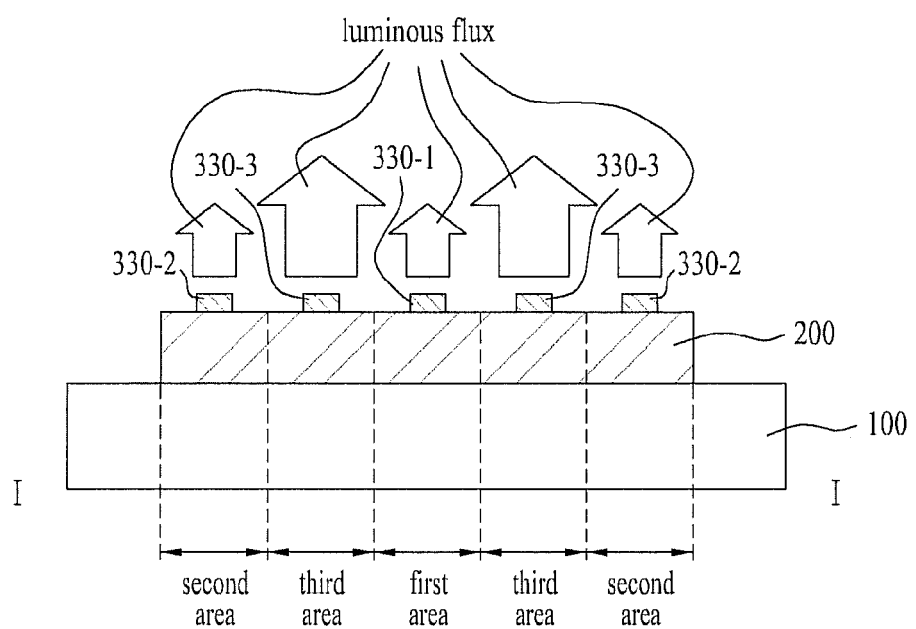
[FIG. 24A]
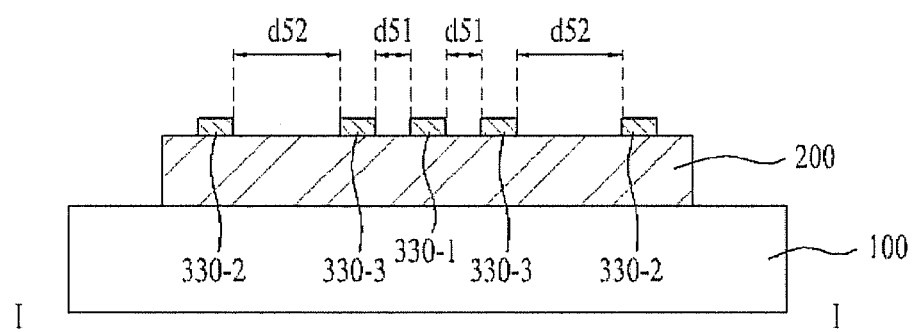

[FIG. 24B]
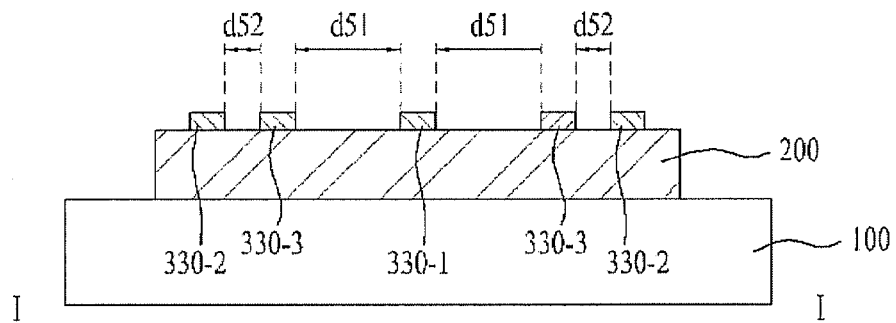
[FIG. 25A]
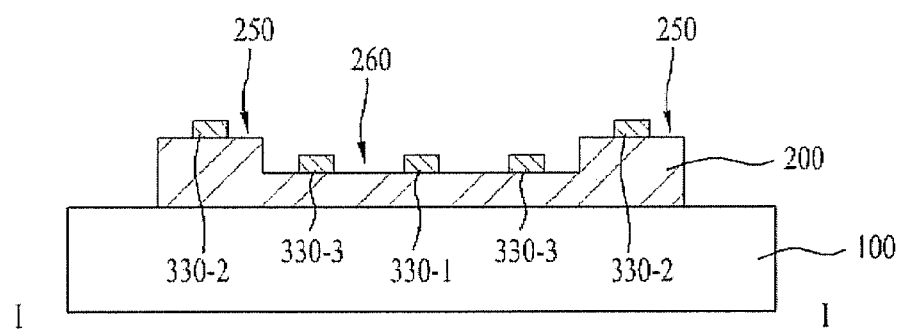
[FIG. 25B]
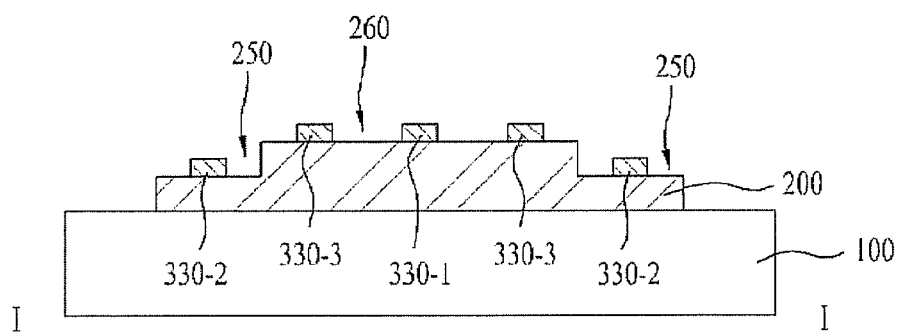

[FIG. 26A]
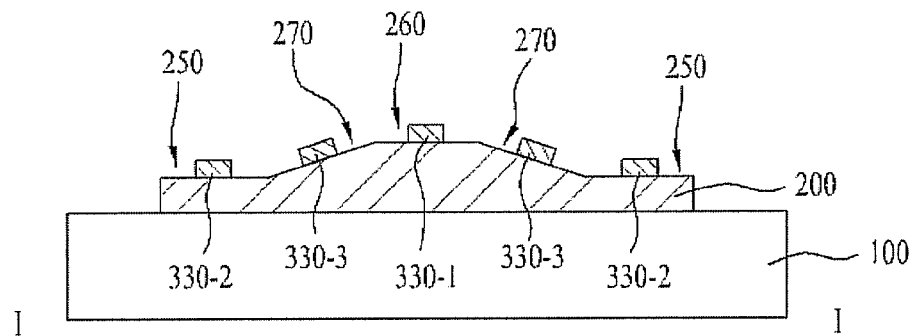
[FIG. 26B]
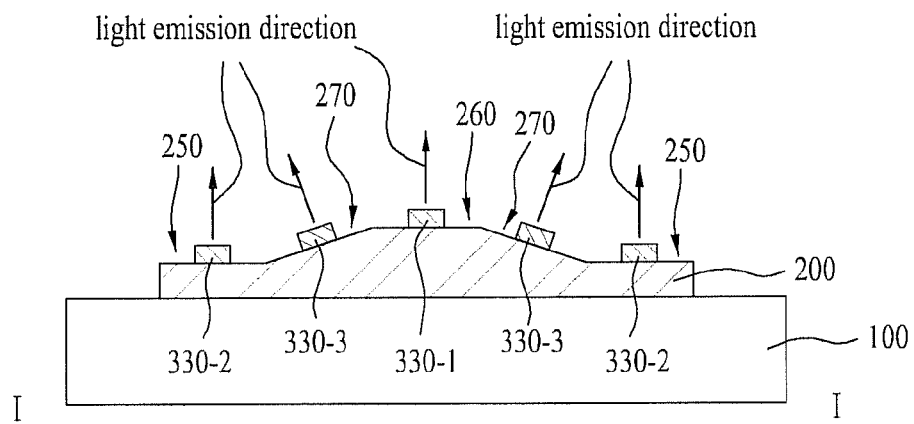
[FIG. 26C]
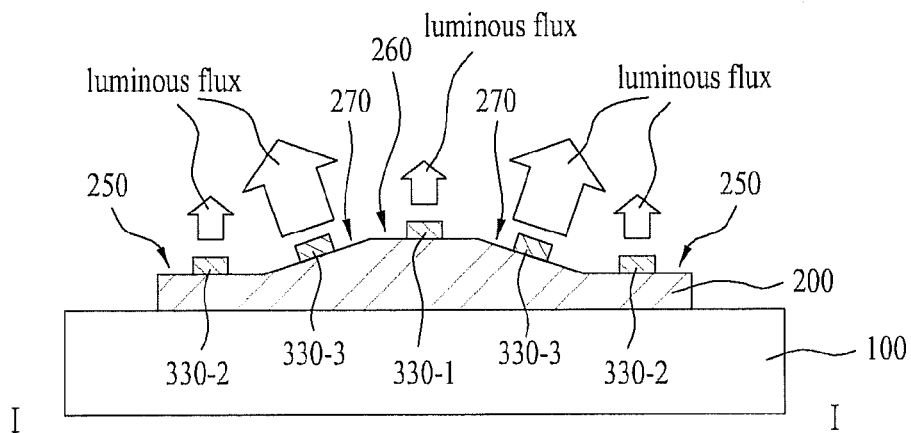

[FIG. 27A]
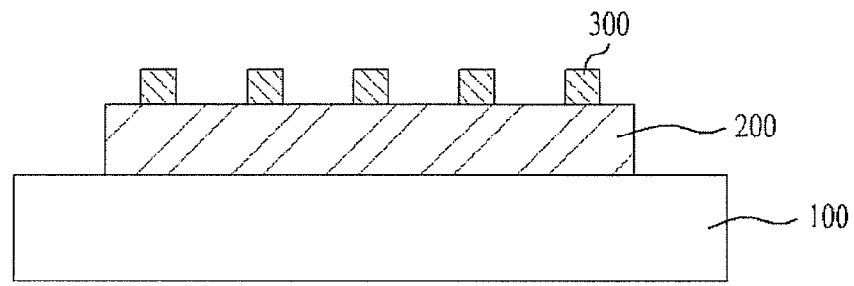
[FIG. 27B]
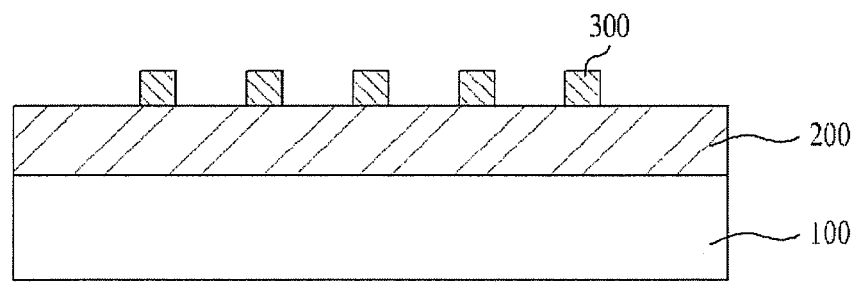
[FIG. 27C]
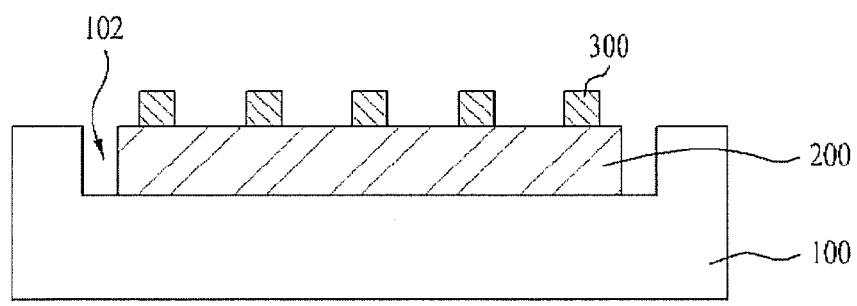

[FIG. 27D]
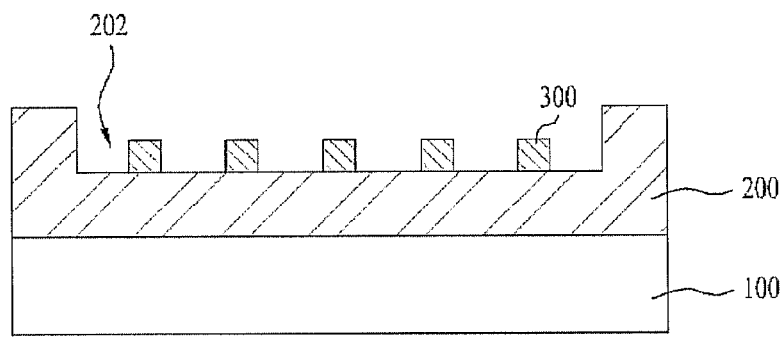
[FIG. 27E]
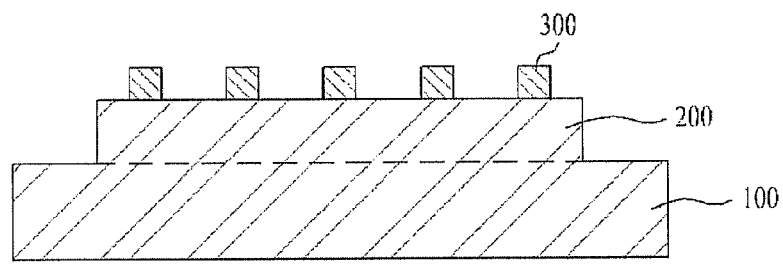

[FIG. 28A]
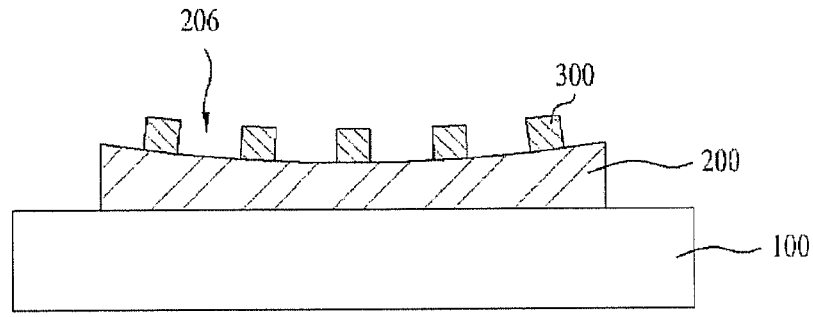
[FIG. 28B]
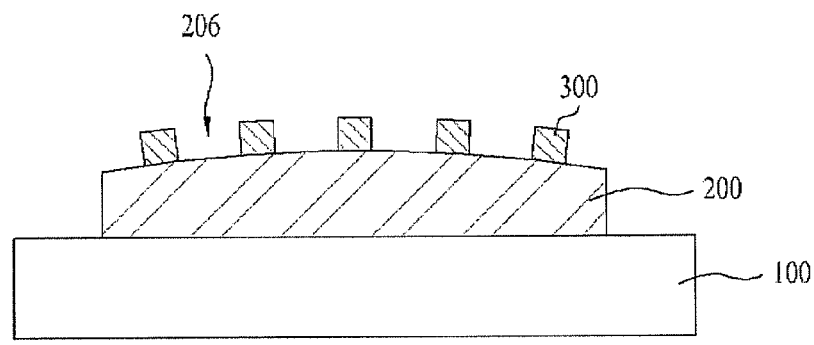
[FIG. 28C]
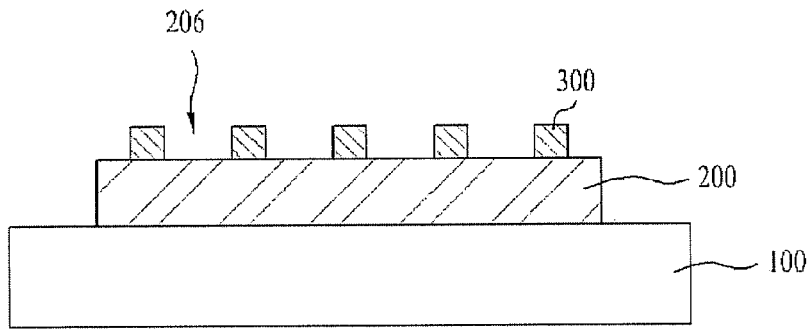

[FIG. 29A]
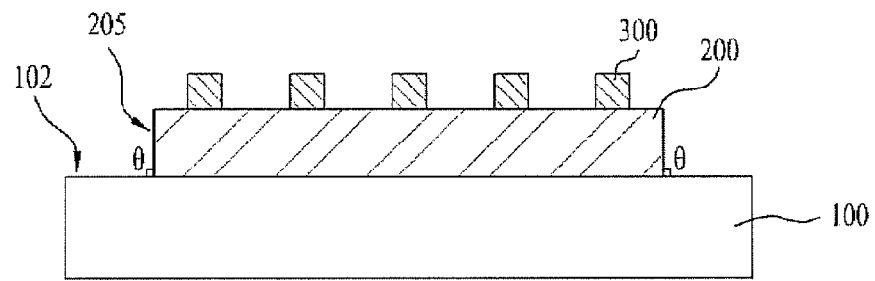
[FIG. 29B]
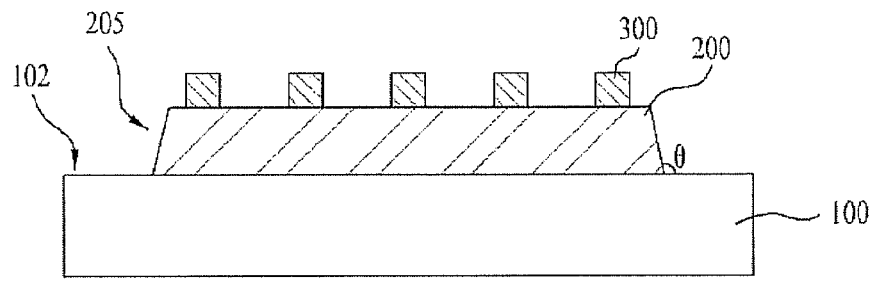
[FIG. 29C]
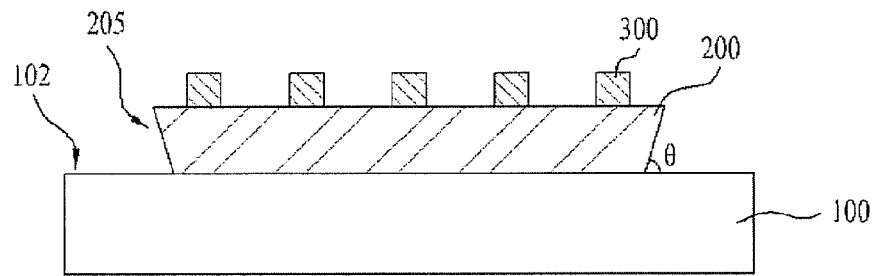

[FIG. 30A]
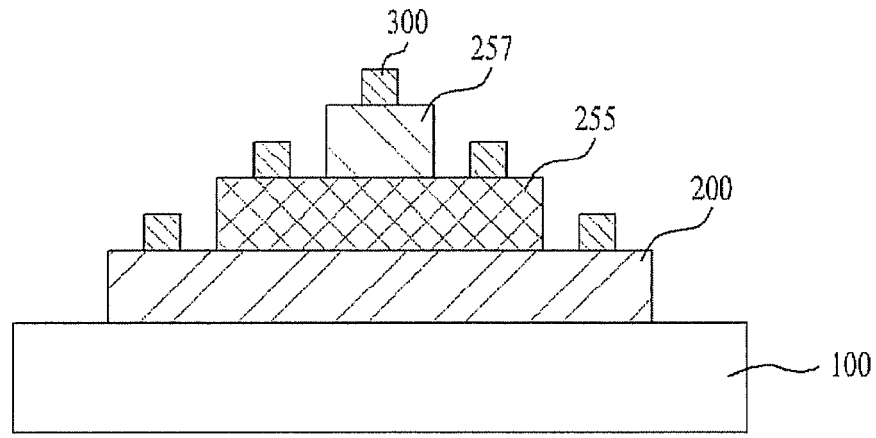
[FIG. 30B]
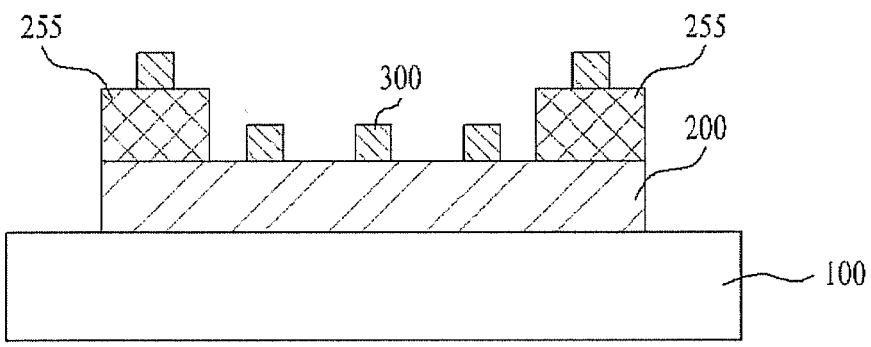
[FIG. 30C]
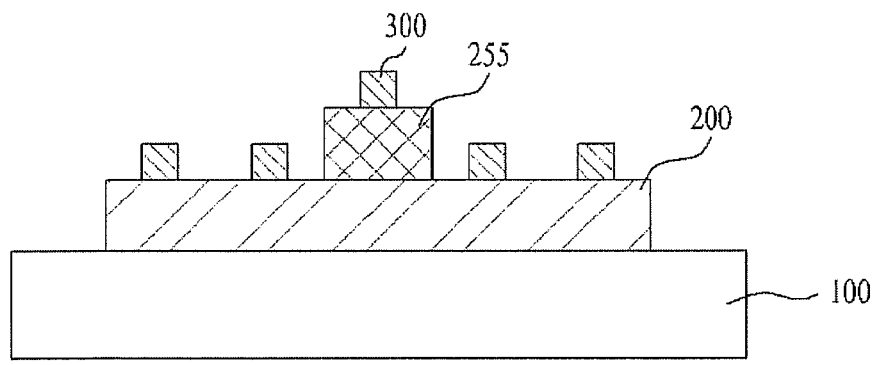

[FIG. 31A]
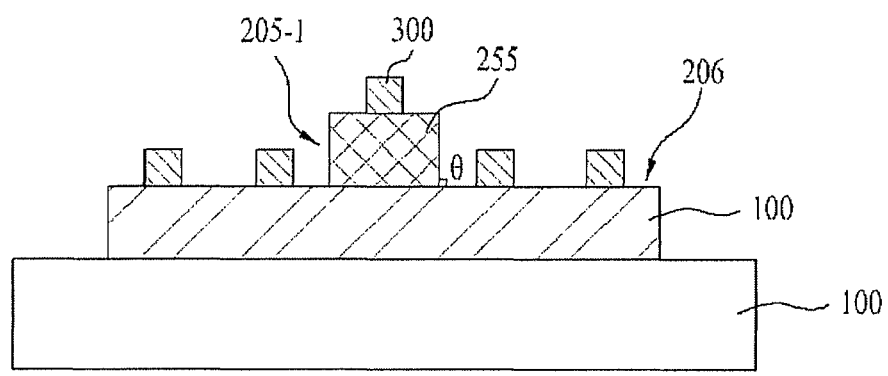
[FIG. 31B]
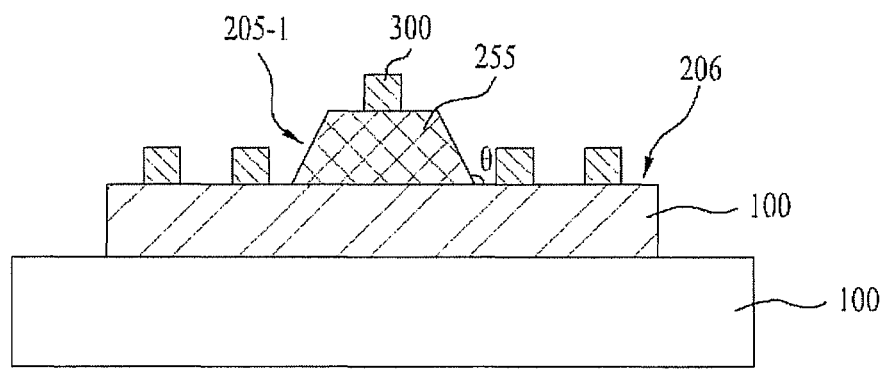

[FIG. 32]
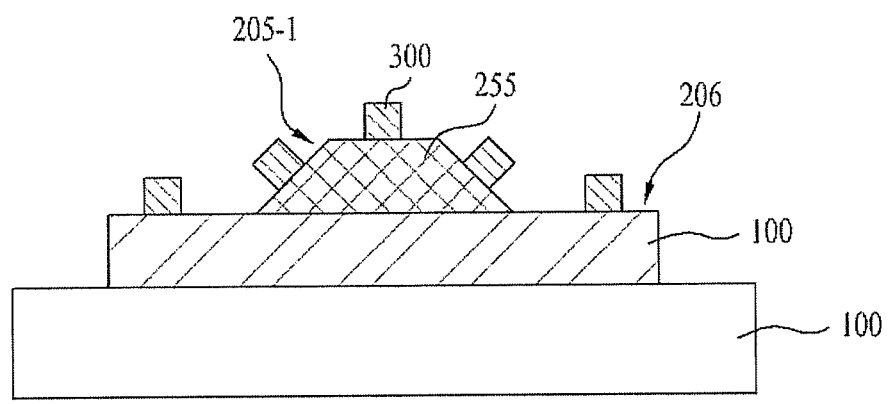

[FIG. 33A]
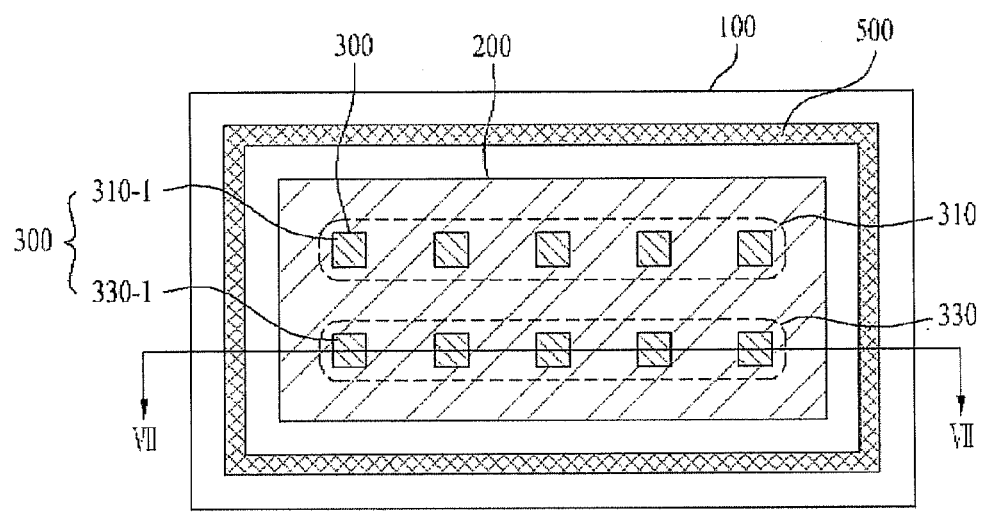
[FIG. 33B]
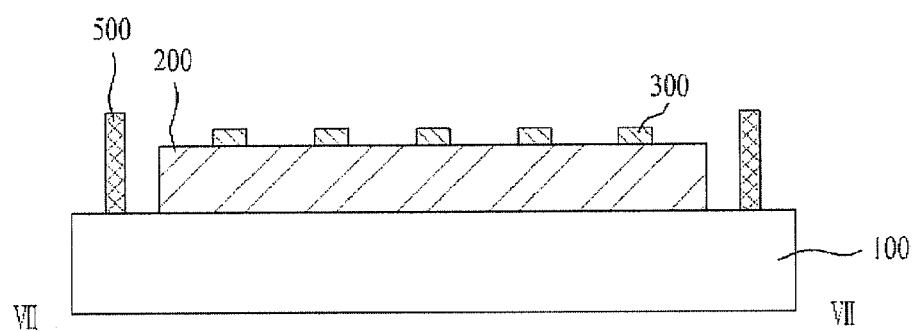

[FIG. 34A]
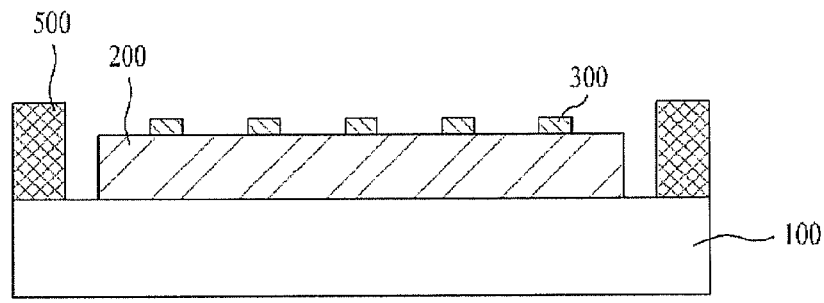
[FIG. 34B]
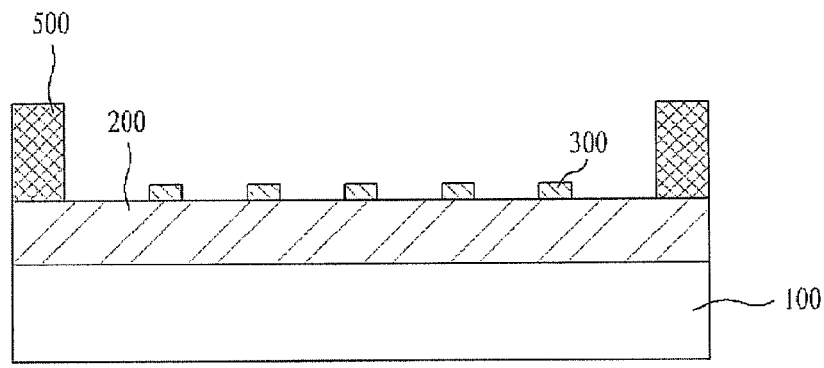
[FIG. 34C]
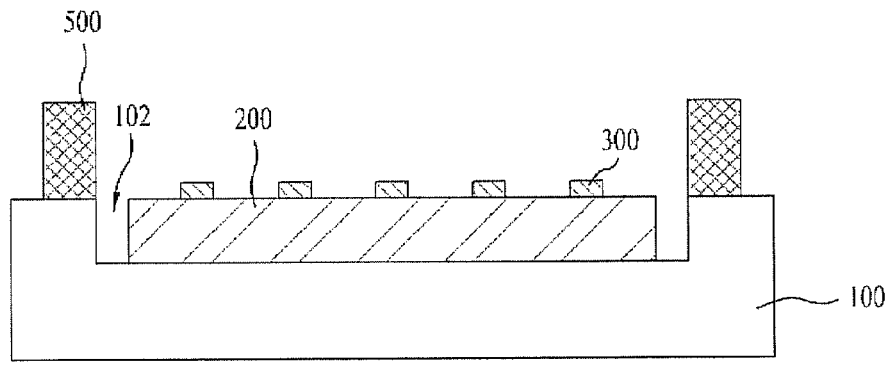

[FIG. 34D]
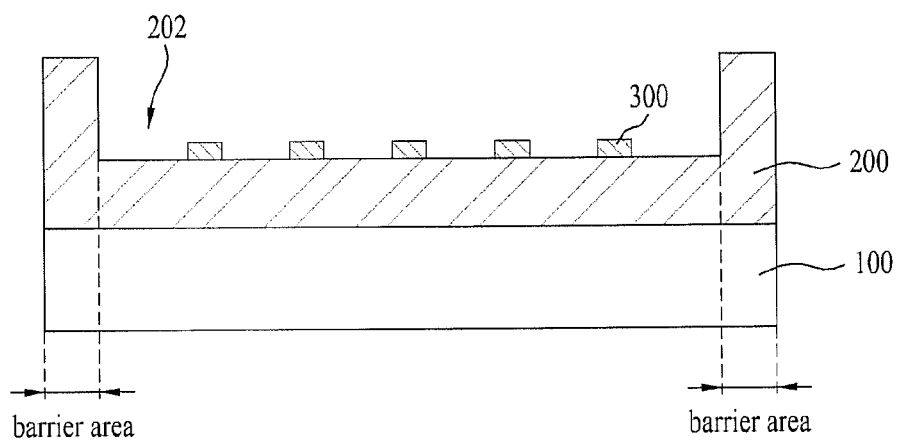

[FIG. 35A]
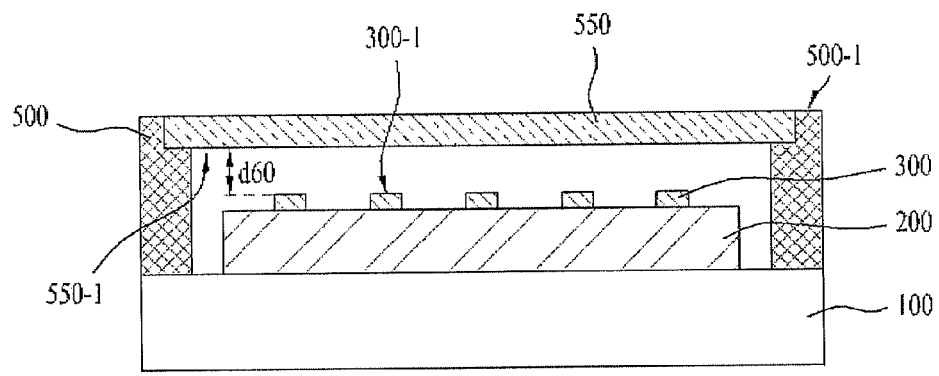
[FIG. 35B]
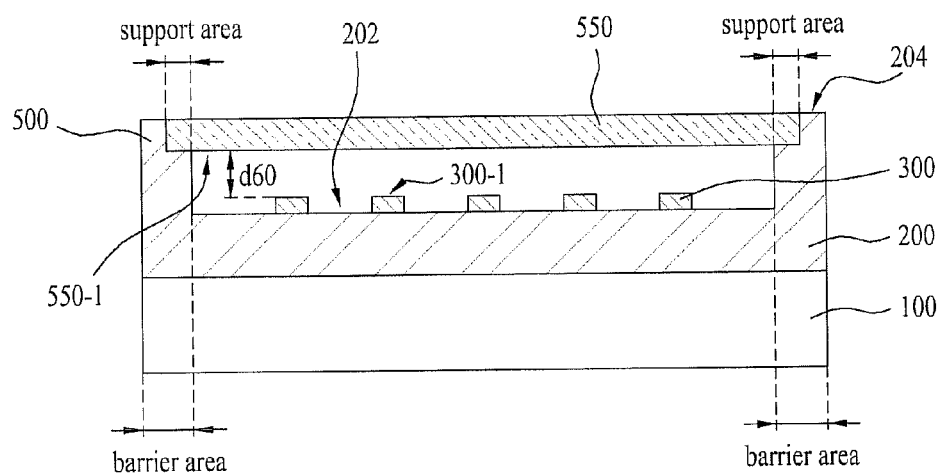

[FIG. 36A]
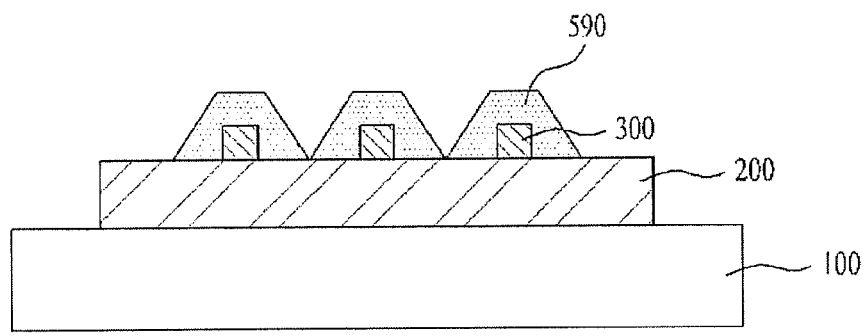
[FIG. 36B]
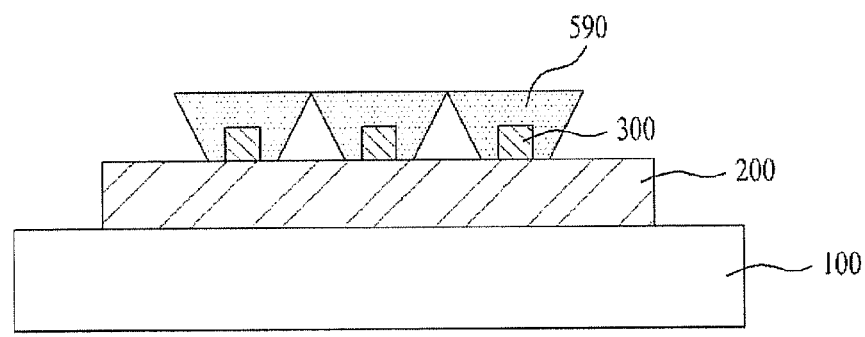
[FIG. 36C]
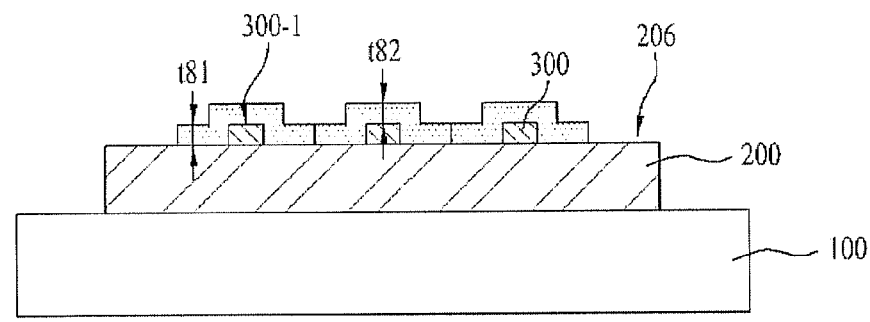

[FIG. 36D]
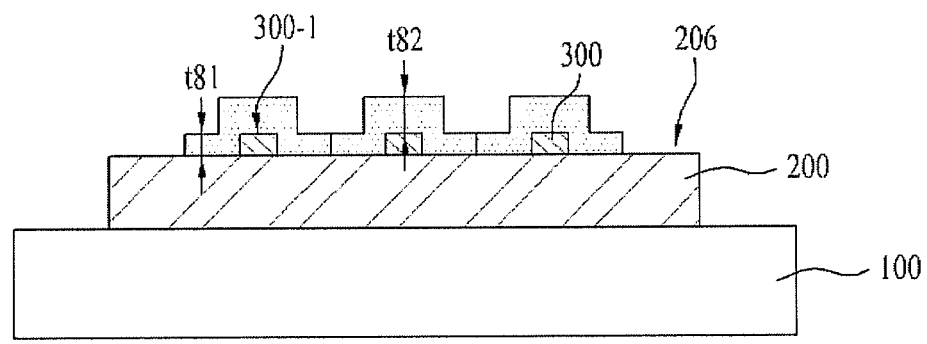
[FIG. 37]
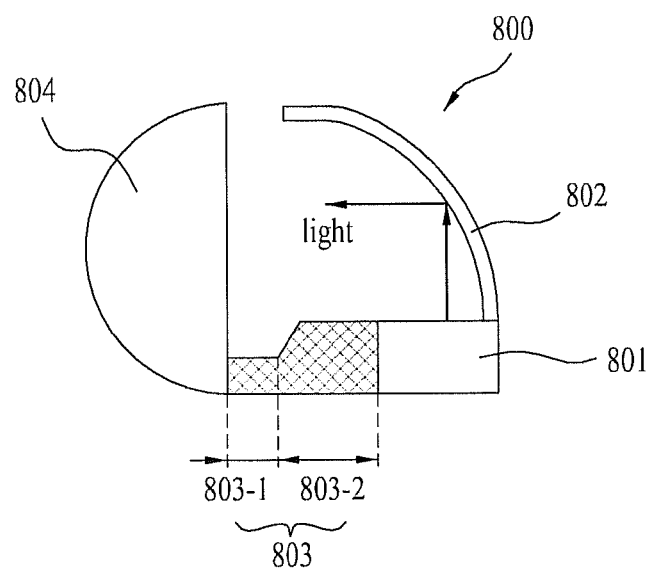

[FIG. 38]
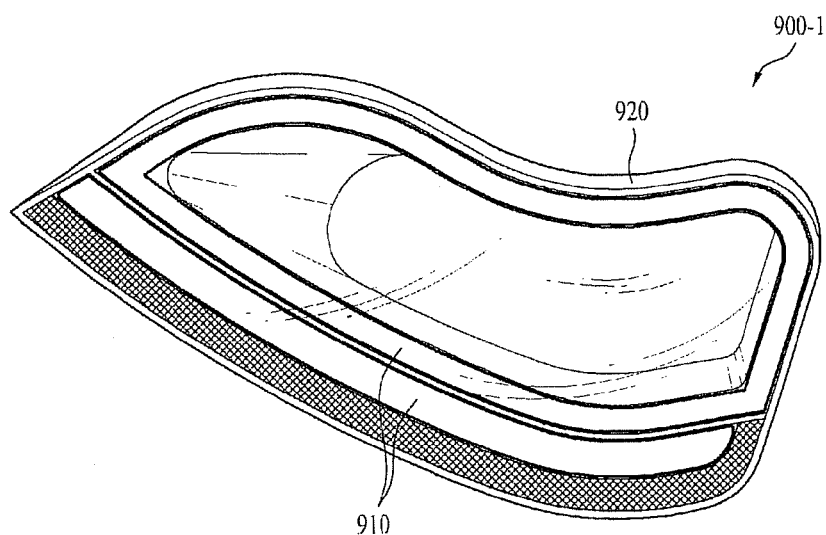
[FIG. 39A]
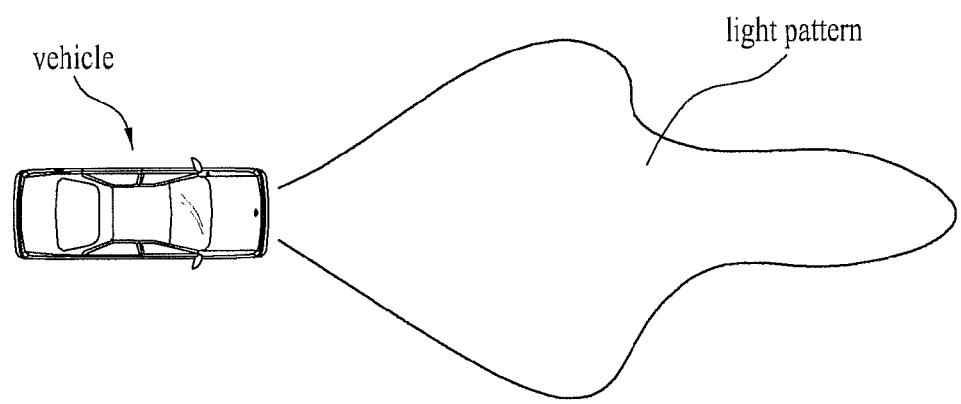

[FIG. 39B]
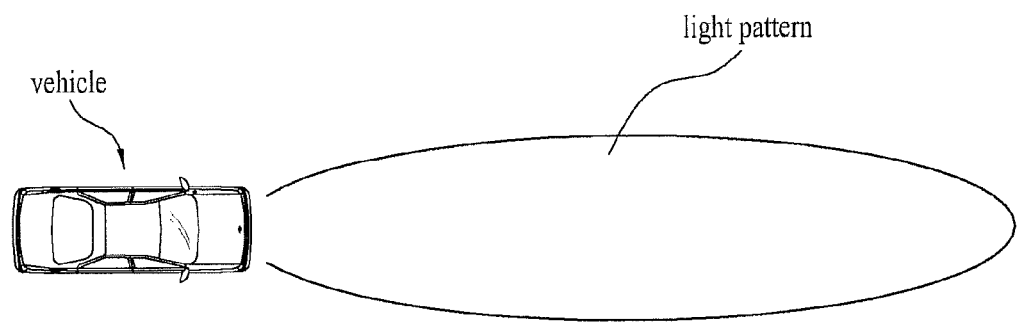
[FIG. 39C]
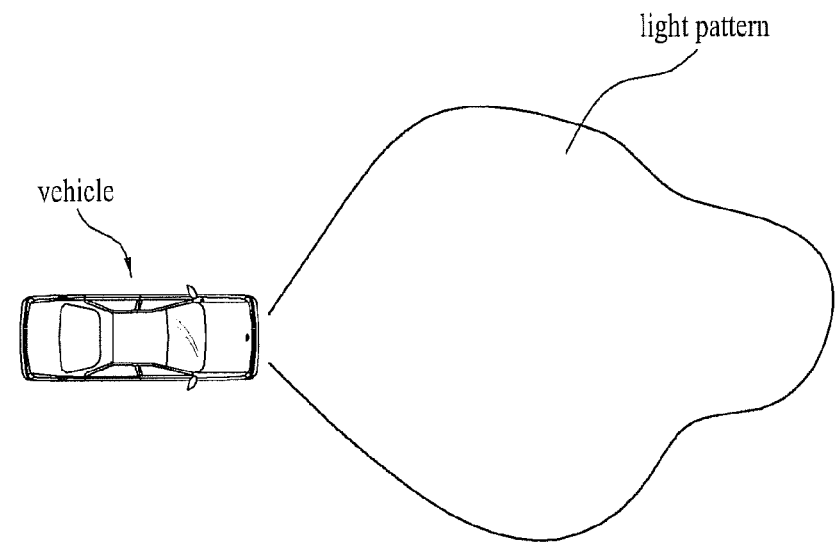

[FIG. 39D]
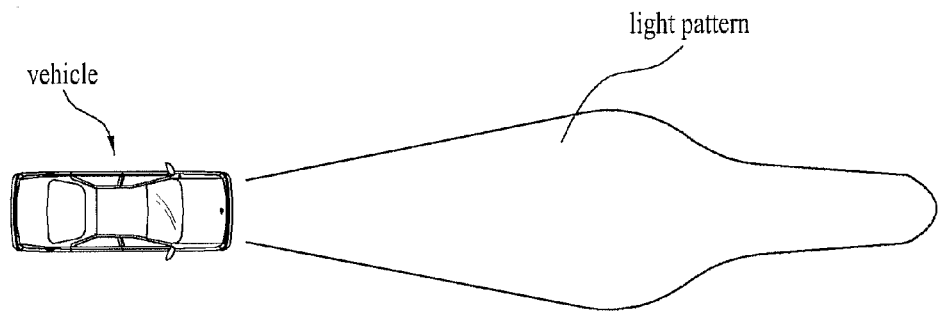
[FIG. 39E]
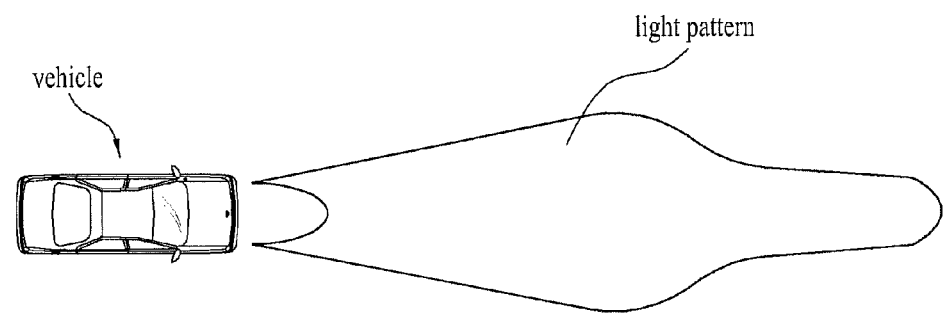

LAMP AND VEHICLE LAMP APPARATUS USING THE SAME

CROSS REFERENCE TO RELATED APPLICATION

This application claims priority under 35 U.S.C. §119 to Korean Patent Application No. 10-2012-0076858, filed in Korea on Jul. 13, 2012 which is hereby incorporated in its entirety by reference as if fully set forth herein.

TECHNICAL FIELD

Embodiments relate to an intelligent type lamp and a vehicle lamp apparatus using the same.

BACKGROUND

Generally, a lamp is an apparatus that supplies or adjusts light for a specific purpose.

An incandescent lamp, fluorescent lamp, or neon lamp may be used as a light source of the lamp. In recent years, a light emitting diode (LED) has been used as the light source of the lamp.

The LED is a device to convert an electric signal into infrared rays or light using characteristics of a compound semiconductor. Unlike the fluorescent lamp, the LED does not use a noxious material, such as mercury, and therefore, the LED rarely causes environmental pollution.

Also, the LED has a longer lifespan than the incandescent lamp, fluorescent lamp, and neon lamp. Furthermore, power consumption of the LED is lower than those of the incandescent lamp, fluorescent lamp, and neon lamp. In addition, the LED exhibits excellent visibility and low glare by virtue of high color temperature.

A lamp with such an LED may be used in a backlight, display device, lighting, indicating light for vehicles, or a head lamp according to use thereof.

Particularly, since a lamp used in a vehicle is closely related to safe travel of the vehicle, it is very important for a driver of a vehicle adjacent to another vehicle during traveling to clearly recognize light emission status.

For this reason, a lamp used in a vehicle must secure an amount of light suitable for a safety traveling standard and an aesthetic function in external appearance of the vehicle.

SUMMARY

Embodiments provide a lamp capable of providing various light colors and luminous fluxes depending upon an external environment using a plurality light source arrays which can be individually driven and a vehicle lamp apparatus using the same.

Further, embodiments provide a lamp wherein a plurality of light source arrays is efficiently disposed to provide optimum luminous flux using a small number of light sources and to reduce the total size of the lamp and a vehicle lamp apparatus using the same.

Further, embodiments provide a lamp wherein light source arrays having various light emission directions may be disposed to provide various beam patterns depending upon an external environment and a vehicle lamp apparatus using the same.

In one embodiment, a lamp includes a first substrate, a second substrate disposed on the first substrate, and a plurality of light sources disposed on the second substrate, wherein the light sources are grouped into at least one light source array, in each of which the light sources are disposed in a line, and the at least one light source array includes neighboring first and second light source arrays electrically isolated and individually driven.

The light sources of the first light source array may be electrically isolated and individually driven, and the light sources of the second light source array may be electrically isolated and individually driven.

Alternatively, the light sources of the first light source array may be electrically isolated and individually driven, and the light sources of the second light source array may be electrically connected and simultaneously driven.

The number of the light sources of the first light source array may be greater than that of the light sources of the second light source array.

Luminous flux of the light sources of the first light source array may be greater than that of the light sources of the second light source array.

The distance between the light sources of the first light source array may be less than that between the light sources of the second light source array.

The first light source array and the second light source array may be spaced apart from each other by a first distance, and the light sources of the first light source array or the second light source array may be spaced apart from each other by a second distance. The first distance may be greater than the second distance.

The light sources of the first light source array and the light sources of the second light source array may be disposed in parallel to each other.

Also, the light sources of the first light source array and the light sources of the second light source array may be disposed in an aligned state.

According to circumstances, the light sources of the first light source array and the light sources of the second light source array may be disposed in an unaligned state.

The light sources of the first light source array and the light sources of the second light source array may be disposed on different planes.

The distance between a first parallel line extending from an upper surface of each light source of the first light source array and a second parallel line extending from an upper surface of each light source of the second light source array may be less than the distance between the upper surface and a lower surface of each light source of the first light source array or the second light source array.

The light emission direction of the light sources of the first light source array may be different from that of the light sources of the second light source array.

The first parallel line extending from the upper surface of each light source of the first light source array may reach the upper surface or a side surface of each light source of the second light source array.

Also, the first light source array may be supported by a first area of the second substrate, the second light source array may be supported by a second area of the second substrate, and the angle between the surface of the first area of the second substrate facing the first light source array and the surface of the second area of the second substrate facing the second light source array may be about 91 to 179 degrees.

The first substrate may be a metal substrate having a first heat conductivity, and the second substrate may be an insulative substrate having a second heat conductivity.

The first heat conductivity of the first substrate may be greater than the second heat conductivity of the second substrate.

The first substrate may include a cavity formed at a predetermined area thereof, and the second substrate may be disposed in the cavity of the first substrate. In this case, the first substrate may include at least one selected from among Al, Cu, and Au, and the second substrate may include AlN.

The first substrate and the second substrate may be sequentially stacked to form a laminated structure. In this case, the first substrate may include at least one selected from among Al, Cu, and Au, and the second substrate may include an anodized layer.

Also, the first substrate and the second substrate may be formed of the same material. In this case, the first substrate and the second substrate may include at least one selected from among AlN, Al, Cu, and Au.

The second substrate may have at least one selected from among a concave surface, a convex surface, and a flat surface.

The second substrate may include at least one projection protruding from the surface thereof, on which the light sources 300 are disposed, by a predetermined height. The angle between the surface of the second substrate and a side surface of the projection may be a right angle or an obtuse angle.

Also, at least one light source may be disposed at the side surface and/or an upper surface of the projection.

The lamp may further include a barrier disposed around the light sources, wherein the barrier may include a metal reflective material.

Also, the lamp may further include a cover glass spaced apart from the light sources by a predetermined distance. The distance between the light sources and the cover glass may be about 0.1 mm to 50 mm.

In another embodiment, a lamp includes a first substrate, a second substrate disposed on the first substrate, and a plurality of light sources disposed on the second substrate, wherein the light sources are grouped into at least one light source array, in each of which the light sources are disposed in a line, the at least one light source array includes neighboring first and second light source arrays electrically isolated and individually driven, a first light source of the first light source array is spaced apart from a second light source of the second light source array closest to the first light source by a first distance, the first light source of the first light source array is spaced apart from a second light source of the first light source array closest to the first light source by a second distance, and the first distance is less than the second distance.

BRIEF DESCRIPTION OF THE DRAWINGS

Arrangements and embodiments may be described in detail with reference to the following drawings in which like reference numerals refer to like elements and wherein:

FIGS. 1A and 1B are sectional views illustrating a lamp according to an embodiment;

FIGS. 2A and 2B are views showing light source arrays of a lamp according to an embodiment;

FIG. 3 is a plan view showing electrical connection of light sources according to a first embodiment;

FIGS. 4A and 4B are plan views showing electrical connection of light sources according to a second embodiment;

FIGS. 5A and 5B are plan views showing electrical connection of light sources according to a third embodiment;

FIGS. 6A and 6B are plan views showing electrical connection of light sources according to a fourth embodiment;

FIGS. 7A to 7C are plan views showing the number of light sources included in light source arrays;

FIGS. 8A to 8C are plan views showing luminous fluxes of light sources included in light source arrays;

FIGS. 9A to 9C are plan views showing distances between light sources included in light source arrays;

FIGS. 10A and 10B are plan views showing distances between light source arrays and distances between light sources;

FIGS. 11A and 11B are plan views showing the arrangement of light sources according to a first embodiment;

FIGS. 12A and 12B are plan views showing the arrangement of light sources according to a second embodiment;

FIGS. 13A and 13B are views showing the arrangement of light sources according to a third embodiment;

FIGS. 14A to 14C are sectional views showing the arrangement of the light sources of FIG. 13B;

FIGS. 15A to 15D are sectional views showing light emission directions of the light sources of FIG. 13B;

FIGS. 16A and 16B are views showing the arrangement of light sources according to a fourth embodiment;

FIGS. 17A and 17B are views showing the arrangement of light sources according to a fifth embodiment;

FIGS. 18A and 18B are sectional views showing the arrangement of the light sources of FIG. 17B;

FIGS. 19A to 19C are sectional views showing light emission directions of the light sources of FIG. 17B;

FIGS. 20A and 20B are views showing the arrangement of light sources according to a sixth embodiment;

FIGS. 21A to 21C are views showing the structure of a light source according to an embodiment;

FIGS. 22A and 22B are plan views showing the arrangement of light colors of light source arrays according to an embodiment;

FIGS. 23A to 23C are sectional views showing luminous fluxes of light sources included in light source arrays;

FIGS. 24A and 24B are sectional views showing distances between light sources included in light source arrays;

FIGS. 25A and 25B are sectional views showing the arrangement of light sources included in light source arrays according to a first embodiment;

FIGS. 26A to 26C are sectional views showing the arrangement of light sources included in light source arrays according to a second embodiment;

FIGS. 27A to 27E are sectional views showing the structure of a substrate of a lamp according to an embodiment;

FIGS. 28A to 28C are sectional views showing the upper surface of a second substrate;

FIGS. 29A to 29C are sectional views showing the side surface of a second substrate;

FIGS. 30A to 30C are sectional views showing projections of a second substrate according to a first embodiment;

FIGS. 31A and 31B are sectional views showing a projection of a second substrate according to a second embodiment;

FIG. 32 is a sectional view showing a projection of a second substrate according to a third embodiment;

FIGS. 33A and 33B are sectional views showing a barrier of a lamp according to an embodiment;

FIGS. 34A to 34D are sectional views showing the arrangement of a barrier of a lamp according to an embodiment;

FIGS. 35A and 35B are sectional views showing a cover glass of a lamp according to an embodiment;

FIGS. 36A to 36D are sectional views showing fluorescent layers of a lamp according to an embodiment;

FIG. 37 is a sectional view showing a head lamp of a vehicle including a lamp according to a first embodiment;

FIG. 38 is a sectional view showing a head lamp of a vehicle including a lamp according to a second embodiment; and FIGS. 39A to 39E are sectional views showing a beam pattern of a vehicle including a lamp according to an embodiment.

DETAILED DESCRIPTION

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

FIGS. 1A and 1B are sectional views illustrating a lamp according to an embodiment. FIG. 1A is a plan view of the lamp, and FIG. 1B is a sectional view taken along line I-I of FIG. 1A.

As shown in FIGS. 1A and 1B, the lamp may include a first substrate 100, a second substrate 200, and a plurality of light sources 300.

The second substrate 200 may be disposed on the first substrate 100. The light sources 300 may be disposed on the second substrate 200.

The area of the second substrate 200 may be less than that of the first substrate 100.

According to the circumstances, the area of the second substrate 200 may be equal to that of the first substrate 100.

A circuit pattern may be formed at the second substrate 200. The light sources 300 may be electrically connected to the circuit pattern of the second substrate 200 via wires.

The first substrate 100 may be a metal substrate having a first heat conductivity. The second substrate 200 may be an insulative substrate having a second heat conductivity.

The first heat conductivity of the first substrate 100 may be greater than the second heat conductivity of the second substrate 200.

Consequently, heat generated from the light sources 300 disposed on the second substrate 200 may be rapidly discharged to the outside.

For example, the first substrate 100 may be a metal cored printed circuit board (MCPCB).

Also, the first substrate 100 may be a heat dissipation plate, exhibiting high heat conductivity, made of copper (Cu), aluminum (Al), silver (Ag), gold (Au), or an alloy thereof.

The second substrate 200 may be made of a nitride, such as AlN, exhibiting high heat conductivity.

According to circumstances, the second substrate 200 may include an anodized layer.

The first substrate 100 and the second substrate 200 may be formed in various shapes. For example, the first substrate 100 may include a cavity formed at a predetermined area thereof, and the second substrate 200 may be disposed in the cavity of the first substrate 100.

In this case, the first substrate 100 may include at least one selected from among Al, Cu, and Au, and the second substrate 200 may include AlN.

As another example, the first substrate 100 and the second substrate 200 may be sequentially stacked to form a laminated structure.

In this case, the first substrate 100 may include at least one selected from among Al, Cu, and Au, and the second substrate 200 may include an anodized layer.

As yet another example, the first substrate 100 and the second substrate 200 may be formed of the same material. In this case, the first substrate 100 and the second substrate 200 may include at least one selected from among AlN, Al, Cu, and Au.

The second substrate 200 may have a flat upper surface, on which the light sources 300 are disposed. According to circumstances, the second substrate 200 may have a concave upper surface or a convex upper surface.

In another case, the upper surface of the second substrate 200 may be a combination of at least two selected from among a concave upper surface, a convex upper surface, and a flat upper surface.

The second substrate 200 may include at least one projection (not shown) protruding from the upper surface thereof, on which the light sources 300 are disposed, by a predetermined height.

The angle between the upper surface of the second substrate 200 and a side surface of the projection may be a right angle or an obtuse angle.

The light sources 300 may be disposed on the projection as described above to diversify light emission directions of the light sources 300, thereby realizing various beam patterns.

For example, at least one light source 300 may be disposed at the side surface and/or an upper surface of the projection (not shown).

The light sources 300 may be disposed on the second substrate 200 so that the light sources 300 are spaced apart from each other by a predetermined distance.

The light sources 300 may be connected to the second substrate 200 by eutectic bonding or die bonding.

Each light source 300 may be a top view type light emitting diode. According to circumstances, each light source 300 may be a side view type light emitting diode.

In another case, the light sources 300 may include top view type light emitting diodes and side view type light emitting diodes, which may be disposed on the second substrate 200 in a mixed state.

Each light source 300 may be a light emitting diode (LED) chip. The LED chip may be a red LED chip, blue LED chip, or ultraviolet LED chip. Alternatively, the LED chip may be at least one selected from among a red LED chip, green LED chip, blue LED chip, yellow LED chip, and white LED chip, or a combination thereof.

A white LED may be realized by using a yellow phosphor on a blue LED or simultaneously using a red phosphor and green phosphor on a blue LED. Also, a white LED may be realized by simultaneously using a yellow phosphor, red phosphor, and green phosphor on a blue LED.

As an example, in a case in which the lamp is applied to a head lamp of a vehicle, each light source 300 may be a vertical lighting emitting chip, such as a white lighting emitting chip. However, embodiments are not limited thereto.

The light sources 300 may constitute at least one light source array.

A first light source array 310 and a second light source array 330 may be electrically isolated and individually driven.

Specifically, the light sources included in the first light source array 310 may be electrically isolated and individually driven, and the light sources included in the second light source array 330 may be electrically isolated and individually driven.

According to circumstances, the light sources included in the first light source array 310 may be electrically connected and simultaneously driven, and the light sources included in the second light source array 330 may be electrically connected and simultaneously driven.

In another case, the light sources included in the first light source array 310 may be electrically isolated and individually driven, and the light sources included in the second light source array 330 may be electrically connected and simultaneously driven.

The number of the light sources included in the first light source array 310 may be equal to that of the light sources included in the second light source array 330. According to circumstances, the number of the light sources included in the first light source array 310 may be different from that of the light sources included in the second light source array 330.

For example, the number of the light sources included in the first light source array 310 may be greater than that of the light sources included in the second light source array 330.

Also, luminous flux of the light sources included in the first light source array 310 may be equal to that of the light sources included in the second light source array 330. According to circumstances, luminous flux of the light sources included in the first light source array 310 may be different from that of the light sources included in the second light source array 330.

For example, luminous flux of the light sources included in the first light source array 310 may be greater than that of the light sources included in the second light source array 330.

The distance between the light sources included in the first light source array 310 may be equal to that between the light sources included in the second light source array 330. According to circumstances, the distance between the light sources included in the first light source array 310 may be different from that between the light sources included in the second light source array 330.

For example, the distance between the light sources included in the first light source array 310 may be narrower than that between the light sources included in the second light source array 330.

According to circumstances, the first light source array 310 and the second light source array 330 may be spaced apart from each other by a first distance, and the light sources included in the first light source array 310 or the second light source array 330 may be spaced apart from each other by a second distance. The first distance may be equal to the second distance. According to circumstances, the first distance may be different from the second distance.

For example, the first distance may be greater than the second distance.

A ratio of the first distance to the second distance may be about 1.1:1 to 10:1.

Also, the light sources included in the first light source array 310 and the light sources included in the second light source array 330 may be disposed in parallel to each other.

In a case in which the number of the light sources included in the first light source array 310 is equal to that of the light sources included in the second light source array 330, the light sources included in the first light source array 310 and the light sources included in the second light source array 330 may be disposed in an aligned state.

According to circumstances, the light sources included in the first light source array 310 and the light sources included in the second light source array 330 may be disposed in an unaligned state.

The light sources included in the first light source array 310 and the light sources included in the second light source array 330 may be disposed on the same plane. According to circumstances, the light sources included in the first light source array 310 and the light sources included in the second light source array 330 may be disposed on different planes.

For example, the light sources included in the first light source array 310 may be disposed at a higher area than the light sources included in the second light source array 330.

The light sources included in the first light source array 310 and the light sources included in the second light source array 330 may be disposed on different planes as described above to diversify light emission directions of the light sources 300, thereby realizing various beam patterns.

Luminous flux of the light source 300 located at the middle area of each light source array may be equal to that of the light sources 300 located at the edge areas of each light source array. According to circumstances, luminous flux of the light source 300 located at the middle area of each light source array may be different from that of the light sources 300 located at the edge areas of each light source array.

For example, luminous flux of the light source 300 located at the middle area of each light source array may be greater than that of the light sources 300 located at the edge areas of each light source array.

In this case, a beam pattern emitted to the outside may have higher brightness at the middle area thereof.

Also, the light sources 300 included in each light source array may be disposed so that the light sources 300 are spaced apart from each other by the same distance.

According to circumstances, the light sources 300 included in each light source array may be disposed so that the light sources 300 are spaced apart from each other by different distances.

For example, the distance between the light sources 300 included in each light source array may be gradually increased from the middle area to the edge areas of each light source array.

In this case, a beam pattern emitted to the outside may have higher brightness at the middle area thereof.

Also, the light sources 300 included in each light source array may be disposed on the same plane. According to circumstances, at least one of the light sources 300 included in each light source array may be disposed on a plane different from that on which the other light sources 300 are disposed.

The light sources 300 included in each light source array may have the same light emission direction. According to circumstances, at least one of the light sources 300 included in each light source array may have a light emission direction different from that of the other light sources 300.

The light sources 300 included in each light source array may have the same luminous flux. According to circumstances, at least one of the light sources 300 included in each light source array may have luminous flux different from that of the other light sources 300.

Also, the light sources 300 included in each light source array may generate the same color light. According to circumstances, at least one of the light sources 300 included in each light source array may generate color light different from that of the other light sources 300.

Meanwhile, the lamp may further include a barrier (not shown). The barrier may be disposed around the light sources 300.

The barrier may be provided to protect the light sources 300 and wires for electrical connection of the light sources 300. The barrier may be formed in various shapes based on the shape of the second substrate 200.

For example, the barrier may be formed in a polygonal or ring shape,

The barrier may include a metal reflective material. The barrier may reflect light generated from the light sources 300 to improve light extraction efficiency of the light sources 300.

The barrier may include at least one selected from among aluminum (Al), silver (Ag), platinum (Pt), rhodium (Rh), radium (Rd), palladium (Pd), and chrome (Cr).

The distance between the barrier and the light sources 300 and the height of the barrier may be adjusted to control an orientation angle of light emitted from the light sources 300.

Also, the lamp may further include a cover glass (not shown). The cover glass may be spaced apart from the light sources 300 by a predetermined distance.

The distance between the cover glass (not shown) and the light sources 300 may be about 0.1 mm to 50 mm.

The cover glass may protect the light sources 300 and transmit light generated from the light sources 300.

The cover glass may be anti-reflectively coated to improve transmittance of light generated from the light sources 300.

An anti-reflective coating film may be attached to a glass-based material, or an anti-reflective coating liquid may be applied to a glass-based material by spin coating or spray coating to form an anti-reflective coating layer.

For example, the anti-reflective coating layer may include at least one selected from among $TiO_2$, $SiO_2$, $Al_2O_3$, $Ta_2O_3$, $ZrO_2$, and $MgF_2$.

The cover glass may include a hole (not shown) or an opening (not shown). Heat generated from the light sources 300 may be discharged through the hole or the opening.

The cover glass may be formed in the shape of a dome having a hole or an opening. According to circumstances, the cover glass may include a color filter to transmit only a light component having a specific wavelength of light generated from the light sources 300.

In another case, the cover glass may include a specific pattern (not shown) to adjust an orientation angle of light generated from the light sources 300.

Kinds and shapes of the pattern are not limited.

The lamp may further include fluorescent layers (not shown). The fluorescent layers may be disposed on the light sources 300.

The fluorescent layers may be disposed so as to correspond to the respective the light sources 300.

Each of the fluorescent layers may include at least one selected from among a red fluorescent substance, yellow fluorescent substance, and green fluorescent substance.

In this embodiment with the above-stated construction, a plurality of light source arrays that can be individually driven may be disposed, thereby providing various light colors and luminous fluxes depending upon an external environment.

In this embodiment, a plurality of light source arrays may be efficiently disposed, thereby providing optimum luminous flux using a small number of light sources and reducing the total size of the lamp.

Also, in this embodiment, light source arrays having various light emission directions may be disposed, thereby providing various beam patterns depending upon an external environment.

FIGS. 2A and 2B are views showing light source arrays of a lamp according to an embodiment. FIG. 2A is a plan view showing a lamp having an odd number of light source arrays, and FIG. 2B is a plan view showing a lamp having an even number of light source arrays.

As shown in FIGS. 2A and 2B, the lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

An odd number of light source arrays or an even number of light source arrays may be provided.

For example, as shown in FIG. 2A, an odd number of light source arrays may be provided. First, second, and third light source arrays 310, 330, and 350 may be disposed in parallel to one another.

The first, second, and third light source arrays 310, 330, and 350 may be electrically isolated and individually driven.

Also, the light sources included in the first, second, and third light source arrays 310, 330, and 350 may be electrically isolated and individually driven.

According to circumstances, the light sources included in at least one of the first, second, and third light source arrays 310, 330, and 350 may be electrically connected and simultaneously driven, and the light sources included in the other light source arrays may be electrically connected and simultaneously driven.

For example, the light sources included in the first light source array 310 may be electrically connected and simultaneously driven, and the light sources included in the second and third light source arrays 330 and 350 may be electrically connected and simultaneously driven.

On the other hand, as shown in FIG. 2B, an even number of light source arrays may be provided. First, second, third, and fourth light source arrays 310, 330, 350, and 370 may be disposed in parallel to one another.

The neighboring first and second light source arrays 310 and 330 may be included in a first light source array group 300a, and the neighboring third and fourth light source arrays 350 and 370 may be included in a second light source array group 300b.

The first and second light source array groups 300a and 300b may be electrically isolated and individually driven.

Also, the first and second light source arrays 310 and 330 included in the first light source array group 300a and the third and fourth light source arrays 350 and 370 included in the second light source array group 300b may be electrically isolated and individually driven.

Further, the light sources included in the first, second, third, and fourth light source arrays 310, 330, 350, and 370 may be electrically isolated and individually driven.

According to circumstances, the light sources included in at least one of the first and second light source array groups 300a and 300b may be electrically connected and simultaneously driven, and the light sources included in the other light source array group may be electrically connected and simultaneously driven.

For example, the light sources included in the first light source array group 300a may be electrically connected and simultaneously driven, and the light sources included in the second light source array group 300*b* may be electrically connected and simultaneously driven.

In this embodiment, a plurality of light source arrays may be disposed, thereby providing various light colors and luminous fluxes depending upon an external environment and, in addition, providing various beam patterns depending upon an external environment.

FIG. 3 is a plan view showing electrical connection of light sources according to a first embodiment.

As shown in FIG. 3, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

The light sources 300 included in the first light source array 310 may be electrically connected to a first electrode pattern 411 disposed on the second substrate 200.

Also, the light sources 300 included in the first light source array 310 may be electrically connected to a second electrode pattern 413 disposed on the first substrate 100 via wires 400.

The light sources 300 included in the second light source array 330 may be electrically connected to a third electrode pattern 431 disposed on the second substrate 200.

Also, the light sources 300 included in the second light source array 330 may be electrically connected to a fourth electrode pattern 433 disposed on the first substrate 100 via wires 400.

Consequently, the neighboring first and second light source arrays 310 and 330 may be electrically isolated and individually driven.

The light sources 300 included in the first light source array 310 may be electrically connected and simultaneously driven, and the light sources 300 included in the second light source array 330 may be electrically connected and simultaneously driven.

In this embodiment, a plurality of light source arrays may be individually driven, thereby providing various luminous fluxes and beam patterns depending upon an external environment.

FIGS. 4A and 4B are plan views showing electrical connection of light sources according to a second embodiment.

As shown in FIGS. 4A and 4B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

FIG. 4A shows a first electrical connection type, and FIG. 4B shows a second electrical connection type.

In the first electrical connection type, as shown in FIG. 4A, the light sources 300 included in the first light source array 310 may be electrically connected to a first electrode pattern 411 disposed on the second substrate 200.

Also, the light sources 300 included in the first light source array 310 may be electrically connected to a plurality of second electrode patterns 413 disposed on the first substrate 100 via wires 400.

The light sources 300 included in the second light source array 330 may be electrically connected to a third electrode pattern 431 disposed on the second substrate 200.

Also, the light sources 300 included in the second light source array 330 may be electrically connected to a plurality of fourth electrode patterns 433 disposed on the first substrate 100 via wires 400.

Consequently, the neighboring first and second light source arrays 310 and 330 may be electrically isolated and individually driven.

The light sources 300 included in the first light source array 310 may be electrically isolated and individually driven, and the light sources 300 included in the second light source array 330 may be electrically isolated and individually driven.

In the second electrical connection type, as shown in FIG. 4B, the light sources 300 included in the first light source array 310 may be electrically connected to a plurality of first electrode patterns 411 disposed on the second substrate 200.

Also, the light sources 300 included in the first light source array 310 may be electrically connected to a second electrode pattern 413 disposed on the first substrate 100 via wires 400.

The light sources 300 included in the second light source array 330 may be electrically connected to a plurality of third electrode patterns 431 disposed on the second substrate 200.

Also, the light sources 300 included in the second light source array 330 may be electrically connected to a fourth electrode pattern 433 disposed on the first substrate 100 via wires 400.

Consequently, the neighboring first and second light source arrays 310 and 330 may be electrically isolated and individually driven.

The light sources 300 included in the first light source array 310 may be electrically isolated and individually driven, and the light sources 300 included in the second light source array 330 may be electrically isolated and individually driven.

In this embodiment, a plurality of light source arrays may be individually driven, and a plurality of light sources may be individually driven, thereby providing various luminous fluxes and beam patterns depending upon an external environment.

FIGS. 5A and 5B are plan views showing electrical connection of light sources according to a third embodiment.

As shown in FIGS. 5A and 5B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

FIG. 5A shows a first electrical connection type, and FIG. 5B shows a second electrical connection type.

In the first electrical connection type, as shown in FIG. 5A, the light sources 300 included in the first light source array 310 may be electrically connected to a first electrode pattern 411 disposed on the second substrate 200.

Also, the light sources 300 included in the first light source array 310 may be electrically connected to a plurality of second electrode patterns 413 disposed on the first substrate 100 via wires 400.

The light sources 300 included in the second light source array 330 may be electrically connected to a third electrode pattern 431 disposed on the second substrate 200.

Also, the light sources 300 included in the second light source array 330 may be electrically connected to a fourth electrode pattern 433 disposed on the first substrate 100 via wires 400.

Consequently, the neighboring first and second light source arrays 310 and 330 may be electrically isolated and individually driven.

The light sources 300 included in the first light source array 310 may be electrically isolated and individually driven, and the light sources 300 included in the second light source array 330 may be electrically connected and simultaneously driven.

In the second electrical connection type, as shown in FIG. 5B, the light sources 300 included in the first light source array 310 may be electrically connected to a plurality of first electrode patterns 411 disposed on the second substrate 200.

Also, the light sources 300 included in the first light source array 310 may be electrically connected to a second electrode pattern 413 disposed on the first substrate 100 via wires 400.

The light sources 300 included in the second light source array 330 may be electrically connected to a third electrode pattern 431 disposed on the second substrate 200.

Also, the light sources 300 included in the second light source array 330 may be electrically connected to a fourth electrode pattern 433 disposed on the first substrate 100 via wires 400.

Consequently, the neighboring first and second light source arrays 310 and 330 may be electrically isolated and individually driven.

The light sources 300 included in the first light source array 310 may be electrically isolated and individually driven, and the light sources 300 included in the second light source array 330 may be electrically connected and simultaneously driven.

In this embodiment, a method of driving light sources included in one light source array may be different from that of driving light sources included in the other light source array.

That is, light sources included in one light source array may be simultaneously driven, and light sources included in the other light source array may be individually driven, thereby providing various luminous fluxes and beam patterns depending upon an external environment.

FIGS. 6A and 6B are plan views showing electrical connection of light sources according to a fourth embodiment.

As shown in FIGS. 6A and 6B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

FIG. 6A shows a first electrical connection type, and FIG. 6B shows a second electrical connection type.

In the first electrical connection type, as shown in FIG. 6A, the light sources 300 included in the first light source array 310 may be electrically connected to a first electrode pattern 411 disposed on the second substrate 200.

Also, the light sources 300 included in the first light source array 310 may be electrically connected to a second electrode pattern 413 disposed on the first substrate 100 via wires 400.

The light sources 300 included in the second light source array 330 may be electrically connected to a third electrode pattern 431 disposed on the second substrate 200.

Also, the light sources 300 included in the second light source array 330 may be electrically connected to a plurality of fourth electrode patterns 433 disposed on the first substrate 100 via wires 400.

Consequently, the neighboring first and second light source arrays 310 and 330 may be electrically isolated and individually driven.

The light sources 300 included in the first light source array 310 may be electrically connected and simultaneously driven, and the light sources 300 included in the second light source array 330 may be electrically isolated and individually driven.

In the second electrical connection type, as shown in FIG. 6B, the light sources 300 included in the first light source array 310 may be electrically connected to a first electrode pattern 411 disposed on the second substrate 200.

Also, the light sources 300 included in the first light source array 310 may be electrically connected to a second electrode pattern 413 disposed on the first substrate 100 via wires 400.

The light sources 300 included in the second light source array 330 may be electrically connected to a plurality of third electrode patterns 431 disposed on the second substrate 200.

Also, the light sources 300 included in the second light source array 330 may be electrically connected to a fourth electrode pattern 433 disposed on the first substrate 100 via wires 400.

Consequently, the neighboring first and second light source arrays 310 and 330 may be electrically isolated and individually driven.

The light sources 300 included in the first light source array 310 may be electrically connected and simultaneously driven, and the light sources 300 included in the second light source array 330 may be electrically isolated and individually driven.

In this embodiment, a method of driving light sources included in one light source array may be different from that of driving light sources included in the other light source array.

That is, light sources included in one light source array may be simultaneously driven, and light sources included in the other light source array may be individually driven, thereby providing various luminous fluxes and beam patterns depending upon an external environment.

FIGS. 7A to 7C are plan views showing the number of light sources included in light source arrays.

As shown in FIGS. 7A to 7C, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

The number of light sources 310-1 included in the first light source array 310 may be equal to that of light sources 330-1 included in the second light source array 330. According to circumstances, the number of the light sources 310-1 included in the first light source array 310 may be different from that of the light sources 330-1 included in the second light source array 330.

For example, as shown in FIG. 7A, the number of the light sources 310-1 included in the first light source array 310 may be greater than that of the light sources 330-1 included in the second light source array 330.

On the other hand, as shown in FIG. 7B, the number of the light sources 310-1 included in the first light source array 310 may be less than that of the light sources 330-1 included in the second light source array 330.

Alternatively, as shown in FIG. 7C, the number of the light sources 310-1 included in the first light source array 310 may be equal to that of the light sources 330-1 included in the second light source array 330.

In this embodiment, the number of light sources included in one light source array may be different from that of light sources included in the other light source array, thereby providing various luminous fluxes and beam patterns depending upon an external environment.

FIGS. 8A to 8C are plan views showing luminous fluxes of light sources included in light source arrays. FIG. 8A is a plan view showing the arrangement of light source arrays, and FIGS. 8B and 8C are sectional views taken along line II-II of FIG. 8A.

As shown in FIGS. 8A to 8C, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Luminous flux of light sources 310-1 included in the first light source array 310 may be equal to that of light sources 330-1 included in the second light source array 330. According to circumstances, luminous flux of the light sources 310-1 included in the first light source array 310 may be different from that of the light sources 330-1 included in the second light source array 330.

For example, as shown in FIG. 8B, luminous flux of the light sources 310-1 included in the first light source array 310 may be greater than that of the light sources 330-1 included in the second light source array 330.

On the other hand, as shown in FIG. 8C, luminous flux of the light sources 310-1 included in the first light source array 310 may be less than that of the light sources 330-1 included in the second light source array 330.

In this embodiment, luminous flux of light sources included in one light source array may be different from that of light sources included in the other light source array, thereby providing various luminous fluxes and beam patterns depending upon an external environment.

FIGS. 9A to 9C are plan views showing distances between light sources included in light source arrays.

As shown in FIGS. 9A to 9C, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

A distance d1 between light sources 310-1 included in the first light source array 310 may be equal to a distance d2 between light sources 330-1 included in the second light source array 330. According to circumstances, the distance d1 between the light sources 310-1 included in the first light source array 310 may be different from the distance d2 between the light sources 330-1 included in the second light source array 330.

For example, as shown in FIG. 9A, the distance d1 between the light sources 310-1 included in the first light source array 310 may be less than the distance d2 between the light sources 330-1 included in the second light source array 330.

On the other hand, as shown in FIG. 9B, the distance d1 between the light sources 310-1 included in the first light source array 310 may be greater than the distance d2 between the light sources 330-1 included in the second light source array 330.

Alternatively, as shown in FIG. 9C, the distance d1 between the light sources 310-1 included in the first light source array 310 may be equal to the distance d2 between the light sources 330-1 included in the second light source array 330.

In this embodiment, the distance between light sources included in one light source array may be different from that between light sources included in the other light source array, thereby providing various luminous fluxes and beam patterns depending upon an external environment.

FIGS. 10A and 10B are plan views showing distances between light source arrays and distances between light sources As shown in FIGS. 10A and 10B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Light sources 310-1 included in the first light source array 310 may be spaced apart from each other by a distance d11, light sources 330-1 included in the second light source array 330 may be spaced apart from each other by a distance d12, and the light sources 310-1 included in the first light source array 310 may be spaced apart from the light sources 330-1 included in the second light source array 330 by a distance d13.

The distance d11 between the light sources 310-1 included in the first light source array 310 may be equal to the distance d12 between the light sources 330-1 included in the second light source array 330.

Also, the distance d11 between the light sources 310-1 included in the first light source array 310 and the distance d12 between the light sources 330-1 included in the second light source array 330 may be equal to the distance d13 between the light sources 310-1 included in the first light source array 310 and the light sources 330-1 included in the second light source array 330. According to circumstances, the distance d11 and the distance d12 may be different from the distance d13.

For example, as shown in FIG. 10A, the distance d11 between the light sources 310-1 included in the first light source array 310 may be equal to the distance d12 between the light sources 330-1 included in the second light source array 330, and the distance d13 between the light sources 310-1 included in the first light source array 310 and the light sources 330-1 included in the second light source array 330 may be greater than the distance d11 and the distance d12.

A ratio of the distance d13 to the distance d11 or the distance d12 may be about 1.1:1 to 10:1.

On the other hand, as shown in FIG. 10B, the distance d11 between the light sources 310-1 included in the first light source array 310 may be equal to the distance d12 between the light sources 330-1 included in the second light source array 330, and the distance d13 between the light sources 310-1 included in the first light source array 310 and the light sources 330-1 included in the second light source array 330 may be equal to the distance d11 and the distance d12.

The distance d11, the distance d12, and the distance d13 may be 10 mm or more. For example, the distance d11, the distance d12, and the distance d13 may be 40 to 80 mm.

In this embodiment, the distance between light source arrays may be different from that between light sources, thereby providing various luminous fluxes and beam patterns depending upon an external environment.

FIGS. 11A and 11B are plan views showing the arrangement of light sources according to a first embodiment.

As shown in FIGS. 11A and 11B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Light sources 310-1 included in the first light source array 310 and light sources 330-1 included in the second light source array 330 may be disposed on the same plane in parallel.

According to circumstances, the light sources 310-1 included in the first light source array 310 and the light sources 330-1 included in the second light source array 330 may be disposed on different planes in parallel.

In a case in which the number of the light sources 310-1 included in the first light source array 310 is equal to that of the light sources 330-1 included in the second light source array 330, as shown in FIG. 11A, the light sources 310-1 included in the first light source array 310 and the light sources 330-1 included in the second light source array 330 may be disposed on the same plane in an aligned state.

Also, in a case in which the number of the light sources 310-1 included in the first light source array 310 is different from that of the light sources 330-1 included in the second light source array 330, as shown in FIG. 11B, the light sources 310-1 included in the first light source array 310 and the light sources 330-1 included in the second light source array 330 may be disposed on the same plane in an aligned state.

In this embodiment, light sources included in one light source array may be disposed in parallel to light sources included in the other light source array, thereby providing various luminous fluxes and beam patterns depending upon an external environment.

FIGS. 12A and 12B are plan views showing the arrangement of light sources according to a second embodiment.

As shown in FIGS. 12A and 12B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Light sources 310-1 included in the first light source array 310 and light sources 330-1 included in the second light source array 330 may be disposed on the same plane in an unaligned state.

According to circumstances, the light sources 310-1 included in the first light source array 310 and the light sources 330-1 included in the second light source array 330 may be disposed on different planes in an unaligned state.

In a case in which the number of the light sources 310-1 included in the first light source array 310 is equal to that of the light sources 330-1 included in the second light source array 330, as shown in FIG. 12A, the light sources 310-1 included in the first light source array 310 and the light sources 330-1 included in the second light source array 330 may be disposed on the same plane in an unaligned state.

Also, in a case in which the number of the light sources 310-1 included in the first light source array 310 is different from that of the light sources 330-1 included in the second light source array 330, as shown in FIG. 12B, the light sources 310-1 included in the first light source array 310 and the light sources 330-1 included in the second light source array 330 may be disposed on the same plane in an unaligned state.

In this embodiment, light sources included in one light source array may be unaligned with light sources included in the other light source array, thereby providing various luminous fluxes and beam patterns depending upon an external environment.

FIGS. 13A and 13B are views showing the arrangement of light sources according to a third embodiment. FIG. 13A is a plan view showing the arrangement of light source arrays, and FIG. 13B is a sectional view taken along line of FIG. 13A.

As shown in FIGS. 13A and 13B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Light sources 310-1 included in the first light source array 310 may be disposed on a first upper surface 210 of the second substrate 200, and light sources 330-1 included in the second light source array 330 may be disposed on a second upper surface 220 of the second substrate 200.

The first upper surface 210 of the second substrate 200 may be higher than the second upper surface 220 of the second substrate 200. A side surface 230 between the first upper surface 210 of the second substrate 200 and the second upper surface 220 of the second substrate 200 may be perpendicular to the first upper surface 210 of the second substrate 200 or the second upper surface 220 of the second substrate 200.

That is, the angle between the side surface 230 of the second substrate 200 and the second upper surface 220 of the second substrate 200 may be a right angle.

Consequently, the light sources 310-1 included in the first light source array 310 and the light sources 330-1 included in the second light source array 330 may be disposed on different planes.

This is because that the first upper surface 210 of the second substrate 200 is higher than the second upper surface 220 of the second substrate 200.

For example, the light sources 310-1 included in the first light source array 310 may be disposed on a higher area than the light sources 330-1 included in the second light source array 330.

The light sources 310-1 included in the first light source array 310 and the light sources 330-1 included in the second light source array 330 may be disposed on different planes as described above to diversify light emission directions of the light sources 300, thereby realizing various beam patterns.

FIGS. 14A to 14C are sectional views showing the arrangement of the light sources of FIG. 13B.

As shown in FIGS. 14A to 14C, the light sources 310-1 included in the first light source array 310 may be disposed on the first upper surface of the second substrate 200, and the light sources 330-1 included in the second light source array 330 may be disposed on the second upper surface of the second substrate 200.

The light sources 310-1 included in the first light source array 310 and the light sources 330-1 included in the second light source array 330 may be disposed on different planes.

This is because that the first upper surface of the second substrate 200 is higher than the second upper surface of the second substrate 200.

Consequently, the light sources 310-1 included in the first light source array 310 may be disposed on a higher area than the light sources 330-1 included in the second light source array 330.

As shown in FIG. 14A, a distance d31 between a first parallel line H1 extending from an upper surface 310-1a of each light source 310-1 included in the first light source array 310 and a second parallel line H2 extending from an upper surface 330-1a of each light source 330-1 included in the second light source array 330 may be less than a distance d32 between the upper surface 310-1a and a lower surface 310-1b of each light source 310-1 included in the first light source array 310 or between the upper surface 330-1a and a lower surface 330-1b of each light source 330-1 included in the second light source array 330.

According to circumstances, as shown in FIG. 14B, the distance d31 between the first parallel line H1 extending from the upper surface 310-1a of each light source 310-1 included in the first light source array 310 and the second parallel line H2 extending from the upper surface 330-1a of each light source 330-1 included in the second light source array 330 may be equal to the distance d32 between the upper surface 310-1a and the lower surface 310-1b of each light source 310-1 included in the first light source array 310 or between the upper surface 330-1a and the lower surface 330-1b of each light source 330-1 included in the second light source array 330.

In another case, as shown in FIG. 14C, the distance d31 between the first parallel line H1 extending from the upper surface 310-1a of each light source 310-1 included in the first light source array 310 and the second parallel line H2 extending from the upper surface 330-1a of each light source 330-1 included in the second light source array 330 may be greater than the distance d32 between the upper surface 310-1a and the lower surface 310-1b of each light source 310-1 included in the first light source array 310 or between the upper surface 330-1a and the lower surface 330-1b of each light source 330-1 included in the second light source array 330.

The light sources 310-1 included in the first light source array 310 and the light sources 330-1 included in the second light source array 330 may be disposed on different planes as described above to diversify light emission directions of the light sources 300, thereby realizing various beam patterns.

FIGS. 15A to 15D are sectional views showing light emission directions of the light sources of FIG. 13B.

As shown in FIGS. 15A to 15D, the light sources 310-1 included in the first light source array 310 may be disposed on the first upper surface of the second substrate 200, and the light sources 330-1 included in the second light source array 330 may be disposed on the second upper surface of the second substrate 200.

The light sources 310-1 included in the first light source array 310 and the light sources 330-1 included in the second light source array 330 may be disposed on different planes.

This is because that the first upper surface of the second substrate 200 is higher than the second upper surface of the second substrate 200.

Consequently, the light sources 310-1 included in the first light source array 310 may be disposed on a higher area than the light sources 330-1 included in the second light source array 330.

A light emission direction of the light sources 310-1 included in the first light source array 310 may be equal to that of the light sources 330-1 included in the second light source array 330. According to circumstances, the light emission direction of the light sources 310-1 included in the first light source array 310 may be different from that of the light sources 330-1 included in the second light source array 330.

As shown in FIG. 15A, the light sources 310-1 included in the first light source array 310 may emit light in a first direction, and the light sources 330-1 included in the second light source array 330 may emit light in a second direction perpendicular to the first direction.

Also, as shown in FIG. 15B, the light sources 310-1 included in the first light source array 310 may emit light in the second direction, and the light sources 330-1 included in the second light source array 330 may emit light in the first direction.

Also, as shown in FIG. 15C, the light sources 310-1 included in the first light source array 310 may emit light in the first direction, and the light sources 330-1 included in the second light source array 330 may emit light in a third direction opposite to the second direction.

Also, as shown in FIG. 15D, the light sources 310-1 included in the first light source array 310 may emit light in the second direction, and the light sources 330-1 included in the second light source array 330 may emit light in the third direction opposite to the second direction.

In this embodiment, light emission directions of the light sources 300 may be diversified, thereby realizing various beam patterns.

FIGS. 16A and 16B are views showing the arrangement of light sources according to a fourth embodiment. FIG. 16A is a plan view showing the arrangement of light source arrays, and FIG. 16B is a sectional view taken along line IV-IV of FIG. 16A.

As shown in FIGS. 16A and 16B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Light sources 310-1 included in the first light source array 310 may be disposed on a first upper surface 210 of the second substrate 200, and light sources 330-1 included in the second light source array 330 may be disposed on a second upper surface 220 of the second substrate 200.

The first upper surface 210 of the second substrate 200 may be higher than the second upper surface 220 of the second substrate 200. A side surface 230 between the first upper surface 210 of the second substrate 200 and the second upper surface 220 of the second substrate 200 may be at a predetermined angle to the first upper surface 210 of the second substrate 200 or the second upper surface 220 of the second substrate 200.

That is, the angle between the side surface 230 of the second substrate 200 and the second upper surface 220 of the second substrate 200 may be an obtuse angle.

Consequently, the light sources 310-1 included in the first light source array 310 and the light sources 330-1 included in the second light source array 330 may be disposed on different planes.

This is because that the first upper surface 210 of the second substrate 200 is higher than the second upper surface 220 of the second substrate 200.

For example, the light sources 310-1 included in the first light source array 310 may be disposed on a higher area than the light sources 330-1 included in the second light source array 330.

The light sources 310-1 included in the first light source array 310 and the light sources 330-1 included in the second light source array 330 may be disposed on different planes as described above to diversify light emission directions of the light sources 300, thereby realizing various beam patterns.

FIGS. 17A and 17B are views showing the arrangement of light sources according to a fifth embodiment. FIG. 17A is a plan view showing the arrangement of light source arrays, and FIG. 17B is a sectional view taken along line V-V of FIG. 17A.

As shown in FIGS. 17A and 17B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

The second substrate 200 may include a first upper surface 210, a second upper surface 220, and a side surface 230 between the first upper surface 210 and the second upper surface 220.

The first upper surface 210 of the second substrate 200 may be higher than the second upper surface 220 of the second substrate 200. The side surface 230 between the first upper surface 210 of the second substrate 200 and the second upper surface 220 of the second substrate 200 may be at a predetermined angle to the first upper surface 210 of the second substrate 200 or the second upper surface 220 of the second substrate 200.

That is, the angle between the side surface 230 of the second substrate 200 and the second upper surface 220 of the second substrate 200 may be an obtuse angle.

For example, the first light source array 310 may be supported by a first area of the second substrate 200, the second light source array 330 may be supported by a second area of the second substrate 200, and the angle between the surface of the first area of the second substrate 200 facing the first light source array 310 and the surface of the second area of the second substrate 200 facing the second light source array 330 may be about 91 to 179 degrees.

Light sources 330-1 included in the second light source array 330 may be disposed on the second upper surface 220 of the second substrate 200, light sources 310-1 included in the first light source array 310 may be disposed on the side surface 230 of the second substrate 200, and no light sources may be disposed on the first upper surface 210 of the second substrate 200.

Consequently, the light sources 310-1 included in the first light source array 310 and the light sources 330-1 included in the second light source array 330 may be disposed on different planes.

For example, the light sources 310-1 included in the first light source array 310 may be disposed on a higher area than the light sources 330-1 included in the second light source array 330.

The light sources 310-1 included in the first light source array 310 and the light sources 330-1 included in the second light source array 330 may be disposed on different planes as described above to diversify light emission directions of the light sources 300, thereby realizing various beam patterns.

FIGS. 18A and 18B are sectional views showing the arrangement of the light sources of FIG. 17B.

As shown in FIGS. 18A and 18B, the second substrate 200 may include a first upper surface 210, a second upper surface 220, and a side surface 230 between the first upper surface 210 and the second upper surface 220.

The first upper surface 210 of the second substrate 200 may be higher than the second upper surface 220 of the second substrate 200. The side surface 230 between the first upper surface 210 of the second substrate 200 and the second upper surface 220 of the second substrate 200 may be at a predetermined angle to the first upper surface 210 of the second substrate 200 or the second upper surface 220 of the second substrate 200.

That is, the angle between the side surface 230 of the second substrate 200 and the second upper surface 220 of the second substrate 200 may be an obtuse angle.

Light sources 330-1 included in the second light source array 330 may be disposed on the second upper surface 220 of the second substrate 200, light sources 310-1 included in the first light source array 310 may be disposed on the side surface 230 of the second substrate 200, and no light sources may be disposed on the first upper surface 210 of the second substrate 200.

As shown in FIG. 18A, a parallel line H3 extending from an upper surface 330-1a of each light source 330-1 included in the second light source array 330 may reach a side surface 310-1b of each light source 310-1 included in the first light source array 310.

According to circumstances, as shown in FIG. 18B, the parallel line H3 extending from the upper surface 330-1a of each light source 330-1 included in the second light source array 330 may reach an upper surface 310-1a of each light source 310-1 included in the first light source array 310.

Consequently, the light sources 310-1 included in the first light source array 310 and the light sources 330-1 included in the second light source array 330 may be disposed on different planes.

For example, the light sources 310-1 included in the first light source array 310 may be disposed on a higher area than the light sources 330-1 included in the second light source array 330.

The light sources 310-1 included in the first light source array 310 and the light sources 330-1 included in the second light source array 330 may be disposed on different planes as described above to diversify light emission directions of the light sources 300, thereby realizing various beam patterns.

FIGS. 19A to 19C are sectional views showing light emission directions of the light sources of FIG. 17B.

As shown in FIGS. 19A to 19C, the second substrate 200 may include a first upper surface 210, a second upper surface 220, and a side surface 230 between the first upper surface 210 and the second upper surface 220.

The first upper surface 210 of the second substrate 200 may be higher than the second upper surface 220 of the second substrate 200. The side surface 230 between the first upper surface 210 of the second substrate 200 and the second upper surface 220 of the second substrate 200 may be at a predetermined angle to the first upper surface 210 of the second substrate 200 or the second upper surface 220 of the second substrate 200.

That is, the angle between the side surface 230 of the second substrate 200 and the second upper surface 220 of the second substrate 200 may be an obtuse angle.

Light sources 330-1 included in the second light source array 330 may be disposed on the second upper surface 220 of the second substrate 200, light sources 310-1 included in the first light source array 310 may be disposed on the side surface 230 of the second substrate 200, and no light sources may be disposed on the first upper surface 210 of the second substrate 200.

As shown in FIG. 19A, the light sources 330-1 included in the second light source array 330 may emit light in a first direction, and the light sources 310-1 included in the first light source array 310 may emit light in a third direction which is at a predetermined angle to the first direction.

The reason that the light sources 310-1 included in the first light source array 310 emit light in the third direction is that the light sources 310-1 included in the first light source array 310 are disposed on the inclined side surface of the second substrate 200.

Also, as shown in FIG. 19B, the light sources 330-1 included in the second light source array 330 may emit light in the first direction, and the light sources 310-1 included in the first light source array 310 may emit light in a fourth direction which is at a predetermined angle to the first direction.

Also, as shown in FIG. 19C, the light sources 330-1 included in the second light source array 330 may emit light in a second direction perpendicular to the first direction, and the light sources 310-1 included in the first light source array 310 may emit light in the fourth direction.

In this embodiment, light emission directions of the light sources may be diversified, thereby realizing various beam patterns.

FIGS. 20A and 20B are views showing the arrangement of light sources according to a sixth embodiment. FIG. 20A is a plan view showing the arrangement of light source arrays, and FIG. 20B is a sectional view taken along line VI-VI of FIG. 20A.

As shown in FIGS. 20A and 20B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include first, second, and third light source arrays 310, 330, and 350.

The second substrate 200 may include a first upper surface 210, a second upper surface 220, and a side surface 230 between the first upper surface 210 and the second upper surface 220.

The first upper surface 210 of the second substrate 200 may be higher than the second upper surface 220 of the second substrate 200. The side surface 230 between the first upper surface 210 of the second substrate 200 and the second upper surface 220 of the second substrate 200 may be at a predetermined angle to the first upper surface 210 of the second substrate 200 or the second upper surface 220 of the second substrate 200.

That is, the angle between the side surface 230 of the second substrate 200 and the second upper surface 220 of the second substrate 200 may be an obtuse angle.

Light sources 350-1 included in the third light source array 350 may be disposed on the first upper surface 210 of the second substrate 200, light sources 310-1 included in the first light source array 310 may be disposed on the side surface 230 of the second substrate 200, and light sources 330-1 included in the second light source array 330 may be disposed on the second upper surface 220 of the second substrate 200.

Consequently, the light sources 310-1 included in the first light source array 310, the light sources 330-1 included in the second light source array 330, and the light sources 350-1 included in the third light source array 350 may be disposed on different planes.

For example, the light sources 310-1 included in the first light source array 310 may be disposed on a higher area than the light sources 330-1 included in the second light source array 330, and the light sources 350-1 included in the third light source array 350 may be disposed on a higher area than the light sources 310-1 included in the first light source array 310 and the light sources 330-1 included in the second light source array 330.

The light sources 310-1 included in the first light source array 310, the light sources 330-1 included in the second light source array 330, and the light sources 350-1 included in the third light source array 350 may be disposed on different planes as described above to diversify light emission directions of the light sources 300, thereby realizing various beam patterns.

FIGS. 21A to 21C are views showing the structure of a light source according to an embodiment. FIG. 21A is a plan view showing the arrangement of light source arrays. FIG. 21B is a sectional view showing the structure of a top view type light source, and FIG. 21C is a sectional view showing the structure of a side view type light source.

As shown in FIG. 21A, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Light sources 310-1 included in the first light source array 310 and light sources 330-1 included in the second light source array 330 may be top view type light emitting diodes. According to circumstances, the light sources 300 may be side view type light emitting diodes.

In another case, the light sources 300 may include top view type light emitting diodes and side view type light emitting diodes, which may be disposed in a mixed state.

For example, each light source 310-1 included in the first light source array 310 may be a top view type light emitting diode including a first electrode disposed on a light emitting structure, a second electrode disposed under the light emitting structure, and a reflective layer disposed between the second electrode and the light emitting structure.

On the other hand, each light source 330-1 included in the second light source array 330 may be a side view type light emitting diode including a first electrode and a second electrode disposed on a light emitting structure and a transparent substrate disposed under the light emitting structure.

As shown in FIG. 21B, a top view type light source may include a support substrate 70 and a coupling layer 75, reflective layer 60, ohmic layer 50, and light emitting structure 20 disposed on the support substrate 70.

The support substrate 70 may be a conductive substrate. The support substrate 70 may be formed of a material exhibiting high electric conductivity and heat conductivity.

The coupling layer 75 may include a barrier metal or a bonding metal. For example, the coupling layer 75 may include at least one selected from among Ti, Au, Sn, Ni, Cr, Ga, In, Bi, Cu, Ag, and Ta. However, embodiments are not limited thereto.

For example, the reflective layer 60 may be formed of one selected from among Ag, Ni, Al, Rh, Pd, Ir, Ru, Mg, Zn, Pt, Au, Hf, and a combination thereof. Alternatively, the reflective layer 60 may be formed to have a multiple layer including a metal material and a light transmissive and conductive material.

For example, the reflective layer 60 may be formed to have a multiple structure including IZO/Ni, AZO/Ag, IZO/Ag/Ni, or AZO/Ag/Ni.

In a case in which the reflective layer 60 is formed of a material ohmically contacting the light emitting structure, the ohmic layer 50 may be omitted. However, embodiments are not limited thereto.

The reflective layer 60 may effectively reflect light generated from an active layer 24 of the light emitting structure 20, thereby greatly improving light extraction efficiency of the light source.

A light transmissive and conductive material and a metal material may be selectively used to form the ohmic layer 50.

For example, the ohmic layer 50 may be formed of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf. However, embodiments are not limited thereto.

The light emitting structure 20 may include a first conductive semiconductor layer 22, active layer 24, and second conductive semiconductor layer 26.

The first conductive semiconductor layer 22 may be formed of a semiconductor compound, such as a Group III-V or II-VI compound semiconductor.

In a case in which the first conductive semiconductor layer 22 is an n type semiconductor layer, a first conductive dopant may be an n type dopant, such as Si, Ge, Sn, Se, or Te. However, embodiments are not limited thereto.

The active layer 24 is a layer in which electrons injected through the first conductive semiconductor layer 22 encounter holes injected through the second conductive semiconductor layer 26 are to emit light.

The active layer 24 may be configured to have at least one selected from among a single well structure, a multiple well structure, quantum wire structure, and quantum dot structure.

For example, the active layer 24 may be configured to have a multiple quantum well structure formed by injecting trimethylgallium (TMGa), ammonia ($NH_3$), nitrogen (N2), and trimethylindium (TMIn).

Also, a well layer/barrier layer of the active layer 24 may be formed of at least one selected from among InGaN/GaN, InGaN/InGaN, GaN/AlGaN, InAlGaN/GaN, GaAs(InGaAs)/AlGaAs, and GaP(InGaP)/AlGaP. However, embodiments are not limited thereto.

A conductive clad layer (not shown) may be formed on and/or under the active layer 24. The conductive clad layer may be formed of a semiconductor having a greater band gap than the barrier layer of the active layer 24.

For example, the conductive clad layer may include GaN, AlGaN, InAlGaN or a superlattice structure. The conductive clad layer may be n-type or p-type doped.

The second conductive semiconductor layer 26 may be formed of a semiconductor compound, such as a Group III-V compound semiconductor doped with a second conductive dopant.

The second conductive semiconductor layer 26 may be formed of a semiconductor material having a formula of, for example, $In_xAl_yGa_{1-x-y}N$ ($0 \leq x \leq 1$, $0 \leq y \leq 1$, $0 \leq x+y \leq 1$).

In a case in which the second conductive semiconductor layer 26 is a p type semiconductor layer, a second conductive dopant may be a p type dopant, such as Mg, Zn, Ca, Sr, or Ba. However, embodiments are not limited thereto.

The first conductive semiconductor layer 22 may include a p type semiconductor layer, and the second conductive semiconductor layer 26 may include an n type semiconductor layer.

Also, a third conductive semiconductor layer (not shown) including an n type or p type semiconductor layer may be formed on the first conductive semiconductor layer 22. In this embodiment, therefore, the light source may include at least one selected from among n-p, p-n, n-p-n, and p-n-p junction structures.

An uneven pattern may be formed at the surface of the first conductive semiconductor layer 22.

The uneven pattern may be provided to improve external extraction efficiency of light generated from the active layer 24. The uneven pattern may have a regular cycle or an irregular cycle.

Also, a passivation layer 80 may be formed at a side surface of the light emitting structure 20 and at least a portion of the first conductive semiconductor layer 22.

The passivation layer 80 may be formed of an insulative material, such as a nonconductive oxide or nitride, to protect the light emitting structure 20.

As an example, the passivation layer 80 may be formed of a silicon oxide ($SiO_2$) layer, oxide-nitride layer, or aluminum oxide layer.

On the other hand, as shown in FIG. 21C, a top view type light source may include a light emitting structure 20, including a first conductive semiconductor layer 22, active layer 24, and second conductive semiconductor layer 26, disposed on a substrate 10.

The light emitting structure 20 may be formed using, for example, metal organic chemical vapor deposition (MOCVD), chemical vapor deposition (CVD), plasma-enhanced chemical vapor deposition (PECVD), molecular beam epitaxy (MBE), or hydride vapor phase epitaxy (HVPE). However, embodiments are not limited thereto.

The substrate 10 may be formed of a material proper to grow a semiconductor material or a carrier wafer.

Also, the substrate 10 may be formed of a material exhibiting high heat conductivity. The substrate 10 may be a conductive substrate or an insulative substrate.

A buffer layer (not shown) may be grown between the light emitting structure 20 and the substrate 10 to reduce lattice mismatch of materials and the difference between coefficients of thermal expansion.

The buffer layer may be formed of a Group III-V compound semiconductor. For example, the buffer layer may be formed of at least one selected from among GaN, InN, AlN, InGaN, AlGaN, InAlGaN, and AlInN.

An undoped semiconductor layer may be formed on the buffer layer. However, embodiments are not limited thereto.

A portion of the first conductive semiconductor layer of the light emitting structure 20 may be mesa-etched, a first electrode 30 may be disposed on an opening surface formed by mesa-etching, and a second electrode 40 may be disposed on the second conductive semiconductor layer 26.

The first electrode 30 and the second electrode 40 may be formed to have a single layer or multiple layer structure including at least one selected from among aluminum (Al), titanium (Ti), chrome (Cr), nickel (Ni), copper (Cu), and gold (Au).

In this embodiment, light sources having different light emitting structures may be variously disposed in the first light source array 310 and the second light source array 330, thereby realizing various beam patterns.

FIGS. 22A and 22B are plan views showing the arrangement of light colors of light source arrays according to an embodiment.

As shown in FIGS. 22A and 22B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

For example, as shown in FIG. 22A, an odd number of light source arrays may be provided. First, second, and third light source arrays 310, 330, and 350 may be disposed on the second substrate 200 in parallel to one another.

The light sources included in the first light source array 310 may emit a first color light, the light sources included in the second light source array 330 may emit a second color light, and the light sources included in the third light source array 350 may emit a third color light.

For example, the light sources included in the first light source array 310 may emit a red color light, the light sources included in the second light source array 330 may emit a white color light, and the light sources included in the third light source array 350 may emit a yellow color light.

Also, as shown in FIG. 22B, an odd number of light source arrays may be provided. First, second, and third light source arrays 310, 330, and 350 may be disposed on the second substrate 200 in parallel to one another.

The light sources included in the first light source array 310 may emit a plurality of color lights, the light sources included in the second light source array 330 may emit a plurality of color lights, and the light sources included in the third light source array 350 may emit a plurality of color lights.

In this case, neighboring ones of the light sources included in the first light source array 310 may emit different color lights, and neighboring ones of the light sources included in the second light source array 330 may emit different color lights.

According to circumstances, the light sources included in the first light source array 310 may emit the same color lights as corresponding light sources included in the second light source array 330.

In another case, the light sources included in the first light source array 310 may emit color lights different from those emitted from corresponding light sources included in the second light source array 330.

As described above, the light sources included in the light source arrays may generate the same color lights, and, according to circumstances, at least one of the light sources included in the light source arrays may generate color light different from those generated from the other light sources.

In this embodiment, light sources to generate various color lights may be variously disposed in the light source arrays, thereby realizing beam patterns having various colors.

FIGS. 23A to 23C are sectional views showing luminous fluxes of light sources included in light source arrays. FIGS. 23A to 23C are sectional views taken along line I-I of FIG. 1A.

As shown in FIGS. 1A and 23A to 23C, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

The light sources included in the light source arrays may be disposed at a first area, which is a middle area, of the second substrate 200, at second areas, which are edge areas, of the second substrate 200, and at third areas between the middle area and the edge areas of the second substrate 200.

For example, as shown in FIG. 23A, luminous flux of a light source 330-1 of the second light source array 330 located at the first area of the second substrate 200 may be greatest, and luminous flux of a light source 330-2 located at each second area of the second substrate 200 may be least.

Also, luminous flux of a light source 330-3 located at each third area of the second substrate 200 may be less than that of the light source 330-1 located at the first area of the second substrate 200 and greater than that of the light source 330-2 located at each second area of the second substrate 200.

On the other hand, as shown in FIG. 23B, luminous flux of the light source 330-1 of the second light source array 330 located at the first area of the second substrate 200 may be least, and luminous flux of the light source 330-2 located at each second area of the second substrate 200 may be greatest.

Also, luminous flux of the light source 330-3 located at each third area of the second substrate 200 may be greater than that of the light source 330-1 located at the first area of the second substrate 200 and less than that of the light source 330-2 located at each second area of the second substrate 200.

Alternatively, as shown in FIG. 23C, luminous flux of the light source 330-3 of the second light source array 330 located at each third area of the second substrate 200 may be greater than that of the light source 330-2 located at each second area of the second substrate 200.

Also, luminous flux of the light source 330-3 located at each third area of the second substrate 200 may be greater than that of the light source 330-1 located at the first area of the second substrate 200.

According to circumstances, luminous flux of the light source 330-1 located at the first area of the second substrate 200 may be equal to that of the light source 330-2 located at each second area of the second substrate 200.

As described above, luminous flux of the light source 300 located at the middle area of each light source array may be equal to that of the light sources 300 located at the edge areas of the light source array. According to circumstances, luminous flux of the light source 300 located at the middle area of each light source array may be different from that of the light sources 300 located at the edge areas of the light source array.

For example, luminous flux of the light source 300 located at the middle area of each light source array may be greater than that of the light sources 300 located at the edge areas of the light source array.

In this case, a beam pattern emitted to the outside may have higher brightness at the middle area thereof.

In this embodiment, therefore, light sources having different luminous fluxes may be variously disposed in the light source arrays, thereby realizing various beam patterns.

FIGS. 24A and 24B are sectional views showing distances between light sources included in light source arrays. FIGS. 24A and 24B are sectional views taken along line I-I of FIG. 1A.

As shown in FIGS. 1A, 24A and 24B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

Also, the light sources 300 included in each light source array may be disposed so that the light sources 300 are spaced apart from each other by the same distance. According to circumstances, the light sources 300 included in each light source array may be disposed so that the light sources 300 are spaced apart from each other by different distances.

For example, the distance between the light sources 300 included in each light source array may be gradually increased from the middle area to the edge areas of each light source array.

In this case, a beam pattern emitted to the outside may have higher brightness at the middle area thereof.

For example, as shown in FIG. 24A, a distance d51 between a light source 330-1 of the second light source array 330 located at a middle area of the second substrate 200 and a neighboring light source 330-3 may be less than a distance d52 between a light source 330-2 located at each edge area of the second substrate 200 and a neighboring light source 330-3.

On the other hand, as shown in FIG. 24B, the distance d51 between the light source 330-1 of the second light source array 330 located at the middle area of the second substrate 200 and the neighboring light source 330-3 may be greater than the distance d52 between the light source 330-2 located at each edge area of the second substrate 200 and the neighboring light source 330-3.

In this embodiment, light source arrays having different distances between light sources may be variously disposed as described above, thereby realizing various beam patterns.

FIGS. 25A and 25B are sectional views showing the arrangement of light sources included in light source arrays according to a first embodiment. FIGS. 25A and 25B are sectional views taken along line I-I of FIG. 1A.

As shown in FIGS. 1A, 25A and 25B, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

The light sources 300 included in each light source array may be disposed on the same plane. According to circumstances, at least one of the light sources 300 included in each light source array may be disposed on a plane different from that on which the other light sources 300 are disposed.

The light sources 300 included in the light source arrays may be disposed at a first area 260, which is a middle area, of the second substrate 200, and at second areas 250, which are edge areas, of the second substrate 200.

For example, as shown in FIG. 25A, light sources 330-1 and 330-3 of the second light source array 330 located at the first area 260 of the second substrate 200 may be disposed lower than light sources 330-2 located at the second areas 250 of the second substrate 200.

That is, the second areas 250 of the second substrate 200 may protrude from the first area 260 of the second substrate 200 by a predetermined height.

On the other hand, as shown in FIG. 25B, the light sources 330-1 and 330-3 of the second light source array 330 located at the first area 260 of the second substrate 200 may be disposed higher than the light sources 330-2 located at the second areas 250 of the second substrate 200.

That is, the first area 260 of the second substrate 200 may protrude from the second areas 250 of the second substrate 200 by a predetermined height.

The light sources included in the light source arrays may be disposed on different planes as described above, thereby realizing various beam patterns.

FIGS. 26A to 26C are sectional views showing the arrangement of light sources included in light source arrays according to a second embodiment. FIGS. 26A to 26C are sectional views taken along line I-I of FIG. 1A.

As shown in FIGS. 1A and 26A to 26C, a lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

The light sources 300 included in each light source array may be disposed on the same plane. According to circumstances, at least one of the light sources 300 included in each light source array may be disposed on a plane different from that on which the other light sources 300 are disposed.

The light sources 300 included in the light source arrays may be disposed at a first area 260, which is a middle area, of the second substrate 200, at second areas 250, which are edge areas, of the second substrate 200, and at third areas 270 between the middle area and the edge areas of the second substrate 200.

Each of the third areas 270 of the second substrate 200 may be at a predetermined angle to a corresponding one of the second areas 250 of the second substrate 200.

That is, the angle between each of the third areas 270 of the second substrate 200 may be at a predetermined angle to a corresponding one of the second areas 250 of the second substrate 200 may be an obtuse angle.

For example, as shown in FIG. 26A, a light source 330-1 of the second light source array 330 located at the first area 260 of the second substrate 200 may be disposed higher than light sources 330-2 located at the second areas 250 of the second substrate 200 and light sources 330-3 located at the third areas 270 of the second substrate 200.

Also, the light sources 330-2 located at the second areas 250 of the second substrate 200 may be disposed lower than the light sources 330-3 located at the third areas 270 of the second substrate 200.

The light sources 300 included in each light source array may have the same light emission direction. According to circumstances, at least one of the light sources 300 included in each light source array may have a light emission direction different from that of the other light sources 300.

For example, as shown in FIG. 26B, the light emission direction of the light source 330-1 of the second light source array 330 located at the first area 260 of the second substrate 200 may be equal to that of the light sources 330-2 located at the second areas 250 of the second substrate 200 but may be different from that of the light sources 330-3 located at the third areas 270 of the second substrate 200.

Also, light sources 300 included in each light source array may have the same luminous flux. According to circumstances, at least one of the light sources 300 included in each light source array may have luminous flux different from that of the other light sources 300.

For example, as shown in FIG. 26C, luminous flux of the light source 330-1 of the second light source array 330 located at the first area 260 of the second substrate 200 may be equal to that of the light sources 330-2 located at the second areas 250 of the second substrate 200 but less than that of the light sources 330-3 located at the third areas 270 of the second substrate 200.

The light sources included in the light source arrays may be disposed on different planes as described above, thereby realizing various beam patterns.

FIGS. 27A to 27E are sectional views showing the structure of a substrate of a lamp according to an embodiment.

As shown in FIGS. 27A to 27E, the lamp may include a first substrate 100, a second substrate 200, and a plurality of light sources 300.

The second substrate 200 may be disposed on the first substrate 100. The light sources 300 may be disposed on the second substrate 200.

As shown in FIG. 27A, the area of the second substrate 200 may be less than that of the first substrate 100.

The first substrate 100 may be a metal substrate having a first heat conductivity. The second substrate 200 may be an insulative substrate having a second heat conductivity.

The first heat conductivity of the first substrate 100 may be greater than the second heat conductivity of the second substrate 200.

Consequently, heat generated from the light sources 300 disposed on the second substrate 200 may be rapidly discharged to the outside.

For example, the first substrate 100 may be a heat dissipation plate, exhibiting high heat conductivity, made of copper (Cu), aluminum (Al), silver (Ag), gold (Au), or an alloy thereof.

The second substrate 200 may be made of a nitride, such as AlN, exhibiting high heat conductivity.

On the other hand, as shown in FIG. 27B, the area of the second substrate 200 may be equal to that of the first substrate 100.

That is, the first substrate 100 and the second substrate 200 may be sequentially stacked to form a laminated structure.

In this case, the first substrate 100 may include at least one selected from among Al, Cu, and Au, and the second substrate 200 may include an anodized layer.

Also, as shown in FIG. 27C, the first substrate 100 may include a cavity 102 formed at a predetermined area thereof, and the second substrate 200 may be disposed in the cavity 102 of the first substrate 100.

In this case, the first substrate 100 may include at least one selected from among Al, Cu, and Au, and the second substrate 200 may include AlN.

Also, as shown in FIG. 27D, the second substrate 200 may include a cavity 202 formed at a predetermined area thereof and may be disposed on the first substrate 100.

The light sources 300 may be disposed in the cavity 202 of the second substrate 200.

In this case, the first substrate 100 may include at least one selected from among Al, Cu, and Au, and the second substrate 200 may include AlN.

Also, as shown in FIG. 27E, the first substrate 100 and the second substrate 200 may be formed of the same material. In this case, the first substrate 100 and the second substrate 200 may include at least one selected from among AlN, Al, Cu, and Au.

In this embodiment, the first substrate 100 and the second substrate 200 may be formed in various shapes as described above.

FIGS. 28A to 28C are sectional views showing the upper surface of a second substrate.

As shown in FIGS. 28A to 28C, a lamp may include a first substrate 100, a second substrate 200, and a plurality of light sources 300.

The second substrate 200 may be disposed on the first substrate 100. The light sources 300 may be disposed on the second substrate 200.

The area of the second substrate 200 may be less than that of the first substrate 100.

The first substrate 100 may be a metal substrate having a first heat conductivity. The second substrate 200 may be an insulative substrate having a second heat conductivity.

The first heat conductivity of the first substrate 100 may be greater than the second heat conductivity of the second substrate 200.

Consequently, heat generated from the light sources 300 disposed on the second substrate 200 may be rapidly discharged to the outside.

For example, the first substrate 100 may be a heat dissipation plate, exhibiting high heat conductivity, made of copper (Cu), aluminum (Al), silver (Ag), gold (Au), or an alloy thereof.

The second substrate 200 may be made of a nitride, such as AlN, exhibiting high heat conductivity.

As shown in FIG. 28A, the second substrate 200 may have a concave upper surface 206, on which the light sources 300 are disposed.

According to circumstances, as shown in FIG. 28B, the upper surface 206 of the second substrate 200 may be convex. In another case, as shown in FIG. 28C, the upper surface 206 of the second substrate 200 may be flat.

The light sources 300 may be disposed on the second substrate 200 having various surface shapes as described above, thereby realizing various beam patterns.

FIGS. 29A to 29C are sectional views showing the side surface of a second substrate.

As shown in FIGS. 29A to 29C, a lamp may include a first substrate 100, a second substrate 200, and a plurality of light sources 300.

The second substrate 200 may be disposed on the first substrate 100. The light sources 300 may be disposed on the second substrate 200.

As shown in FIG. 29A, the angle between a side surface 205 of the second substrate 200 and an upper surface 102 of the first substrate 100 may be a right angle.

According to circumstances, as shown in FIG. 29B, the angle between the side surface 205 of the second substrate 200 and the upper surface 102 of the first substrate 100 may be an obtuse angle. Alternatively, as shown in FIG. 29B, the angle between the side surface 205 of the second substrate 200 and the upper surface 102 of the first substrate 100 may be an acute angle.

In this embodiment, the first substrate 100 and the second substrate 200 may be formed in various shapes as described above.

FIGS. 30A to 30C are sectional views showing projections of a second substrate according to a first embodiment.

As shown in FIGS. 30A to 30C, a lamp may include a first substrate 100, a second substrate 200, and a plurality of light sources 300.

The second substrate 200 may be disposed on the first substrate 100. The light sources 300 may be disposed on the second substrate 200.

The area of the second substrate 200 may be less than that of the first substrate 100.

The first substrate 100 may be a metal substrate having a first heat conductivity. The second substrate 200 may be an insulative substrate having a second heat conductivity.

The first heat conductivity of the first substrate 100 may be greater than the second heat conductivity of the second substrate 200.

Consequently, heat generated from the light sources 300 disposed on the second substrate 200 may be rapidly discharged to the outside.

For example, the first substrate 100 may be a heat dissipation plate, exhibiting high heat conductivity, made of copper (Cu), aluminum (Al), silver (Ag), gold (Au), or an alloy thereof.

The second substrate 200 may be made of a nitride, such as AlN, exhibiting high heat conductivity.

The second substrate 200 may include at least one projection protruding from the surface thereof by a predetermined height.

The angle between the surface of the second substrate 200 and a side surface of the projection may be a right angle.

For example, as shown in FIG. 30A, the second substrate 200 may include a first projection 255 and a second projection 257 protruding from a middle area thereof by a predetermined height.

The second projection 257 may protrude from a middle area of the first projection 255 by a predetermined height.

The light sources 300 may be disposed on at least one selected from among the second substrate 200, the first projection 255, and the second projection 257.

Also, as shown in FIG. 30B, the second substrate 200 may include first projections 255 protruding from edge areas thereof by a predetermined height.

The light sources 300 may be disposed on the second substrate 200 and/or the first projections 255.

Also, as shown in FIG. 30C, the second substrate 200 may include a first projection 255 protruding from a middle area thereof by a predetermined height.

The light sources 300 may be disposed on the second substrate 200 and/or the first projection 255.

The light sources may be disposed on the second substrate 200 having the projection(s) as described above, thereby realizing various beam patterns.

FIGS. 31A and 31B are sectional views showing a projection of a second substrate according to a second embodiment.

As shown in FIGS. 31A and 31B, a lamp may include a first substrate 100, a second substrate 200, and a plurality of light sources 300.

The second substrate 200 may be disposed on the first substrate 100. The light sources 300 may be disposed on the second substrate 200.

The second substrate 200 may include at least one first projection 255 protruding from an upper surface 206 thereof by a predetermined height.

The angle between the upper surface 206 of the second substrate 200 and a side surface 205-1 of the first projection 255 may be a right angle or an obtuse angle.

For example, as shown in FIG. 31A, the second substrate 200 may include a first projection 255 protruding from a middle area thereof by a predetermined height.

In this case, the angle between the upper surface 206 of the second substrate 200 and the side surface 205-1 of the first projection 255 may be a right angle.

The light sources 300 may be disposed on the second substrate 200 and/or the first projection 255.

On the other hand, as shown in FIG. 31B, the second substrate 200 may include a first projection 255 protruding from a middle area thereof by a predetermined height.

In this case, the angle between the upper surface 206 of the second substrate 200 and the side surface 205-1 of the first projection 255 may be an obtuse angle.

The light sources 300 may be disposed on the second substrate 200 and/or the first projection 255.

FIG. 32 is a sectional view showing a projection of a second substrate according to a third embodiment.

As shown in FIG. 32, a lamp may include a first substrate 100, a second substrate 200, and a plurality of light sources 300.

The second substrate 200 may be disposed on the first substrate 100. The light sources 300 may be disposed on the second substrate 200.

The second substrate 200 may include at least one first projection 255 protruding from an upper surface 206 thereof by a predetermined height.

The angle between the upper surface 206 of the second substrate 200 and a side surface 205-1 of the first projection 255 may be an obtuse angle.

The light sources 300 may be disposed on at least one selected from among the second substrate 200, the upper surface 206 of the first projection 255, and the side surface 205-1 of the first projection 255.

The light sources may be disposed on the second substrate 200 having the projection as described above, thereby realizing various beam patterns.

FIGS. 33A and 33B are sectional views showing a barrier of a lamp according to an embodiment. FIG. 33A is a plan view of the lamp, and FIG. 33B is a sectional view taken along line 33A VII-VII of FIG. 33A.

As shown in FIGS. 33A and 33B, the lamp may include a first substrate 100, a second substrate 200, and a plurality of light sources 300.

The second substrate 200 may be disposed on the first substrate 100. The light sources 300 may be disposed on the second substrate 200.

The light sources 300 may be grouped into a plurality of light source arrays, in each of which the light sources 300 are disposed in a line.

The light source arrays may include neighboring first and second light source arrays 310 and 330.

A barrier 500 may be disposed around the light sources 300.

The barrier 500 may be provided to protect the light sources 300 and wires for electrical connection of the light sources 300. The barrier 500 may be formed in various shapes based on the shape of the second substrate 200.

For example, the barrier 500 may be formed in a polygonal or ring shape,

The barrier 500 may include a metal reflective material. The barrier 500 may reflect light generated from the light sources 300 to improve light extraction efficiency of the light sources 300.

The barrier 500 may include at least one selected from among aluminum (Al), silver (Ag), platinum (Pt), rhodium (Rh), radium (Rd), palladium (Pd), and chrome (Cr).

The distance between the barrier 500 and the light sources 300 and the height of the barrier 500 may be adjusted to control an orientation angle of light emitted from the light sources 300.

FIGS. 34A to 34D are sectional views showing the arrangement of a barrier of a lamp according to an embodiment.

As shown in FIGS. 34A to 34D, the lamp may include a first substrate 100, a second substrate 200, a plurality of light sources 300, and a barrier 500.

The second substrate 200 may be disposed on the first substrate 100. The light sources 300 may be disposed on the second substrate 200.

As shown in FIG. 34A, the area of the second substrate 200 may be less than that of the first substrate 100.

In this case, the barrier 500 may be disposed on the first substrate 100.

The first substrate 100 may be a metal substrate having a first heat conductivity. The second substrate 200 may be an insulative substrate having a second heat conductivity.

The first heat conductivity of the first substrate 100 may be greater than the second heat conductivity of the second substrate 200.

Consequently, heat generated from the light sources 300 disposed on the second substrate 200 may be rapidly discharged to the outside.

For example, the first substrate 100 may be a heat dissipation plate, exhibiting high heat conductivity, made of copper (Cu), aluminum (Al), silver (Ag), gold (Au), or an alloy thereof.

The second substrate 200 may be made of a nitride, such as AlN, exhibiting high heat conductivity.

Also, as shown in FIG. 34B, the area of the second substrate 200 may be equal to that of the first substrate 100.

That is, the first substrate 100 and the second substrate 200 may be sequentially stacked to form a laminated structure.

In this case, the barrier 500 may be disposed on the second substrate 200.

The first substrate 100 may include at least one selected from among Al, Cu, and Au, and the second substrate 200 may include an anodized layer.

Also, as shown in FIG. 34C, the first substrate 100 may include a cavity 102 formed at a predetermined area thereof, and the second substrate 200 may be disposed in the cavity 102 of the first substrate 100.

In this case, the barrier 500 may be disposed on the first substrate 100.

The first substrate 100 may include at least one selected from among Al, Cu, and Au, and the second substrate 200 may include AlN.

Also, as shown in FIG. 34D, the second substrate 200 may include a cavity 202 formed at a predetermined area thereof and may be disposed on the first substrate 100.

The light sources 300 may be disposed in the cavity 202 of the second substrate 200.

In this case, the second substrate 200 may include a barrier area.

The first substrate 100 may include at least one selected from among Al, Cu, and Au, and the second substrate 200 may include AlN.

In this embodiment, the barrier may be disposed at different positions based on various shapes of the first substrate 100 and the second substrate 200 as described above.

FIGS. 35A and 35B are sectional views showing a cover glass of a lamp according to an embodiment.

As shown in FIGS. 35A and 35B, the lamp may include a first substrate 100, a second substrate 200, a plurality of light sources 300, a barrier 500, and a cover glass 550.

The second substrate 200 may be disposed on the first substrate 100. The light sources 300 may be disposed on the second substrate 200.

The cover glass 550 may be spaced apart from the light sources 300 by a predetermined distance.

A distance d60 between the light sources 300 and a lower surface 550-1 of the cover glass 550 may be about 0.1 mm to 50 mm.

The cover glass 550 may protect the light sources 300 and transmit light generated from the light sources 300.

The cover glass 550 may be anti-reflectively coated to improve transmittance of light generated from the light sources 300.

An anti-reflective coating film may be attached to a glass-based material, or an anti-reflective coating liquid may be applied to a glass-based material by spin coating or spray coating to form an anti-reflective coating layer.

For example, the anti-reflective coating layer may include at least one selected from among $TiO_2$, $SiO_2$, $Al_2O_3$, $Ta_2O_3$, $ZrO_2$, and $MgF_2$.

The cover glass 550 may include a hole (not shown) or an opening (not shown). Heat generated from the light sources 300 may be discharged through the hole or the opening.

The cover glass 550 may be formed in the shape of a dome having a hole or an opening. According to circumstances, the cover glass 550 may include a color filter to transmit only a light component having a specific wavelength of light generated from the light sources 300.

In another case, the cover glass 550 may include a specific pattern (not shown) to adjust an orientation angle of light generated from the light sources 300.

Kinds and shapes of the pattern are not limited.

As shown in FIG. 35A, the area of the second substrate 200 may be less than that of the first substrate 100.

In this case, the barrier 500 may be disposed on the first substrate 100, and the cover glass 550 may be supported by a portion of an upper surface 500-1 of the barrier 500.

The first substrate 100 may be a metal substrate having a first heat conductivity. The second substrate 200 may be an insulative substrate having a second heat conductivity.

The first heat conductivity of the first substrate 100 may be greater than the second heat conductivity of the second substrate 200.

Consequently, heat generated from the light sources 300 disposed on the second substrate 200 may be rapidly discharged to the outside.

For example, the first substrate 100 may be a heat dissipation plate, exhibiting high heat conductivity, made of copper (Cu), aluminum (Al), silver (Ag), gold (Au), or an alloy thereof.

The second substrate 200 may be made of a nitride, such as AlN, exhibiting high heat conductivity.

On the other hand, as shown in FIG. 35B, the second substrate 200 may include a cavity 202 formed at a predetermined area thereof and may be disposed on the first substrate 100.

The light sources 300 may be disposed in the cavity 202 of the second substrate 200.

In this case, the second substrate 200 may include a barrier area, and the cover glass 550 may be supported by a portion of an upper edge 204 of the second substrate 200.

The width of the barrier area of the second substrate 200 may be greater than that of the support area of the second substrate 200 to support the cover glass 550

The first substrate 100 may include at least one selected from among Al, Cu, and Au, and the second substrate 200 may include AlN.

In this embodiment, the structure of the barrier supporting the cover glass may be changed based on various shapes of the first substrate 100 and the second substrate 200 as described above.

FIGS. 36A to 36D are sectional views showing fluorescent layers of a lamp according to an embodiment.

As shown in 36A to 36D, the lamp may include a first substrate 100, a second substrate 200, a plurality of light sources 300, and fluorescent layers 590.

The second substrate 200 may be disposed on the first substrate 100. The light sources 300 may be disposed on the second substrate 200.

The fluorescent layers 590 may be disposed on the light sources 300.

The fluorescent layers 590 may be disposed so as to correspond to the respective the light sources 300.

Each of the fluorescent layers 590 may include at least one selected from among a red fluorescent substance, yellow fluorescent substance, and green fluorescent substance.

As shown in FIG. 36A, each of the fluorescent layers 590 may be formed in a trapezoidal shape. On the other hand, as shown in FIG. 36B, each of the fluorescent layers 590 may be formed in a reversed trapezoidal shape.

According to circumstances, as shown in FIGS. 36C and 36D, each of the fluorescent layers 590 may be formed in a cap shape.

As shown in FIG. 36C, each fluorescent layer 590 may include a fluorescent layer part 590 formed on the second substrate 200 and a fluorescent layer part 590 formed on each light source 300. A thickness t81 of the fluorescent layer part 590 formed on the second substrate 200 may be equal to a thickness t82 of the fluorescent layer part 590 formed on each light source 300.

On the other hand, as shown in FIG. 36D, the thickness t81 of the fluorescent layer part 590 formed on the second substrate 200 may be different from the thickness t82 of the fluorescent layer part 590 formed on each light source 300.

For example, the thickness t81 of the fluorescent layer part 590 formed on the second substrate 200 may be less than the thickness t82 of the fluorescent layer part 590 formed on each light source 300.

FIG. 37 is a sectional view showing a head lamp 800 of a vehicle including a lamp according to a first embodiment.

As shown in FIG. 37, the head lamp 800 may include a lamp 801, a reflector 802, a shade 803, and a lens 804.

The reflector 802 may reflect light emitted from the lamp 801 in a predetermined direction.

The shade 803 may be disposed between the reflector 802 and the lens 804 to block or reflect a portion of light reflected toward the lens 804 by the reflector 802, thereby providing a light distribution pattern desired by a designer.

The height of one side 803-1 of the shade 803 may be different from that of the other side 803-2 of the shade 803.

Light, transmitted through a glass cover of the lamp 801, may be reflected by the reflector 802 and the shade 803 and directed to the front of the vehicle through the lens 804.

The lens 804 may refract light reflected by the reflector 802 to the front.

FIG. 38 is a sectional view showing a head lamp 900-1 of a vehicle including a lamp according to a second embodiment.

As shown in FIG. 38, the head lamp 900-1 may include a lamp 910 and a light housing 920.

The lamp 910 may be a lamp according to any one of the previous embodiments. The lamp 910 may be mounted in the light housing 920. The light housing 920 may be formed of a light transmissive material.

The light housing 920 may be curved based on an installation position of a vehicle in which the light housing 920 is mounted and design of the vehicle.

In the head lamp having the lamp according to this embodiment, a plurality light source arrays which can be individually driven is disposed, thereby providing various light colors and luminous fluxes depending upon an external environment.

In the head lamp having the lamp according to this embodiment, a plurality of light source arrays may be efficiently disposed, thereby providing optimum luminous flux using a small number of light sources and reducing the size of the lamp.

Also, in the head lamp having the lamp according to this embodiment, light source arrays having various light emission directions may be disposed, thereby providing various beam patterns depending upon an external environment.

FIGS. 39A to 39E are sectional views showing a beam pattern of a vehicle including a lamp according to an embodiment.

FIG. 39A is a view showing that a beam pattern of the vehicle formed by the lamp according to the embodiment is realized as a low beam, FIG. 39B is a view showing that a beam pattern of the vehicle formed by the lamp according to the embodiment is realized as a high beam, FIG. 39C is a view showing that a beam pattern of the vehicle formed by the lamp according to the embodiment is realized as a downtown beam, FIG. 39D is a view showing that a beam pattern of the vehicle formed by the lamp according to the embodiment is realized as a highway beam, and FIG. 39E is a view showing that a beam pattern of the vehicle formed by the lamp according to the embodiment is realized as a wet road beam.

In a case in which the vehicle travels on a road in a general environment, as shown in FIG. 39A, a low beam widely emitted to a short distance front and to a portion of a long distance front may be realized through individual driving of light sources included in the lamp as the beam pattern.

In a case in which the vehicle travels on a road in an environment in which it is necessary to secure a long distance field of vision, as shown in FIG. 39B, a high beam emitted to short, middle, and long distance fronts may be realized through individual driving of the light sources included in the lamp as the beam pattern.

In a case in which the vehicle travels on a road in a downtown environment in which external lights, such as streetlights and signboards, are present, as shown in FIG. 39C, a downtown beam very widely emitted to a short distance front may be realized through individual driving of the light sources included in the lamp as the beam pattern. In this case, a field of vision of other drivers is secured, thereby contributing to safe driving.

In a case in which the vehicle travels on a road in a highway environment in which it is necessary to drive the vehicle at high speed, as shown in FIG. 39D, a highway beam emitted to short and long distance fronts and more widely emitted to a middle distance front may be realized through individual driving of the light sources included in the lamp as the beam pattern. In this case, a field of vision of other drivers who drive vehicles in the opposite direction is not disturbed, thereby contributing to safe driving.

In a case in which the vehicle travels on a road in an environment in which the road is wet, as shown in FIG. 39E, a wet road beam not emitted to a portion of a short distance front but emitted to a middle distance front and a portion of a long distance front may be realized through individual driving of the light sources included in the lamp as the beam pattern. In this case, a field of vision of a driver is prevented from being disturbed by light reflected by a wet load at the short distance front, thereby contributing to safe driving.

In the head lamp having the lamp according to this embodiment, a plurality light source arrays which can be individually driven is disposed, thereby providing various light colors and luminous fluxes depending upon an external environment.

In the head lamp having the lamp according to this embodiment, a plurality of light source arrays may be efficiently disposed, thereby providing optimum luminous flux using a small number of light sources and reducing the total size of the lamp.

Also, in the head lamp having the lamp according to this embodiment, light source arrays having various light emission directions may be disposed, thereby providing various beam patterns depending upon an external environment.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lamp comprising:
a first substrate, which is a printed circuit board;
a second substrate disposed on the first substrate;
at least one first electrode pattern directly disposed on the second substrate;
at least one second electrode pattern disposed on the first substrate;
at least one third electrode pattern directly disposed on the second substrate;
at least one fourth electrode pattern disposed on the first substrate;
a plurality of first light sources disposed on the first electrode pattern;
a plurality of second light sources disposed on the third electrode pattern,
a plurality of first wires electrically connecting each of the first light sources with the second electrode pattern;
a plurality of second wires electrically connecting each of the third light sources with the fourth electrode pattern,
wherein each of the first light sources are disposed in a first line,
wherein each of the second light sources are disposed in a second line,
wherein the first light sources and the second light sources are electrically isolated and individually driven,
wherein a distance between two adjacent ones of the light sources of the first light sources is less than a distance between two adjacent ones of the light sources of the second light sources, and
wherein the first substrate comprises a cavity formed at a predetermined area thereof, and the second substrate is disposed in the cavity of the first substrate.

2. The lamp according to claim 1, wherein the at least one first electrode pattern includes a plurality of first electrode patterns, and wherein the plurality of first electrode patterns corresponds to the plurality of first light sources in a one to one manner.

3. The lamp according to claim 1, wherein the first substrate is a metal substrate having a first heat conductivity, and the second substrate is an insulative substrate having a second heat conductivity.

4. The lamp according to claim 1, wherein the at least one third electrode pattern includes a plurality of third electrode patterns, and wherein the plurality of third electrode patterns correspond to the plurality of first wires in a one to one manner.

5. The lamp according to claim 1, wherein the second substrate has at least one selected from among a concave surface, a convex surface, and a flat surface.

6. The lamp according to claim 1, further comprising a barrier disposed around the light sources, wherein the barrier comprises a metal reflective material.

7. A lamp comprising:
   a first substrate, which is a printed circuit board, the first substrate including a top surface;
   a second substrate disposed on the top surface of the first substrate, and the second substrate including an upper surface having a first surface, a second surface and a middle surface disposed between the first surface and the second surface;
   a plurality of first light sources disposed on at least one of the first surface and the middle surface; and
   a plurality of second light sources disposed on the second surface,
   wherein each of the first light sources are disposed in a first line,
   wherein the first light sources and the second light sources are electrically isolated and individually driven,
   wherein the first surface of the second substrate is higher than the second surface of the second substrate based on the top surface of the first substrate, wherein an angle between the middle surface of the second substrate and the second surface of the second substrate is an obtuse angle,
   wherein the first surface and the second surface of the second substrate are flat, and
   wherein the first substrate includes a cavity formed at a predetermined area thereof, and the second substrate is disposed in the cavity of the first substrate.

8. The lamp according to claim 7, wherein a distance between a first parallel line extending from an upper surface of the first light source and a second parallel line extending from an upper surface of the second light source is the same as or differs from a distance between the upper surface of the first light source and a lower surface of the first light source.

9. The lamp according to claim 7, wherein the first substrate is a metal substrate having a first heat conductivity, and the second substrate is an insulative substrate having a second heat conductivity.

10. The lamp according to claim 7, wherein the second substrate have at least one selected from among a concave surface, a convex surface, and a flat surface.

11. The lamp according to claim 7, wherein the middle surface of the second substrate slopes toward the second surface of the second substrate.

12. A lamp comprising:
   a first substrate, which is a printed circuit board;
   a second substrate disposed on the first substrate;
   a plurality of light sources disposed on the second substrate in a line; and
   a first projection disposed between the second substrate and at least one light source of the plurality of light sources,
   wherein a height of the first projection is greater than a height of the light source,
   wherein an angle between an upper surface of the second substrate and a side surface of the first projection is an obtuse angle,
   wherein a top surface of the first projection and the upper surface of the second substrate are parallel,
   wherein a light source with different height has a different light emission direction, and
   wherein the first substrate comprises a cavity formed at a predetermined area thereof, and the second substrate is disposed in the cavity of the first substrate.

13. A lamp comprising:
   a first substrate, which is a printed circuit board;
   a second substrate disposed on the first substrate;
   a plurality of light sources disposed on the second substrate in a line;
   a first projection disposed between the second substrate and at least one light source of the plurality of light sources, and
   a second projection disposed on the first projection,
   wherein a height of the first projection is greater than a height of the light source,
   wherein an angle between an upper surface of the second substrate and a side surface of the first projection is an obtuse angle,
   wherein a top surface of the first projection and the upper surface of the second substrate are parallel,
   wherein a light source with different height has a different light emission direction, and
   wherein at least one light source of the plurality of light sources is disposed on the second projection.

14. The lamp according to claim 12, wherein the first substrate is a metal substrate having a first heat conductivity, and the second substrate is an insulative substrate having a second heat conductivity.

15. The lamp according to claim 12, wherein the second substrate have at least one selected from among a concave surface, a convex surface, and a flat surface.

16. The lamp according to claim 12, wherein at least one light source of the plurality of the light sources is disposed on at least one of both side surfaces of the first projection.

* * * * *